(12) United States Patent
Ware et al.

(10) Patent No.: US 9,304,579 B2
(45) Date of Patent: Apr. 5, 2016

(54) FAST-WAKE MEMORY CONTROL

(71) Applicant: Rambus Inc., Sunnyvale, CA (US)

(72) Inventors: Frederick A. Ware, Los Altos Hills, CA (US); Jared L. Zerbe, Woodside, CA (US); Brian S. Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/798,050

(22) Filed: Jul. 13, 2015

(65) Prior Publication Data

US 2015/0316975 A1    Nov. 5, 2015

Related U.S. Application Data

(63) Continuation of application No. 14/445,516, filed on Jul. 29, 2014, now Pat. No. 9,110,596, which is a continuation of application No. 13/702,112, filed as application No. PCT/US2011/046669 on Aug. 4, 2011, now Pat. No. 8,824,222.

(60) Provisional application No. 61/373,684, filed on Aug. 13, 2010.

(51) Int. Cl.
| | |
|---|---|
| *G11C 5/14* | (2006.01) |
| *G06F 1/32* | (2006.01) |
| *G11C 11/4072* | (2006.01) |
| *G11C 11/4076* | (2006.01) |
| *G11C 7/22* | (2006.01) |

(Continued)

(52) U.S. Cl.
CPC .............. *G06F 1/3275* (2013.01); *G06F 1/324* (2013.01); *G06F 3/0625* (2013.01); *G06F 3/0659* (2013.01); *G06F 3/0673* (2013.01); *G11C 7/22* (2013.01); *G11C 7/222* (2013.01); *G11C 11/4072* (2013.01); *G11C 11/4076* (2013.01); *G06F 2213/0038* (2013.01); *G11C 5/14* (2013.01); *G11C 5/148* (2013.01); *G11C 7/04* (2013.01); *G11C 2207/2227* (2013.01); *G11C 2207/2254* (2013.01)

(58) Field of Classification Search
CPC ........... G11C 5/14; G11C 5/144; G11C 5/148
USPC ..................... 365/191, 226, 227, 229, 233.15
See application file for complete search history.

(56) References Cited

U.S. PATENT DOCUMENTS

| | | |
|---|---|---|
| 4,130,899 A | 12/1978 | Bowman et al. |
| 6,650,594 B1 | 11/2003 | Lee et al. |
| 6,819,150 B1 | 11/2004 | Santosa et al. |

(Continued)

OTHER PUBLICATIONS

PCT International Preliminary Report on Patentability dated Feb. 19, 2013 re International Application No. PCT/US2011/046669. 9 pages.

(Continued)

*Primary Examiner* — Tan T. Nguyen
(74) *Attorney, Agent, or Firm* — Charles Shemwell

(57) ABSTRACT

A memory controller is transitioned to a low-power mode in which an active-mode resource required to transmit memory access commands to a memory device at a first command-signaling frequency is disabled. The memory controller transmits a first memory access command to the memory device using an alternative signaling resource during a transitional interval in which the active-mode resource is re-enabled.

20 Claims, 18 Drawing Sheets

(51) Int. Cl.
*G06F 3/06* (2006.01)
*G11C 7/04* (2006.01)

(56) References Cited

U.S. PATENT DOCUMENTS

| | | | |
|---|---|---|---|
| 7,863,971 | B1 | 1/2011 | Nayak et al. |
| 7,886,261 | B1 * | 2/2011 | Irving .............. H03K 19/17784 326/37 |
| 8,432,768 | B2 * | 4/2013 | Ware ........................ G11C 7/04 365/189.011 |
| 8,824,222 | B2 * | 9/2014 | Ware .................. G11C 11/4072 365/191 |
| 9,110,596 | B2 * | 8/2015 | Ware ..................... G06F 3/0625 |
| 2003/0189868 | A1 | 10/2003 | Riesenman et al. |
| 2005/0117432 | A1 * | 6/2005 | Graaff ...................... G11C 5/14 365/226 |
| 2006/0187226 | A1 | 8/2006 | Bruno et al. |
| 2008/0005455 | A1 | 1/2008 | Marcri et al. |
| 2011/0235459 | A1 | 9/2011 | Ware et al. |
| 2012/0327734 | A1 | 12/2012 | Sato |
| 2013/0191665 | A1 | 7/2013 | Mehta et al. |

OTHER PUBLICATIONS

PCT International Search Report and Written Opinion dated Feb. 27, 2012 re International Application No. PCT/US2011/046669. 14 pages.

* cited by examiner

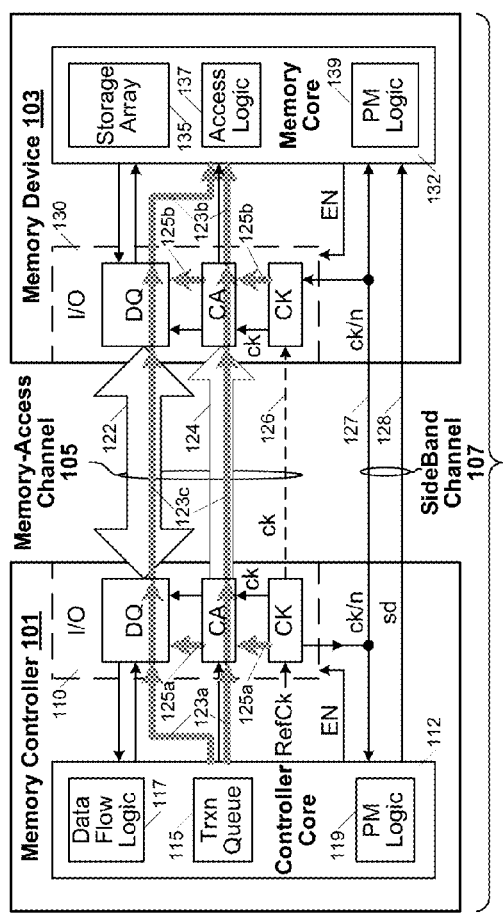
FIG. 1
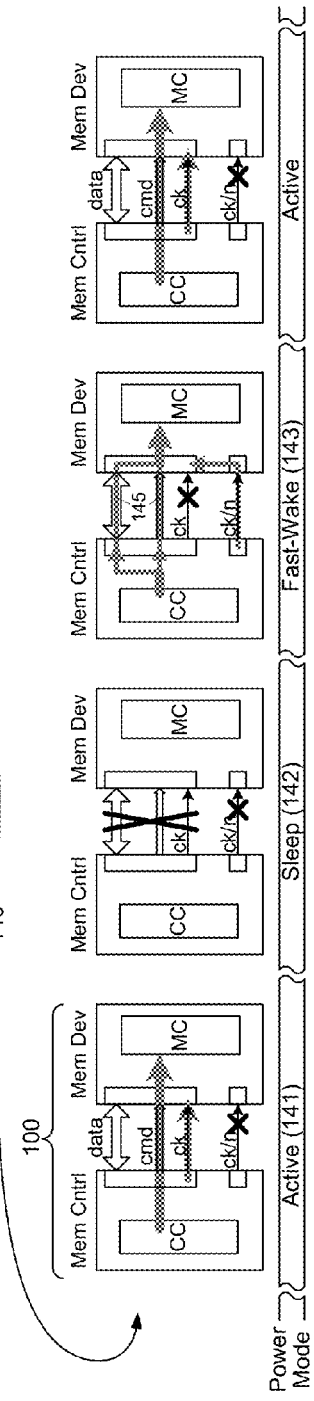
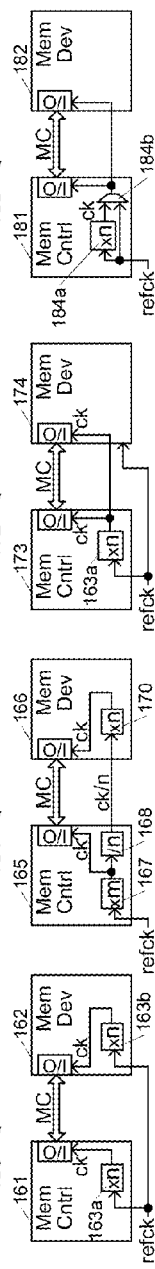
FIG. 2

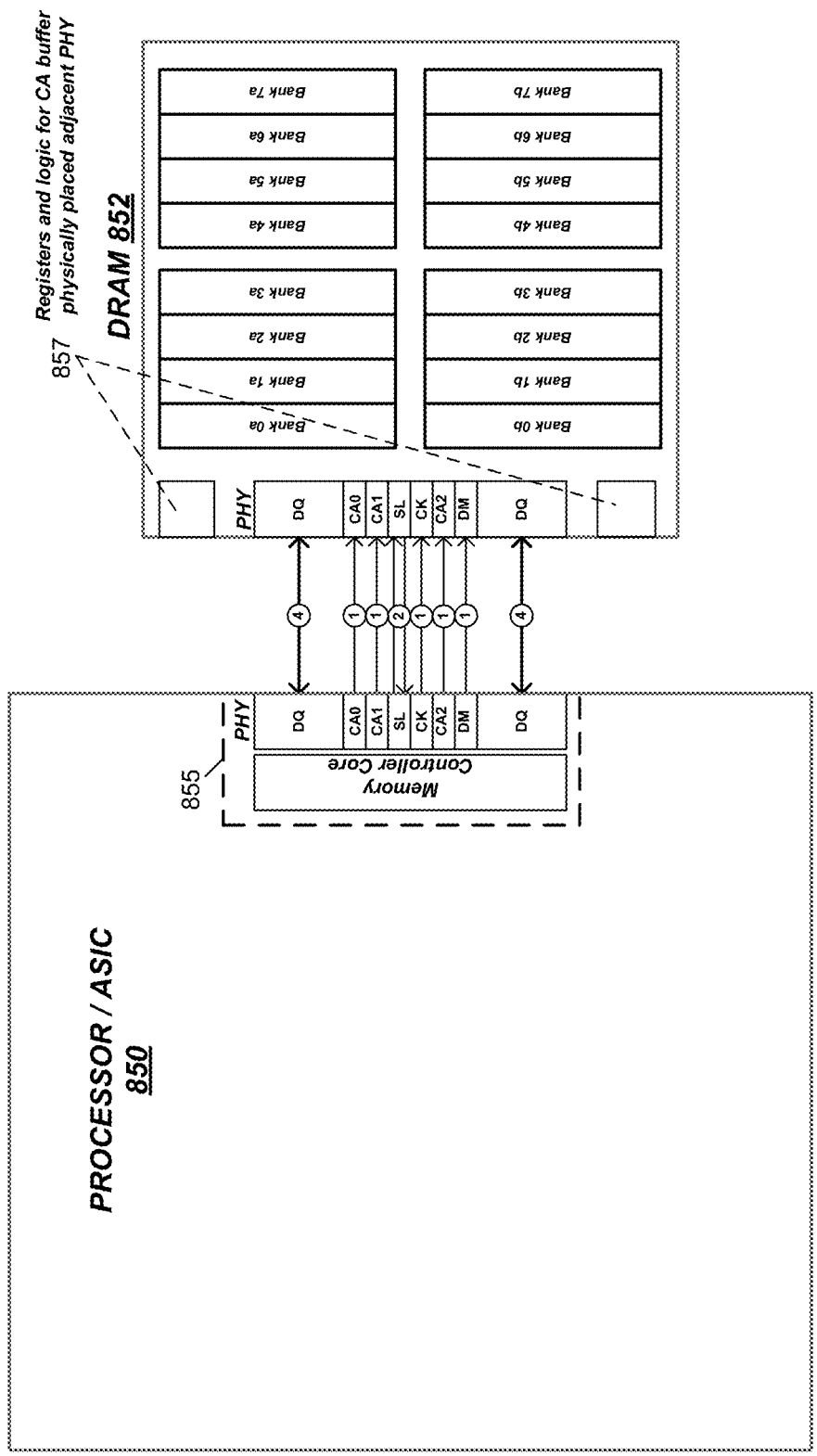

FAST-WAKE MEMORY CONTROL

TECHNICAL FIELD

The present invention relates generally to the field of electronic communications and more particularly to signaling between integrated circuit devices.

BACKGROUND

High-speed signaling interfaces in modern memory systems are commonly switched to a low-power state during idle periods to conserve power. Unfortunately, exit from the low-power state tends to considerably increase the net memory access latency, a particularly undesirable penalty in mobile applications (e.g., smartphones, laptop computers and the like) where limited battery life and bursty transaction profiles dictate frequent power-state transitions.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates a generalized embodiment of a memory system in alternative signaling resources are applied to enable transmission of a memory access command from a memory controller to a memory device while peak signaling-rate command-signaling resources are unavailable;

FIG. 2 illustrates a number of different system timing arrangements that may be employed to deliver high-speed and low speed timing signals to components of a memory system;

FIG. 14 illustrates an exemplary physical layout of structures within a memory controller and memory device that include I/O interfaces and circuitry to support the fast-wake operation described in reference to FIGS. 1-13;

DETAILED DESCRIPTION

Figure 3:
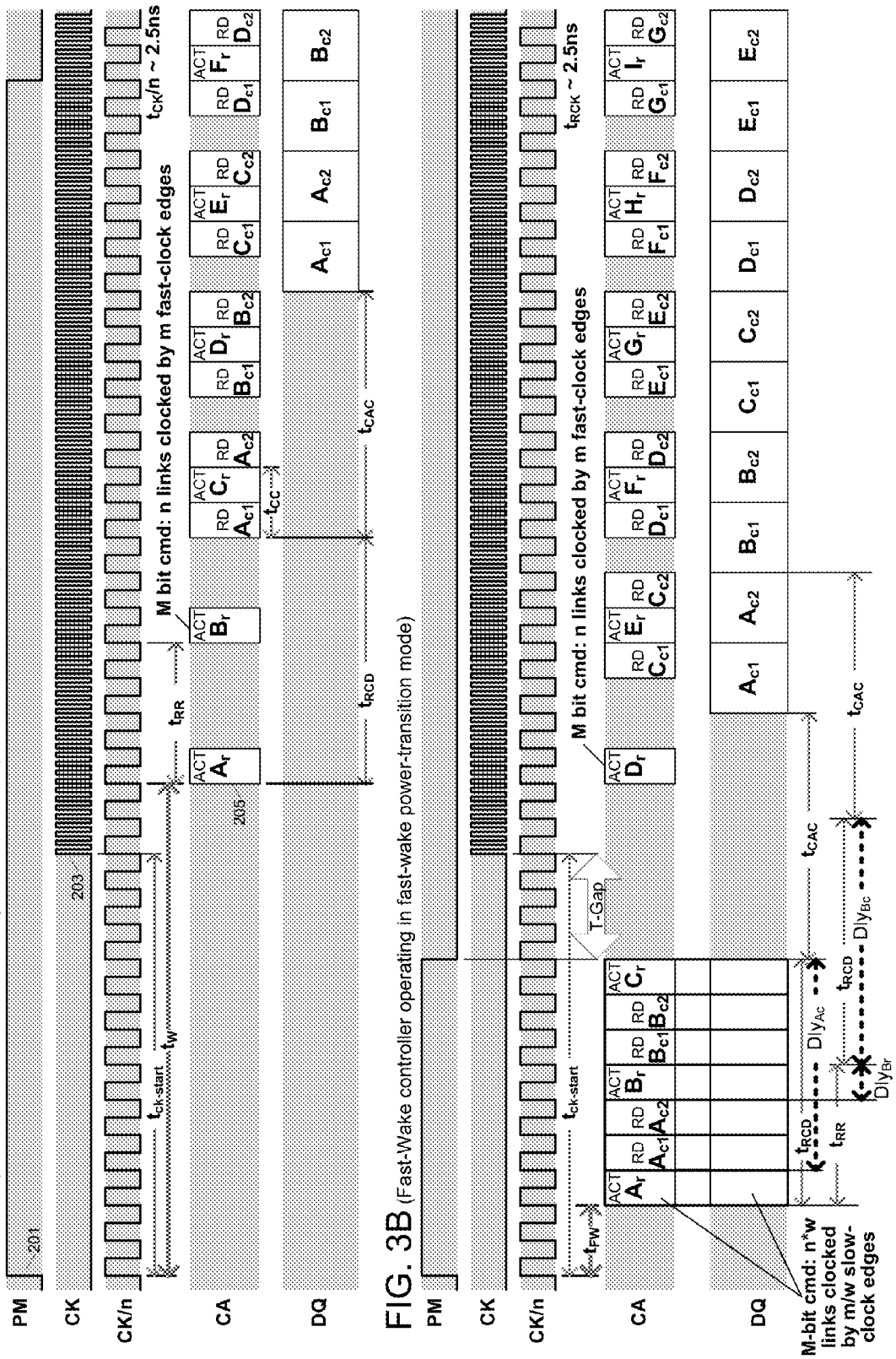
FIGS. 3A and 3B present exemplary timing diagrams contrasting "legacy" and "fast-wake" power-transition modes, respectively, effected by the memory controller of FIG. 1.

Memory systems in which signaling resources are dynamically reallocated to reduce memory access latency when exiting from a low-power state are disclosed in various embodiments. In one embodiment, one or more timing signals used to time data and command transmission over high-speed data and command signaling links are paused or otherwise disabled when the memory system enters a low-power state and require substantial time to be re-established at appropriate frequency and/or phase as the system returns to an active operating state. Instead of waiting for the high-speed timing signals to be re-established before beginning memory access operations, an alternative, lower-frequency timing source is used to time transfer of one or more memory-access commands over a combination of data and command signaling links while the high-speed timing signals are being restored (i.e., during the transition between low-power and active states), thereby hastening transmission of memory-access commands to memory devices and reducing the incremental latency required to exit the low-power state. In one embodiment, the higher-frequency and lower-frequency timing sources applied during different operating states are routed via alternate signaling paths within a memory system and selectively applied within system components according to the system operating state. In an alternative embodiment, one or more timing signal generators capable of glitchlessly shifting a timing signal between two or more oscillation frequencies are provided, thus enabling different-frequency timing signals to be delivered to system components via the same timing signal paths in either operating state. When the timing signal is used to time data (or command) transfer over information-bearing signaling links, the ability to glitchlessly shift the timing signal frequency enables a corresponding glitchless shift between lower and higher data rates on the information-bearing signaling links.

FIG. 1 illustrates a generalized embodiment of a memory system 100 in which a memory controller 101 and memory device 103 apply alternative signaling resources to enable transmission of one or more memory access commands from the memory controller to the memory device during a power-state transition in which peak signaling-rate command-signaling resources are unavailable. By this operation, referred to herein as "accelerated power-up" or "fast wake," a memory access command may be transmitted to the memory device concurrently with restoration of signaling resources required for peak-rate signaling and thus substantially earlier than possible awaiting availability of the peak-rate signaling resources, thereby substantially reducing the power-up or "wake-up" latency penalty that plagues conventional low-power memory systems.

In general, the memory system of FIG. 1 and other embodiments disclosed herein may be deployed as a subsystem within virtually any type of host system, but is particularly well suited to battery-powered or energy-conserving systems that transition to a reduced-power state when idle including, for example and without limitation, mobile communication devices (cell phones, smartphones, messaging devices, etc.), mobile computing devices (laptop, notebook, netbook, tablet, etc.) and various types of mobile consumer electronics devices (global positioning systems, audio/video recording and/or playback systems, etc.). The host system may include, for example, one or more processors or application-specific integrated circuits (ASICs) that issue memory-transaction requests to memory controller 101, which in turn carries out the requested transactions (memory read or write) by issuing corresponding memory access commands to memory device 103 and managing the flow of data corresponding to the memory access commands between the host requestor and memory device 103. Although memory system 100 is conceptually distinguishable from the host system, components of the memory system may be integrated with other host system components in a number of ways. In one embodiment, for example, memory controller 101 is implemented on the same integrated-circuit (IC) die as the host processor(s) or ASIC (e.g., in a system-on-chip (SOC) or the like) forming, in effect, a specialized interface to memory device 103. Also, memory device 103 and/or memory controller 101 may be packaged together with or without one or more other IC dice of the host system in an integrated circuit package, thus forming a system-in-package or multi-chip module, stacked-die module or other IC package containing multiple IC dice.

In the embodiment of FIG. 1, memory controller 101 and memory device 103 are respective IC dice (i.e., IC "chips") and coupled to one another via a pair of chip-to-chip signaling channels, including high-speed memory-access channel 105 and slow-speed sideband channel 107. The memory-access channel 105 includes a data path 122, command/address path 124 and clock path 126 each formed by a respective set of one or more signal links (i.e., one or more data links, one or more command/address (CA) links, and one or more clock links, respectively), with clock path 126 depicted in dashed outline to emphasize that alternative clocking arrangements may be employed. The sideband channel 107 includes a pair of relatively low-speed signaling links to convey sideband data ("sd") and a sideband clock signal ("ck/n") as shown.

Although only one memory device 103 is shown in FIG. 1 and other embodiments discussed below, in all such cases multiple memory devices 103 may be coupled to memory controller 101 in various interconnection topologies. In one embodiment, for example, multiple memory devices 103 are disposed on a memory module (i.e., substrate designed to be removably inserted into a memory module connector and having on-board wiring to couple the command and clock paths in common to all the memory devices disposed on the substrate and to couple respective, dedicated data paths (or respective portions of an otherwise unified data path) to the memory devices). The host system itself may have one or more module connectors with, for example, a given data path being coupled to one memory device (or two or memory devices where a memory module has separately selectable sets or ranks of memory devices) on each memory module. Also, in a "multi-channel" embodiment, a separate and distinct memory access channel may be provided for each set of memory devices (with each memory device set being disposed, for example, on a respective memory module or in a respective integrated-circuit package), and a sideband channel is shared by all memory devices in the system. Further, the memory-side interface to the memory controller may be implemented in a buffer IC, itself having a set of wider/slower or faster/narrower interfaces to respective memory devices. The buffer IC may be, for example, disposed on a memory module together with the memory devices coupled thereto, or socketed or otherwise disposed on a motherboard along with the IC containing the memory controller.

Regardless of component population, packaging or interconnection details, memory controller 101 may be hardwired or programmed to apply various power management policies which involve transitioning the memory system between full-power "active" and reduced-power "sleep" modes in accordance with host demanded memory-access (and possibly other factors, such as remaining battery life; user-selected preferences, etc). Sleep mode itself may include multiple low-power modes, each exhibiting progressively lower power consumption generally at the cost of increased exit/wake-up timing penalty. Although a number of such low-power modes are disclosed below, the expressions "sleep mode," "low-power mode," "reduced-power mode" and corresponding references to sleep state, low-power state, reduced-power state and the like are used broadly herein to refer to any condition in which one or more signaling resources are disabled to conserve power, reduce thermal loading, or for any other reason.

Still referring to FIG. 1, memory controller 101 includes a controller core 112 and input/output (I/O) interface 110 (the latter constituting a physical interface (PHY) to memory access channel 105), and memory device 103 similarly includes a memory core 132 and I/O interface 130. The I/O interfaces (110, 130) within the memory controller and memory device (i.e., the "controller-side" and "memory-side" I/O interfaces) include signaling circuitry to support high-speed, bi-directional data transfer via data path 122 and unidirectional command (or request or instruction) transfer via command/address path 124, including data signaling circuits ("DQ"), command/address signaling circuits ("CA") and clock circuitry ("CK"). In one embodiment, the controller-side clock circuitry receives a reference clock signal ("RefCk") and, in response, generates a relatively high-frequency I/O clock ("ck") that is supplied to controller-side DQ and CA signaling circuits, and also forwarded directly or in recoverable or derivative form to the memory device via clock link 126. The controller-side clock circuitry may also generate the relatively slow-frequency sideband clock (e.g., having $(1/n)^{th}$ the I/O clock frequency and hence depicted as "ck/n"), which may in turn be used to time low-speed signaling over the sideband data link and also applied as (or used to generate) low speed "core clock" signals within the controller core and/or memory core. In the embodiment shown, the memory-side clock circuitry receives the forwarded I/O clock signal via clock link 126 and distributes the I/O clock signal (or one or more clock signals derived therefrom) to the memory-side DQ and CA signaling circuits. Although not specifically shown, additional timing signals such as strobes may be generated within the memory controller and/or memory device and transmitted between the controller- and memory-side I/O interfaces to time signal transmission/reception.

In the embodiment of FIG. 1, controller core 112 includes a transaction queue 115, data-flow logic 117 and power-mode logic 112. Transaction queue 115 is provided to buffer and control servicing of host requests (i.e., requests to store/retrieve memory from the memory system) and data-flow logic 117 is provided to manage the flow of read and write data through the memory controller in connection with the host requests (e.g., buffering data as necessary to meet timing constraints imposed by the memory device and/or signaling interfaces). Power-mode logic 119 monitors the status or fill-level of transaction queue 115 to determine whether and when to transition memory system 100 between active and sleep modes. In one embodiment, for example, power-mode logic 119 transitions the memory system to sleep mode upon determining that the transaction queue has remained empty (i.e., no pending host requests) for a predetermined number of core-clock cycles (and/or receiving or detecting other system-idle indications). As part of the active-to-sleep transition, the power-mode logic deasserts one or more resource-enable signals (shown generally within controller 101 as "EN") otherwise used to enable peak-rate operation within the controller-side I/O circuitry 110, thus disabling peak-rate signaling over the memory-access channel. Power-mode logic 119 also signals the sleep mode to memory device 103 via sideband channel 107.

Turning to memory device 103, memory core 132 includes power-mode logic 139 which responds to the sleep mode indication from counterpart controller-side power-mode logic 119 by deasserting memory-side resource-enable signals ("EN"). Power-mode logic 119 and 139 may collectively or individually transition memory system 100 to one or more further-reduced power levels as the system-idle interval protracts.

Memory core 132 also includes a storage array 135 and access logic 137 for managing read and write access to the storage array in response to commands and addresses from memory controller 101. In the embodiment of FIG. 1 and other embodiments described below, storage array 135 is assumed to be a dynamic random access memory (DRAM) array composed of DRAM cells that require occasional refresh to avoid data loss. In all such embodiments, virtually any storage technology may be used to implement the storage array instead of or in addition to DRAM cells including, without limitation, static random access memory (SRAM) cells and various forms of non-volatile memory cells (e.g., flash memory, phase-change memory, etc.). Moreover, storage array 135 may be implemented by multiple banks of storage cells (of homogeneous or heterogeneous type) in which access-related operations may be carried out concurrently and/or in a pipelined manner (e.g., data read or write within one bank concurrently with row activation or precharge in another).

Regardless of the storage technology or architecture employed within storage array 135, command and address values (command/address or CA values) conveyed to memory device 103 via command path 124 are applied within the access logic to carry out data retrieval (memory read) and data storage (memory write, including non-volatile cell programming) operations within address-specified regions of the storage array 135. Retrieved data, referred to herein as "read data," is returned to memory controller 101 via data path 122 and data to be stored or programmed ("write data"), conversely, is provided from the memory controller via the data path. In some cases, data-less commands, such as row-activation commands (instructing data transfer from storage cells within the core storage array to a latching sense-amplifier bank), refresh commands, erase commands (e.g., in the case of flash or other electrically-erasable non-volatile memory) and various configuration commands and/or operating-mode commands may also be issued via command path 124.

During active-mode operation, when peak-rate command and data signaling resources are fully functional, memory-access channel 105 is clocked by one or more high-speed timing signals to enable peak-rate transmission of memory access commands from the memory controller to the memory device and peak-rate transmission of read/write data between the devices (i.e., transmission of read data from the memory device to the memory controller and transmission of write data from the memory controller to the memory device). By contrast, during idle intervals, when no host requests are pending, memory controller 101 transitions the memory system to a reduced power mode in which one or more of the high-speed timing signals are switched off (i.e., parked or otherwise rendered inactive), in effect, disabling peak-rate command/data transmission via memory access channel 105. When a host memory-access request is eventually received (marking the end of an idle interval), memory controller 101 begins an orderly transition (i.e., exit or ascension) from the reduced-power mode to active mode, including communicating the power-state transition (i.e., wake-up) to memory device 103 via sideband channel 107. During this "wake-up" interval, the high-speed timing signals are re-activated, but generally take substantial time to reach a stable operating frequency and/or the precise phase alignment needed for high-speed command signaling, potentially delaying command transfer until after the high-speed timing signals are fully restored. In the embodiment of FIG. 1, this incremental wake-up delay (or latency) is substantially reduced by applying the slower-frequency but fully operable sideband clock signal, ck/n, to time transfer of one or more memory access commands from memory controller 101 to memory device 103 during the wake-up interval and thus before peak-rate command signaling is available. Further, to compensate for the relatively low signaling rate afforded by the sideband clock signal, signaling links dedicated to data, data-strobe and/or data-mask transmission during active-mode operation are temporarily reallocated to conveyance of command/address information, thereby establishing a temporarily widened "fast-wake" command path during the wake-up interval. In one embodiment, for example, the frequency ratio of the I/O and sideband clocks matches the ratio of the fast-wake and active-mode command path widths so that the fast-wake and active-mode command bandwidths are the same. That is, the bandwidth of the fast, relatively narrow active-mode command path is matched by the bandwidth of the slower but wider fast-wake command path. The fast-wake command path and clocking paths are depicted conceptually at 123a and 125a, respectively, within memory controller 101 and at 123b and 125b within memory device 103. The signaling links that form the off-chip portion of the fast-wake command path are shown at 123c and include some or all the data links of data path 122 and some or all the links of command path 124 as shown.

Still referring to FIG. 1, operational view 140 illustrates the mode-dependent command flow within memory system 100 as the system transitions from active mode 141 to sleep mode 142 (or low-power mode), and then to a transient "fast-wake" mode 143 during the wake-up interval discussed above, and then finally back to active mode. Starting with active mode 141, command signals are conveyed on command path (designated "cmd" and corresponding to command path 124) and clocked by the high-frequency I/O clock ("ck"), thereby effecting peak-rate command transmission, a command signaling rate used to convey commands during active mode 141 (e.g., commands may be transmitted at the maximum command-signaling rate supported by memory system 100). Transmission of the sideband clock ("ck/n") may be disabled (paused, halted, suspended, stopped, etc.) during active mode, as indicated by the 'X' across the sideband clock link. Also, though not specifically shown, read and write data corresponding to the commands are conveyed on the data path ("data" and corresponding to data path 122).

Upon entering sleep mode 142 (initiated, for example, by asynchronous power-mode signaling via the sideband link), command and data transmission cease and the high-speed timing signals used to clock the controller-side and memory-side I/O interfaces are disabled as indicated by the 'X' across the data, command and clock paths of the memory-access channel. Sideband signaling may also be disabled as indicated by the 'X' across the sideband clock link.

When a memory access request is eventually queued (i.e., an "awakening" host request that marks the end of the memory-system idle interval), memory system 100 transitions to a short-lived (i.e., transient or transitional) fast-wake mode 143 in which the sideband clock signal, ck/n, is forwarded to the memory device and applied within both the memory controller and memory device to enable one or more memory-access commands (i.e., at least the memory-access command corresponding to the awakening host-request) to be transmitted from the controller to the memory device over a temporarily widened command path that includes both command and data signaling links as shown at 145. By this operation, one or more memory access commands may be transferred to the memory device at (or near) the active-mode command signaling rate while the high-speed I/O clock and possibly other resources required for peak-rate signaling are restored to operability. Thus, wake-up operations (i.e., restoration of resources required for peak-rate signaling) and memory-access operations are carried out concurrently rather than sequentially, so that the wake-up latency is effectively hidden under the memory-access latency instead of adding to it. From the perspective of the host memory access requestor, the wake-up latency and thus the worst-case memory access latency is dramatically reduced.

FIG. 2 illustrates a number of different system timing arrangements that may be employed to deliver high-speed and low speed timing signals (e.g., clock signals corresponding to the I/O clock and sideband clock signals discussed above) to variants of the memory controller and memory device of FIG. 1. In a first embodiment 160, a relatively low frequency reference clock signal, "refck," is distributed to both memory controller 161 and memory device 162 and applied to respective frequency-multipliers 163*a*, 163*b* (e.g., phase-locked loop (PLL) circuits, injection-locked oscillator (ILO) circuits or the like) therein. The frequency-multipliers 163*a*, 163*b* multiply the reference clock frequency by a factor 'n' to generate high-speed I/O clock signals, "ck," used to clock the memory-side and controller-side I/O interfaces ("I/O") and thus enable peak-rate signaling via the memory-access channel ("MC"). During sleep mode, frequency-multipliers 163*a* and/or 163*b* may be disabled to conserve power, thus rendering the I/O clocks inactive. During the wake-up interval, while the frequency-multipliers are phase-locking (and/or other operations are carried out to restore peak-rate signaling), the relatively low-frequency reference clock signal may be applied to clock circuitry within the I/O interfaces and thus enable the fast-wake operation described above (i.e., transmission of a leading memory access command concurrently with effort to re-establish peak-rate signaling resources). Although the reference clock signal is depicted as originating outside the memory controller and memory device (e.g., from a crystal oscillator and/or other IC), the reference clock signal may be generated within the memory controller or memory device (e.g., using a ring-oscillator, tank circuit or any other on-die clock-generating circuit) and output to the other device(s).

Still referring to FIG. 2, the clocking arrangement shown at 164 is similar to that of embodiment 160, except that the low-frequency clock signal (i.e., "ck/n") supplied from memory controller 165 to memory device 166 is generated by frequency-division of the controller-side I/O clock in frequency-divider 168. This arrangement enables generation of a slow-clock signal having a frequency different from the reference clock frequency. That is, controller-side frequency-multiplier 167 multiplies the reference clock frequency by a factor 'm' that may be (but is not required to be) different from the frequency-division factor 'n' applied by frequency divider 168 and thus different from the multiplication factor, 'n,' applied by memory-side frequency-multiplier 170. During sleep mode, the memory-side frequency-multiplier may be disabled, while the controller-side frequency-multiplier remains active (the controller-side frequency-multiplier may be disabled upon entering a yet lower-power mode). Such a reduced-power arrangement may be particularly effective where the controller-side clock multiplier serves other purposes (e.g., maintaining one or more clocks used within the controller core and thus needed during at least some reduced-power modes) and/or multiple memory devices are coupled to the memory controller (i.e., such that frequency-side multipliers, when enabled, consume the predominant share of clocking-related power). In any case, the relatively low-frequency clock signal, ck/n, is available within both the memory controller and memory device and thus may be applied within the memory-side and controller-side I/O circuitry to enable the fast-wake operation described above (i.e., transmission of a leading memory access command concurrently with effort to re-establish memory-side I/O clocks and/or other peak-rate signaling resources).

In the clocking arrangement shown at 172, the controller-side I/O clock is generated by frequency-multiplier 163*a* as in embodiment 160), but is itself forwarded from memory controller 173 to memory device 174 to provide memory-side I/O clocking. The forwarded I/O clock is also referred to as a data-rate or bit-rate clock as it includes a respective transition for each bit (or multi-bit symbol) conveyed on a given data link and/or command link. As shown, the reference clock, refck, is also delivered to the memory device to establish a relatively low frequency clock signal to enable the above-described fast-wake operation (i.e., transmission of a leading memory access command concurrently with effort to re-establish the forwarded I/O clock "ck" and/or other peak-rate signaling resources). Note that the low-frequency clock may also be derived from the controller-side I/O clock (e.g., by a frequency-divider as in arrangement 164), in which case both the data-rate clock (i.e., an instance or derivative of the controller-side I/O clock) and lower-frequency derivative of the data-rate clock may be forwarded from memory controller 173 to memory device 174. Also, the controller-side I/O clock and forwarded data-rate clock need not have the same frequency. For example, the controller-side I/O clock may be twice the frequency of the forwarded I/O clock for timing alignment purposes and thus have more edges than necessary for data/command transmission (such an embodiment is disclosed in greater detail below). More generally, clock driver circuits and receiver circuits, some or all of which may be selectively enabled and disabled according to the power mode, have been omitted from embodiments in FIG. 2 to avoid obscuring the different clocking arrangements shown. In arrangement 172, for example, forwarding of the data-rate clock may be disabled (thus effecting memory-side clock stoppage or clock-pause) during sleep mode, while forwarding of the low-frequency clock (i.e., the reference clock or derivative thereof, including a derivative of the data-rate clock) is enabled. Conversely, upon exiting sleep mode, and after performing accelerated command-transfer per the fast-wake mode described above, the clock forwarding state may be reversed, with data-rate clock forwarding enabled and low-frequency clock forwarding disabled.

In the clocking arrangement shown at 180, the forwarded-clock I/O is glitchlessly shifted between low and high frequencies to provide the different-frequency clocks applied in fast-wake and active operating modes. Moreover, in one embodiment, the frequency-shift or frequency transition (an operation referred to herein as "gear shifting") is carried out "gaplessly" in that each cycle of the clock has a period no longer than the period of the low frequency clock (i.e., the slow clock) and that, during data transmission, one data bit or data symbol is sent for every clock edge. That is, there are no "gaps" in the sequence of clock pulses during the gear-shift as a given high or low phase of the clock signal lasts no longer than a high or low phase of the reference clock signal.

In the conceptual view shown, a reference clock signal is selected within clock selector 184*b* during fast-wake operation and delivered to the controller-side and memory-side I/O circuits to enable fast-wake command transmission and reception concurrently with restoration of peak-rate or data-rate clock signal ("ck") within clock multiplier 184*a*. After the high-speed clock from clock multiplier 184*a* has stabilized, clock selector 184*b* is switched to glitchlessly (i.e., no runt clock pulses) and gaplessly (no missing clock pulses) output the data-rate clock signal to the controller-side and memory-side I/O circuits and thereby time active-mode command/data transmission and reception.

In the embodiment shown at 180, the reference clock is supplied to the controller-side I/O circuitry during fast-wake mode via the same internal clock line otherwise used to deliver the data-rate clock (i.e., during active-mode). Similarly, the reference clock is forwarded to the memory device via the external clock link 185 which is otherwise used to forward the data-rate clock, and supplied to the memory-side I/O circuitry via the internal clock line otherwise used to deliver the data-rate clock. By this arrangement, resources required to route the low and high-frequency clock signals may be reduced. Similarly, as discussed below, circuitry for serializing and deserializing command information (including address and control information) within the controller-side and memory-side I/O circuits may be re-used between fast-wake and active-mode operation, for example, with mode-specific signals being used to adjust the serialization depth upon transitioning to one mode or the other. Note that despite depiction of a solitary clock link, the reference clock signal or other timing signal may nonetheless be routed to memory device 182 for initialization or other purposes. Also, while FIG. 2 illustrates an asymmetric timing arrangement, in an alternative embodiment, the memory device may also contain a clock multiplier (i.e., akin to clock multiplier 184*a*) that can be used as a timing source for transmission of read data from the memory device to the memory controller. That is, the memory device generates an independent source-synchronous clock that is forwarded to the memory controller for read data transfer (or memory-to-controller transfer of any other information. Accordingly, the topology is essentially as shown at 180, but with forwarded clocks being symmetrically provided in each direction. The switchover between operating modes (and thus between low and high frequency clocking) may still be seamless, for example, with the controller waking up from a low-power state first and then the memory device.

In the embodiment of FIG. 1 and other embodiments described below, fast-wake operation is enabled, in part, through alternative timing circuitry provided within the memory device and memory controller to time command transmission during the wake-up interval between low-power and active operating modes. In one embodiment, the memory controller is capable of executing either a legacy power-state transition or the above-described fast-wake power-state transition, depending upon whether the attached memory device (or devices) includes such alternative timing circuitry and/or other circuitry needed to enable fast-wake command transfer. Accordingly, the memory controller may determine or be informed at system initialization whether (and which) attached memory devices support fast-wake operation and selectively perform fast-wake power mode transitions accordingly.

FIGS. 3A and 3B present exemplary timing diagrams contrasting normal-wake and fast-wake power-transition modes, respectively, effected by the memory controller of FIG. 1. For purposes of example, the low-frequency sideband clock, CK/n, is assumed to oscillate at 0.4 GHz (period, $t_{CK}/n$, equal to 2.5 nS), one-fourth the frequency of a 1.6 GHz I/O clock, CK (i.e., n=4). Also, double-data-rate (DDR) signaling is assumed on both the command and data links (i.e., the rising edge and falling edge of a given I/O clock cycle are used to trigger information transmission/reception so that two symbols (e.g., two bits) are transmitted per signaling link per I/O clock cycle during active-mode data or command transmission), thus establishing a peak signaling rate of 3.2 Gb/s (gigabits per second) per signaling link for both command and data transmission. These assumptions are carried forward in other embodiments below, although in all such cases different clock frequencies, clock-frequency ratios (i.e., ratio other than n=4) and/or information transfers per I/O clock cycle (e.g., single-data rate, quad data rate, octal data rate, etc.) may apply. Also, the peak data signaling rate need not match the peak command signaling rate (i.e., the data rate may be higher or lower than the command rate).

In both FIGS. 3A and 3B, the memory system is assumed to be exiting from a sleep (reduced-power) mode in which the I/O clock (i.e., the high-frequency clock, "CK," used to enable peak-rate signaling) is disabled and thus rests at a steady state. Referring first to the normal-wake waveforms shown in FIG. 3A, the controller-side power mode logic, clocked by the low-frequency sideband clock, CK/n (or a clock signal derived therefrom), asserts a power-mode signal (PM) on the sideband data link at the start of the wake-up interval (i.e., as shown at 201) and also asserts one or more enable signals (not specifically shown) to the controller-side clocking circuitry to trigger restoration of peak-rate signaling resources (e.g., re-establish the I/O clock signal(s) and related timing circuitry). The memory-side power-mode logic responds to the power-mode signal assertion at 201 by asserting one or more enable signals (also not shown) to the memory-side clocking circuitry to trigger restoration of the peak-rate signaling resources within the memory device. Over time interval, $t_{ck\text{-}start}$, the I/O clock is restored to a desired frequency and phase (e.g., by the controller-side and/or memory-side clocking circuits), and is thereafter output to clock the system I/O circuits. This operation is illustrated in FIG. 3A by the I/O clock oscillation starting at 203 after a delay, $t_{ck\text{-}start}$, relative to the rising PM edge at 201. Upon restoration of the I/O clock (and possibly other resources needed for peak-rate signaling), the memory controller begins clocking a lead memory access command 205 through the controller-side command signaling circuitry, serializing the memory-access command as necessary for transmission on the command path, "CA." In the embodiment shown, the net serialization delay and output delay is assumed to be approximately 5 nS so that, eight I/O clock cycles (two sideband clock cycles) after the I/O clock is restored, the memory controller outputs the lead memory access command 205 onto the command path.

In the particular example shown, the lead memory access command 205 is a row activation command (i.e., instructing the memory device to carry out a row activation operation in which the content of a storage array row or "page of data" is transferred to a bank of sense amplifiers, thus rendering individual columns of the "open page" accessible in ensuing "column read" and "column write" operations) corresponding to a host request to read data from row A of a given storage bank, and thus depicted as "ACT $A_r$," where "ACT" indicates a row activation, $A_r$ is an address specifying the row to be activated (e.g., selecting a bank within the core storage array and selecting a row within the bank). A number of timing constraints imposed by inherent operational delays within the memory core dictate the transmission time of subsequent memory access commands and ultimately the net timing delay or latency associated with transacting a given memory access request. In one embodiment, for example, a specified amount of time, $t_{RCD}$, may be required for row activation, and thus imposed by the memory controller between transmission of a row activation command and a subsequent memory read or write command (i.e., a column read or column write command) directed to the same row. On top of the activation delay ($t_{RCD}$), a specified column-access delay, $t_{CAC}$, may be required for the memory device to route a column of read data from an open page to the external data signaling links in a column read operation. Further, transmission of the data itself requires a specified amount of time (i.e., number of bits to be transferred multiplied by the peak signaling bandwidth of the data path and multiplied again by the number of column read or write operations being carried out for a given row activation), thus defining a specified amount of time, $t_{RR}$, to be imposed by the memory controller between successive row activation commands issued to different memory banks (i.e., even though memory banks are independently accessible so that row activations may be carried out concurrently in multiple banks, the data path is shared and thus the time required to transfer data on the path restricts access to the individual banks). Similarly, the time required to transfer data associated with a given column access constrains the minimum time interval, $t_{CC}$, between successive column operations (e.g., back to back column read operations) directed to the same open page. Referring to the lead memory read operation shown (i.e., row activation "ACT $A_r$," followed by the first of two column read operations, "RD $A_{c1}$"), the overall memory access latency between arrival of the lead row activation command at the memory device and output of corresponding read data from the memory device is $t_{RCD}+t_{CAC}$, a latency of 35 nS in the example shown. Further, in the normal-wake power-transition mode shown, the wakeup time delay, $t_W$, between the rising power-mode edge at 201, and transmission of the lead memory access command 205 adds directly to (i.e., "incrementally to") the memory access delay, thus imposing a net wake-up memory access latency of 70 nS (the wakeup delay is also 35 nS in this example), an onerous timing penalty in systems that otherwise benefit from power-mode transitions.

Turning to the fast-wake power-transition mode shown in FIG. 3B, instead of waiting for the high-frequency I/O clock to be restored, the lower-frequency sideband clock, "CK/n," is applied to time the transfer of a lead memory access command ("ACT $A_r$,") over a temporarily-widened command path that includes both the active-mode command path (i.e., CA links) and the active-mode data path (DQ links), thereby enabling the lead memory access command to be transmitted at a much earlier time (i.e., an accelerated point in time) than in the legacy wake-up of FIG. 3A and thus dramatically reducing the effective wakeup latency, from $t_W$ in legacy mode to $t_{FW}$ in fast-wake mode. Under the timing shown in FIGS. 3A and 3B, for example, the wakeup latency is reduced from 35 nS in the legacy wake-up to only 5 nS in fast-wake mode; more than 85% reduction in the incremental latency penalty incurred to exit the low-power state.

In the particular example shown in FIG. 3B, the expanded-width command path applied during fast-wake operation (also referred to herein as the "fast-wake" command path or "composite" command path) includes 'n' times as many links as the active-mode command path (i.e., formed by the CA links alone), thus matching the ratio of the I/O clock and sideband clock frequencies. Accordingly, the fast-wake command transmission bandwidth matches the active-mode command transmission bandwidth so that each M-bit memory access command (e.g., including some number of command/control bits and some number of address bits) is transmitted in the same number of sideband clock cycles in either operating mode (i.e., one ck/n cycle or 2.5 nS in the example shown). Further, in one embodiment, the ensuing memory access commands, including the column read commands directed to address A (i.e., "RD $A_{c1}$" and "RD $A_{c2}$"), and then row activation command and column read commands directed to address B (i.e., "ACT $B_r$," "RD $B_{c1}$" and "RD $B_{c2}$") and address C ("ACT $C_r$,") are issued in succession without regard to core timing constraints imposed by the memory device. This approach advantageously permits as many commands as possible to be conveyed to the memory device during the fast-wake interval and, in effect, creates a timing gap (designated "T-Gap" in FIG. 3B) that may be used to bridge the transition between clocking modes (i.e., transition from signaling using the low-frequency sideband clock to the high-frequency I/O clock, and thus from fast-wake to active-mode timing) in a manner that avoids delaying requested data transfer. In the embodiment shown, for example, the timing gap extends from the falling edge of the power-mode signal to enablement of the I/O clock signal.

As discussed in greater detail below, scheduling logic may be provided within the memory-side I/O circuitry or memory-side core to enforce timing delays between commands otherwise transmitted back-to-back during fast-wake mode. In one embodiment, for example, the memory-side scheduling logic includes circuitry to buffer the fast-wake commands and to apply the commands to the memory core at the appropriate time, in effect emulating the timing behavior otherwise imposed by the command scheduling circuitry within the memory controller. As an example, the memory-side scheduling logic may delay application of column read command RD $A_{c1}$ to the memory core by interval $Dly_{AC}$ (depicted below the DQ transmission diagram) to emulate the $t_{RCD}$ delay that would have been imposed by the controller-side logic (e.g., scheduling logic within the transaction queue that manages the timing of command output) in an active-mode command sequence. Similarly, the memory-side scheduling logic may delay application of activation command ACT $B_r$ by interval $Dly_{Br}$ to emulate the $t_{RR}$ delay that would have been imposed by the memory controller in an active-mode command sequence, and may also delay application of column read command RD $B_{c1}$ by interval $Dly_{BC}$ to meet the timing required by the $t_{RR}$ delay and $t_{RCD}$ delay. Application of other memory access commands may similarly be delayed as necessary to comply with memory device timing constraints (e.g., delay application of column read command RD $A_{c2}$ by interval $Dly_{AC}+t_{CC}/2$).

Still referring to FIG. 3B, it can be seen that read data "$A_{C1}$" (i.e., corresponding to column read command RD $A_{C1}$) is output from the memory device via the data path (DQ) substantially earlier than in the normal-wake power-transition mode, as the reduced wake-up delay (i.e., $t_{FW}$ versus $t_W$) translates directly into reduced overall memory-access latency. That is, the same core timing constraints apply in both cases ($t_{RCD}+t_{CAC}$ before memory data $A_{C1}$ is output), so that the accelerated command transfer yields correspondingly accelerated read-data return, in this example, 30 nS earlier than in normal-wake mode. As shown, read data corresponding to subsequent memory access commands (each including a row activation followed by a pair of column read commands) is returned without timing gap on the data path not only for commands issued via the fast-wake command path, but also commands issued over the active-mode path. For example, data is output in response to active-mode column-read command RD $D_{C1}$ immediately after (i.e., without timing gap) data output in response to fast-wake command RD $B_{C2}$. Accordingly, from the perspective of the host requestor, the memory-system simply wakes up faster when fast-wake operation is enabled; memory read requests are transmitted from controller to memory device at an earlier time, and data is likewise returned from the memory device to the memory controller and thus to the host requestor at an earlier time.

Figure 4:
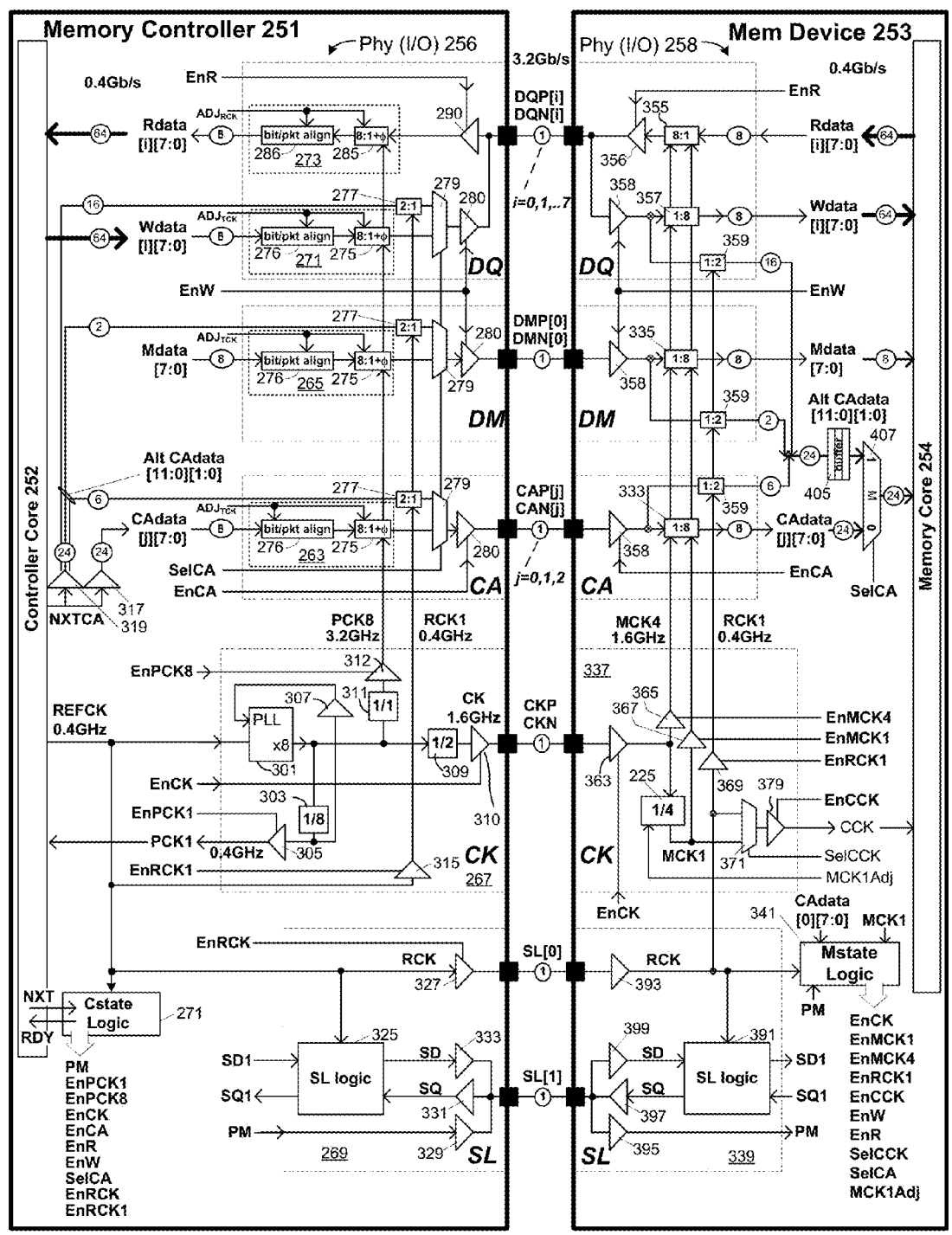
FIG. 4 illustrates a more detailed embodiment of a fast-wake memory system.

FIG. 4 illustrates a more detailed embodiment of a fast-wake memory system 250 having an architecture similar to that shown in embodiment 172 of FIG. 2 and including a memory controller 251 and memory device 253 that support the fast-wake operation described above. In the interest of clarity and without limitation, specific numbers and types of signaling links, clock frequencies and frequency ratios, and serialization depths (i.e., ratio between core interface and external signaling path) are depicted in FIG. 4 and related figures that follow. For example, differential signaling links are provided to implement each of eight data links (DQ[7:0]), three command/address links (CA[2:0]), data mask link (DM) and high-speed clock link (CK), while single-ended links implement a pair of relatively low signaling-rate sideband links (SL[1:0]). The sideband links include a sideband data link, SL[1], to convey power-mode information and to support system initialization (e.g., to bootstrap operation of higher-signaling-rate links, including the DQ and CA links), and a sideband clock link, SL[0], to convey a relatively low-frequency sideband clock. In one embodiment, the sideband links are driven by drivers and receivers (329, 331, 333, 395, 399, 397) designed to transmit and receive relatively large-swing (i.e., large peak-to-peak amplitude), lower-frequency signals, while the drivers and receivers for the differential links of the high-speed memory access channel are designed to transmit relatively small-swing, higher-frequency signals. In alternative embodiments, nominally equal signal-swings may be used on all signaling links. Moreover, each of the differential links may alternatively be single-ended links (and vice-versa), more or fewer links may be used to implement the command path and/or data path, and the data mask link (which may be considered part of the unidirectional command path) and associated circuitry may be omitted altogether. The side-band data link may also be omitted in favor of out-of-band signaling over one of the data or command links.

With regard to clock frequencies and ratios, the system clocking architecture is driven in the embodiment shown by a 400 MHz reference clock (REFCK) which is multiplied by a scaling factor of eight ("×8") within PLL 301 to generate a phase-distributed set of 3.2 GHz controller-side I/O clock signals referred to interchangeably herein as the "controller-side I/O clock" or "PCK8" (the "8" in "PCK8" indicating the 8× multiple of the reference clock frequency). In addition to driving the controller-side I/O clock, the 3.2 GHz output of PLL 301 is divided by two in divider 309 to generate a data-rate clock, CK (also referred to herein as PCK4), that is forwarded to memory device 253 via clock link CKP/CKN and thus constitutes a "forwarded" I/O clock. The PLL output is also divided by eight in divider 303 to produce a controller-side core clock signal (PCK1) in phase alignment the forwarded I/O clock and controller-side I/O clock, but having a reduced frequency for clocking controller core 252 and thus allowing a relaxed core timing domain. The reference clock itself is supplied as the sideband clock via link SL[0] and thus establishes a low-frequency clocking source that may be used to support fast-wake operation as detailed below. While the reference clock is depicted as originating within controller core 252, the reference clock may be generated elsewhere within memory controller 251, including within controller-side I/O circuitry 256 or by off-chip circuitry. If generated off-chip, the reference clock may be distributed directly to memory device 253 instead of being forwarded by the memory controller as shown. Also, while the same peak signaling rate applies with respect to each data, command and mask signaling link in the embodiment shown, different I/O clocking frequencies may be alternatively be applied to achieve different signaling rates for different classes of signals (e.g., half-data-rate clocking of command/address signals). Further, in the implementation shown, the 1.6 GHz forwarded I/O clock frequency is half the frequency of the 3.2 GHz controller-side I/O clock and also half the 3.2 Gb/s (Gigabit per second) signaling rate on the data and command links. Though occasionally referred to herein as a "half bit-rate" or "half symbol-rate" clock signal, the forwarded I/O clock is nonetheless considered to be a "data-rate" clock signal as the rising and falling edges within each cycle (or respective rising edges of two complementary signals in a differential clock implementation) of the forwarded I/O clock may be used to transmit or sample data within the memory I/O circuitry 258 in respective (1/3.2 GHz) data intervals. In alternative embodiments, the forwarded I/O clock may match the frequency of the controller I/O clock, either by doubling the forwarded I/O clock frequency (e.g., to 3.2 GHz in the embodiment shown) or halving the controller I/O clock frequency. In the latter case, the PLL may apply a scaling factor of four instead of eight and thus output a 1.6 GHz clock that is applied both as the controller-side I/O clock (i.e., both rising and falling edges of the clock or rising edges within complementary phases of a differential 1.6 GHz clock being applied to time signal transmission/reception) and forwarded to memory device 253 as the data-rate clock. More generally, in all embodiments herein, different clock distribution arrangements may be employed (e.g., as discussed in reference to FIG. 2), and within any clocking arrangement, different clock frequencies and frequency ratios may apply between core and I/O timing domains, and between different classes of signaling links.

Continuing with FIG. 4, eight-to-one-serialization is applied during active-mode operation to serialize core-supplied 8-bit-wide packets of information for bit-serial transmission over each command, data and mask signaling link and corresponding one-to-eight deserialization is applied to restore serially transmitted bit sequences to 8-bit-wide data for delivery to the counterpart memory core 254. For example, eight 8-bit packets of write data (i.e., Wdata[i][0-7], where i ranges from 0 to 7) output from controller core 252 are serialized within data serializer 271 during a given period of the 400 MHz controller core clock (PCK1) and transmitted in respective 8-bit sequences at a 3.2 Gb/s data rate over each of the eight data links, DQ[0-7], thus providing an aggregate data bandwidth of 3.2 GB/s (3.2 gigabytes per second). At the memory device 253, each of the eight-bit-long write data packets is sampled bit by bit and restored to a parallel packet within deserializer 357 during the cycle time of a 400 MHz memory core clock (CCK), thus enabling memory core 254, like controller core 252, to operate on byte-sized packets of data in a lower frequency domain. Converse serialization within 8:1 data serializer 355 of memory device 253 and deserialization within 1:8 data deserializer 273 of memory controller 251 are carried out to transmit read data (Rdata[i][7:0]) from the memory device to the memory controller, thus enabling 3.2 GB/s data transfer from the memory core to the controller core over a relatively narrow, 8-link data path, while enabling both device cores to operate in a relatively low-frequency clock domain (400 MHz in this example). Similar active-mode serializing and deserializing operations are carried out unidirectionally to communicate command/address information (CAdata[j][7:0], where j ranges from 0 to 2 in the embodiment shown) on each of the command/address links and to communicate write-masking information (Mdata[7:0] and thus one mask bit per byte of write data, the state of the mask bit indicating whether the corresponding write-data byte is to be written or not) on the mask link. That is, 8:1 command serialization and 1:8 command deserialization is carried out during active-mode operation in controller-side command-serializer 263 and memory-side command deserializer 333, respectively, and 8:1 mask serialization and 1:8 mask deserialization is carried out during active-mode operation in controller-side mask-serializer 265 and memory-side mask deserializer 335. In all such cases, different serialization depths (i.e., more or fewer bits per packet) may apply for any or all of the signaling links (including depth=1; effectively no serialization or deserialization at all), with generally corresponding changes in core-to-I/O clocking ratios.

Because all timing edge references are derived from a common clock signal (i.e., reference clock signal, REFCK), the various clocks within the system are mesochronous. That is, the clocks have the same frequency after accounting for any multiplication/division, but potentially different phases due to different propagation times required for the clocks to reach various points of application within the memory controller and memory device. In general, such propagation times via on-die or inter-chip conductors remain relatively constant through changes in operating temperature and voltage. By contrast, propagation times through active components, such as buffer amplifiers provided to drive internal clock lines within memory 251 controller and memory device 253 tend to be significantly influenced by environmental changes (temperature and voltage, at least) and thus yield environmentally-induced drift between the otherwise relatively steady phase relationship between the various spatially-distributed clocks.

Referring to the memory-side clocking architecture in particular, the forwarded I/O clock, "CK," is received via signal-receiver 363 and driven onto a global clock line by clock buffer 365. Because of the relatively large gain needed to drive the global clock line, clock buffer 365 tends to include multiple stages, each of which exhibits a substantial environmentally-sensitive propagation delay. The relatively high frequency of the forwarded I/O clock (i.e., the clock has the same upper spectral component as a worst-case data signal, as opposed to lower forwarded clock frequency that may apply in an on-memory-PLL embodiment) generally increases this environmental sensitivity as additional amplifier stages may be necessary to achieve the desired signal gain (i.e., gain generally rolls off with increased frequency). Consequently, the resulting buffered clock signal, referred to herein as the memory-side I/O clock, or MCK4, not only exhibits substantial phase delay relative to the incoming forwarded I/O clock, but also exhibits environmental sensitivity that may result in drift exceeding one or more unit-intervals (bit times or symbol times on the data, mask and/or command signaling links) over the temperature and voltage operating range of the memory device. Further, in contrast to alternative embodiments that may compensate for the drifting amplifier delay by including clock buffer 365 in the feedback loop of an on-memory PLL or delay-locked loop (DLL), the open-loop distribution of the amplified system clock signal (i.e., the buffered clock signal, MCK4) means that any phase drift within the clock amplifier translates directly into phase drift in the memory-side transmit and receive clocks and thus manifests as a corresponding phase drift of read data signals transmitted by memory device 253 (and required change in phase in an incoming write data signal output from memory controller 251 if such signal is to be accurately received). Finally, because the clock buffer delay (i.e., delay through element 365 and/or 363) may be on the order of several bit times and the net change in clock buffer delay between temperature and voltage corners (i.e., between minimum and maximum tolerable voltage and temperature) may easily exceed a bit time, the transmit or receive clock phase may drift across one or more bit-time boundaries into an adjacent bit time. This creates additional timing complexity as the data sampling time may be properly centered between bit boundaries (edges of the data eye), but off by an integer number of bit times. As a consequence, data otherwise correctly received may be improperly framed into parallel packets of data bits (e.g., 8-bit packets, 16-bit packets, etc.) by memory-side or controller-side deserialization circuitry.

In the embodiment of FIG. 4, timing compensation circuitry is provided in conjunction with the controller-side serializer and deserializer circuits (263, 265, 271 and 273) to compensate for the freely drifting transmit and receive clock phases within the memory-side I/O circuitry. More specifically, the timing compensation circuitry aligns the controller-side I/O timing domain with the drifting memory-side I/O timing domain on a link by link basis, compensating not only for intra-bit sampling phase error, but also bit-time misalignment that results when the memory-side phase drift crosses a bit boundary, and link-to-link packet misalignment caused by different bit-time misalignments in the various links. In effect, the timing compensation circuitry establishes a drift-tracking transmit and receive clock phase within the controller-side I/O circuitry 256 that compensates for phase drift of the receive and transmit clocks in the counterpart memory-side I/O circuitry 258, including drift across bit boundaries that might otherwise result in data serialization/deserialization errors (i.e., framing bits into packets at different bit boundaries on opposite sides of the signaling link) and domain crossing errors as packets are transferred between the clock domains of the core and I/O circuitry within either memory controller 251 or memory device 253.

In the memory system of FIG. 4, the clock phase, bit alignment and packet alignment circuitry within each of the controller-side deserializers and serializers are calibrated in one or more calibration operations. In one embodiment, initial timing calibration operations are carried out to establish reliable operation within the controller-side deserializers and then within the controller-side serializers, and thereafter a periodic (or occasional) timing calibration operation is carried out to incrementally adjust the calibration settings frequently enough to track memory-side timing drift (and more generally, system-wide timing drift). During initial and/or periodic timing calibration, the phase of the transmit/receive clock applied within a given controller-side serializer/deserializer may be calibrated first (thus compensating for intra-bit phase drift), followed by bit alignment (ensuring that the correct set of bits is framed into the parallel data entity transferred to the memory core) and then packet alignment calibration operations (aligning packets transferred between the controller core and respective controller-side serializer/deserializers to account for timing skew between respective timing links).

In the memory system of FIG. 4, calibration of the clock phase, bit alignment and packet alignment circuitry (i.e., the "drift-compensation" circuitry) within each of the controller-side deserializers and serializers is carried out based on signal transmission over the signaling link being calibrated. In one embodiment, initial calibration operations are carried out to establish reliable operation within the controller-side deserializers 273 first and then within the controller-side serializers 271. Thereafter, more limited "periodic" timing calibration operations are carried out (incrementally adjusting the calibration settings) with sufficient regularity to track timing drift.

In one embodiment, memory controller 251 issues a calibration command to memory device 253 via sideband data link SL[1] to enable transmission of one or more predetermined test-data patterns via each bi-directional signaling link (e.g., each DQ link), thereby enabling trial-and-error adjustment of phase, bit and packet alignment values applied within phase-aligning circuitry 285 and bit/packet alignment circuitry 286 within each controller-side deserializer 273. In the case of phase calibration, for example, memory controller 251 may incrementally adjust phase control value $ADJ_{RCK}$ (i.e., increment/decrement a phase-adjust bit field therein) to step an instance of the controller-side I/O clock, locally interpolated or otherwise generated within phase-aligning circuitry 285, and thus determine maximum and minimum clock phases that yield correct data reception, selecting the clock phase midway between the maximum and minimum as the calibrated receive-clock phase for the link being calibrated.

Once proper clock phase alignment has been established within the controller-side deserializers, controller-side bit alignment circuitry (i.e., included within bit/packet alignment circuitry 286) may be calibrated through memory-to-controller transmission of bit-alignment test patterns (e.g., triggered by sideband command) that enable packet boundaries to be identified. For example, memory device 253 may be instructed to transmit a sequence of packets each having a solitary '1' bit in a known or predictable position within the packet, thereby allowing bit/packet alignment circuitry 286 within a given deserializer to determine the bit offset between the actual and desired positions of the '1.' Upon determining the bit offset, memory controller 251 (e.g., calibration logic within the controller I/O circuitry 256 or controller core 252) may set a bit-alignment field within $ADJ_{RCK}$ to reposition the '1' at the desired position within the incoming packet.

After clock-phase and bit-alignment calibration within the controller-side deserializers 273, packet-alignment circuitry (also included within bit/packet alignment circuitry 286) may be calibrated within the controller-side deserializers 273 through memory-to-controller transmission of packet-alignment test patterns (e.g., triggered by sideband command) that enable identification of a particular packet among a set of packets. For example, memory controller 251 may instruct the memory device via the sideband link to transmit a sequence of distinguishable packets and then adjust respective packet-alignment values (e.g., bit fields within $ADJ_{RCK}$) for the controller-side deserializers 273 as necessary to synchronize transfer of like-valued, distinguishable packets from the controller-side deserializers 273 to the controller core 252 (i.e., such that all the like-valued packets are transferred to the controller core in response to the same core-clock edge.

After controller-side deserializers 273 have been calibrated, thus establishing reliable memory-to-controller signaling, memory controller 251 may issue another sideband command to place memory device 253 in a loopback configuration that includes the controller-side serializer (263, 265, 271) and memory side deserializer (333, 335, 357) for the link being calibrated, and a memory-side serializer 355 and corresponding controller-side deserializer 273 (which has been calibrated at this point) for a counterpart signaling link. By this operation, a round-trip path is established that includes the controller-side serializer being calibrated and a previously-calibrated (and thus known reliable) return path from memory device 253 to memory controller 251. Accordingly, the memory controller may individually calibrate the transmit clocks (e.g., locally-interpolated instances of the controller I/O clock having a phase controlled by a bit field within control value $ADJ_{TCK}$) applied within phase-alignment circuitry 275 of each controller-side serializer by comparing a test data pattern transmitted to the memory device via the signaling link under calibration with a looped-back instance of the test-data pattern received via the counterpart signaling link for each transmit phase across a pass-fail range.

After the transmit clock phases are calibrated, bit alignment circuitry within the controller-side serializers (i.e., included within bit/packet alignment circuitry 276) may be calibrated through round-trip transmission of test patterns that enable identification of packet boundaries. That is, the memory controller may evaluate a returned instance of a test pattern transmitted by a given serializer (and looped-back via a previously calibrated return path) to identify memory-side bit misalignment (i.e., bit offset between actual and desired framing of byte-sized packets output from the memory-side deserializer) and compensate for such misalignment by adjusting the bit alignment within the controller-side serializer (e.g., setting another bit field within $ADJ_{TCK}$).

Still referring to FIG. 4, power-state logic circuits 271 and 341 are provided within memory controller and memory device, respectively, to manage the transition between active-mode operation and one or more reduced-power states. In one embodiment, the controller-state logic or "controller-state logic" 271 monitors the state of a transaction queue within controller core 252, receiving a "Next" signal (NXT) for each new transaction-request advanced to the head of the queue, and issuing a Ready signal (Rdy) to notify controller core that signaling operations associated with the transaction have been completed and thus that any further transaction request may be advanced. Accordingly, if Next is not asserted following Ready-signal assertion, the controller-state logic is effectively informed that no further host memory access requests are pending and thus that the system is idle.

Figure 5:
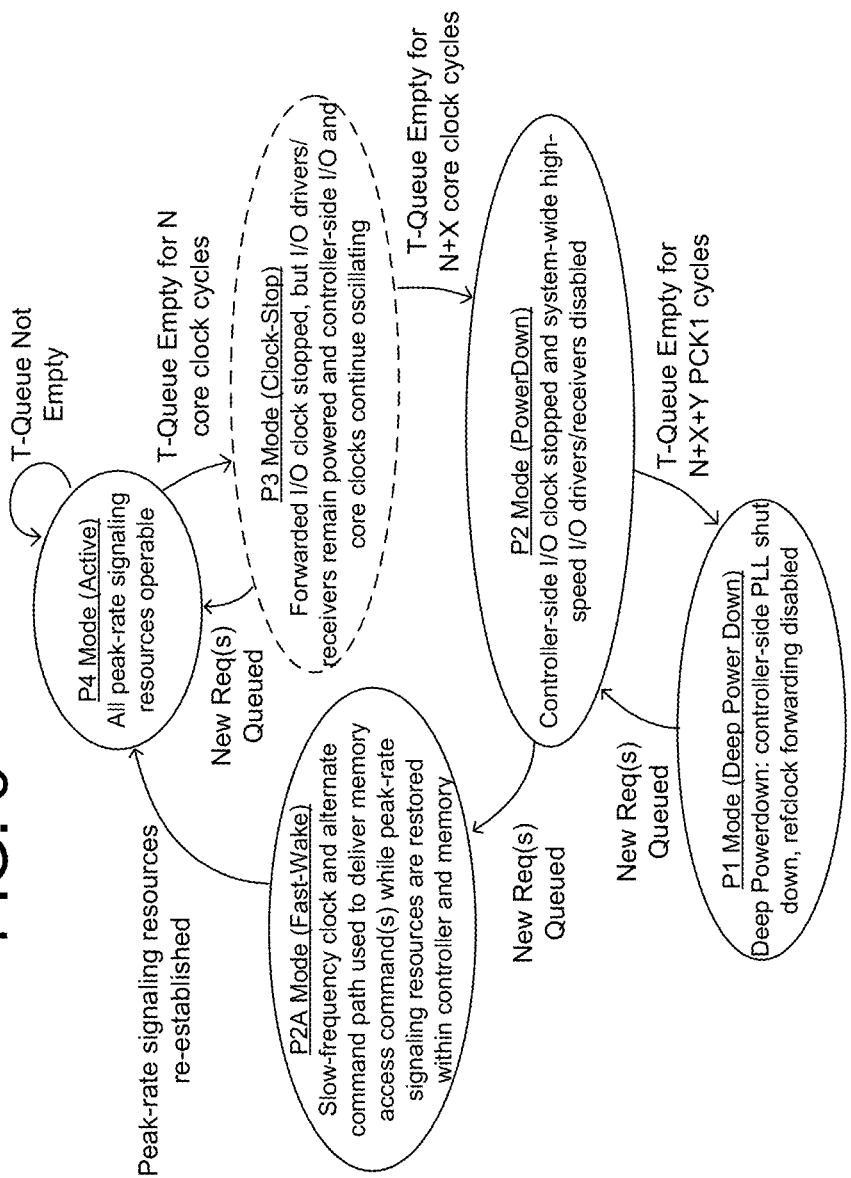
FIG. 5 illustrates an exemplary power-state diagram implemented by the controller-state logic and memory-state logic within the memory system of FIG. 4.

FIG. 5 illustrates an exemplary power-state diagram implemented by the controller-state logic 271 and counterpart memory-state logic 341 within the memory system of FIG. 4. The controller-state and memory-state logic circuits are collectively referred to herein as the system state logic. As shown, the system state logic maintains the memory system in an active ("P4") power mode (i.e., all peak-rate signaling resources operable, including all high-speed I/O timing signals and related circuitry) so long as one or more host memory requests remain in the transaction queue, but transitions the memory system through a sequence of progressively lower-power states when the system idles (i.e., transaction queue empty and thus, no Ready-signal assertion). In the embodiment shown, for example, the system state logic transitions the memory system to a "clock-stop" mode (P3) after idling for 'N' core clock cycles, then to a "powerdown" mode (P2) after idling an additional 'X' core clock cycles, and then to a "deep powerdown" mode (P1) after idling an additional 'Y' core clock cycles.

In clock-stop mode P3, the forwarded I/O clock, CK, is glitchlessly switched off (i.e., to a non-oscillating, steady state) within clock-driver circuit 310, freezing the state of all attached memory devices, even though the controller-side core-clock and controller-side I/O clock and controller-side core clock (PCK8 and PCK1) remain active. By this operation, considerable power may be saved during relatively brief idle intervals, with extremely low reduced-power exit latency (e.g., 2.5 nS or one core clock cycle). When a new transaction request is queued, the forwarded I/O clock is re-started within clock-driver 310 to enable a transition directly back to active operating mode, P4.

In powerdown mode P2, the system state logic additionally switches off the controller-side I/O clock (PCK8) and system-wide I/O signal driver/receiver circuits (i.e., controller-side signal drivers 280 and receivers 290, and memory-side signal drivers 356 and receivers 358), reducing power consumption substantially further, but at the cost of considerably longer time to restore peak-rate signaling resources. That is, even though the controller-side I/O clock itself may be switched on shortly after the start of a wake-up interval (e.g., marked by detection of Next-signal assertion), additional "wake-up" time is generally required to re-establish the precisely phased clocks derived from the controller I/O clock (e.g., receive and transmit clocks generated by interpolating between phases of the I/O clock within the controller-side serializers and deserializers) and to re-establish coordinated operation of the various clocked circuits, thus increasing the delay before peak-rate signaling is enabled. In one embodiment, for example, a "wake-up" interval of approximately 25 nS to 35 nS transpires before peak-rate signaling resources are restored (an example of the incremental latency penalty described above).

As shown in FIG. 5, instead of idling the memory system during the extended delay required to restore peak-rate signaling resources disabled in power-down mode P2, the system state logic transitions to a fast-wake mode (P2A) in which an alternative clock and alternate command path are applied to deliver one or more memory access commands to the memory device while peak-rate signaling resources are being restored. By this operation, peak-rate signaling resources are restored concurrently with transmission and execution of a memory-access command, thereby hiding the resource-restoration latency under the inherent memory-access latency and thus shortening the effective low-power-state exit latency.

Continuing with FIG. 5, in deep power-down mode (P1), the system-state logic additionally shuts down PLL 301 (i.e., within controller-side clocking circuitry 267) and may disable reference-clock forwarding within clock driver 327. When a new transaction request is queued, these resources are restored, thus transitioning the system to powerdown mode P2, followed by a transition to fast-wake mode P2a and then back to active mode P4. In alternative embodiments, more or fewer power modes (or states) may be provided, different resources may be disabled or enabled within a given power mode, and the transitional path out of or into a given mode may lead to or start from a mode different from that shown. Further, for the purposes of the fast-wake operation detailed below, the memory system of FIG. 4 is assumed to be exiting (i.e., ascending or waking from) a sleep mode corresponding to powerdown mode P2. More generally, the memory system or variants thereof may be considered to be in a "sleep" mode if any resource required for peak-rate command signaling is disabled.

Returning to FIG. 4, controller-state logic 271 communicates the system power mode to memory-state logic 341 via sideband link SL[0] (i.e., delivering power-mode signal PM via controller-side driver 329 and memory-side signal receiver 395) and the two power-state logic circuits collectively establish a given power mode within memory system 250. To establish active-mode operation, for example, controller-state logic 271 asserts clock-enable signals EnPCK1, EnPCK8 and EnCK to enable clock drivers 305, 312, and 310 to output the controller core clock (PCK1), the controller-side I/O clock (PCK8) and the forwarded I/O clock (CK), respectively. Memory-state logic 341 similarly asserts clock-enable signals EnCCK, EnMCK1, EnMCK4 and EnCK to enable clock drivers 379, 367, 365 and 363 (e.g., implemented by buffer amplifiers) to output the memory core clock (CCK), frequency-divided memory I/O clock (MCK1), bit-rate memory I/O clock (MCK4), and controller-forwarded I/O clock (CK), respectively. The controller-state logic and memory-state logic also assert respective sets of driver/receiver enable signals EnCA, EnR and EnW during active-mode operation to power various transmit and receive circuits, including controller-side command, data, and data-mask transmit circuits 280, controller-side data receive circuits 290, memory-side command, data and data-mask receive circuits 358, and memory-side data-transmit circuits 356. Further, the controller-state logic and memory-state logic deassert respective resource-select signals SelCA to select an active-mode command signaling path via controller-side multiplexers 279 and memory-side multiplexer 407. Memory-state logic 341 also lowers signal SelCCK to select, via multiplexer 371, the frequency-divided memory I/O clock, MCK1, as the active-mode memory-side core clock CCK.

During clock-stop low-power mode P3, the controller-state logic and memory-state logic deassert respective instances of clock-enable signal EnCK, thereby switching off clock drivers 310 and 363. Clock driver 310, in particular, may include logic to ensure that the clock is stopped and re-started cleanly (i.e., no shortened clock pulses) in response to assertion and deassertion of EnCK. Logic may also be included in clock driver 175 (or elsewhere within the controller-side clocking circuitry 267) to establish the clock-stop interval as an integer number of controller-side core clock cycles (e.g., starting and stopping at the same point within respective core-clock cycles). By controlling the clock-stop interval in this way, synchronization of the memory-side and controller-side core clocks is maintained when the forwarded I/O clock is re-started, thus preserving bit and packet alignment calibrations within the controller-side I/O circuitry. Memory-state logic 341 may also deassert EnMCK4 and EnMCK1 in clock-stop mode, as the clocks supplied to the corresponding clock drivers (365, 367) are stopped when the forwarded I/O clock is stopped (i.e., MCK1 being generated by divide-by-four frequency divider 225, itself clocked by the forwarded I/O clock).

Upon descending further from clock-stop mode to power-down mode (P3 to P2), controller-state logic 271 deasserts EnPCK8, thus switching off the controller-side I/O clock, PCK8, and the controller-state logic and memory-state logic deassert respective instances of driver/receiver enable signals (EnCA, EnW, EnR), thus powering down the I/O driver/receiver circuits on both sides of the high-speed signaling interface. Upon further descending from power-down mode P2 to deep powerdown mode P1, controller-state logic 271 may deassert clock-enable signal EnPCK1, thus disabling the controller-side core clock PCK1 and may also shut off PLL 301 within the controller-side clock circuitry.

While memory system 250 consumes considerably less power in clock-stop mode than in active mode, power drain may remain above an acceptable level for an extended idle interval. Accordingly, the system state logic achieves a yet lower power level, acceptable for extended idle, by disabling the controller-side I/O clock and powering off the signal drivers and receivers in powerdown mode P2. Consequently, powerdown mode P2 may be a desirable standby power state for which limited exit timing penalty is important, thus underscoring the significance of the performance improvement that fast-wake transition from power-down mode to active mode may provide.

As shown in FIG. 5, the transitions from clock-stop mode P3 to active-mode P4 and from deep power-down mode P1 to power-down mode P2 are generally effected by reversing the operations taken to descend into those power modes. Thus, when ascending from P1 to P2, PLL 301 is switched on and EnPCK1 is re-asserted to restore the controller-side core clock, PCK1. Similarly, when ascending from clock-stop mode P3 to active-mode P4, EnCK is asserted to re-start the forwarded I/O clock. The same general approach is taken when ascending (exiting) from powerdown mode P2, except that, instead of waiting idly for the peak-rate timing resources to be restored, the system state logic enables alternative signaling resources to effect fast-wake mode 2A, thus enabling transfer of one or more memory access commands concurrently with restoration of the signaling resources required for peak-rate signaling.

In the embodiment of FIG. 4, controller-state logic 271 and memory-state logic 341 cooperatively establish fast-wake operation within memory system 250 during the wake-up interval between powerdown and active operating modes, and concurrently with actions taken to restore peak-rate signaling resources. In general, the controller-state logic and memory-state logic establish the relatively low frequency, but free-running reference clock signal (REFCK) as an alternative command-transmission timing source, and commandeers data and mask signaling links to establish a temporarily widened "fast-wake" command path. More specifically, controller-state logic 271 asserts clock-enable signals EnRCK and EnRCK1 to enable clock driver 327 to forward the reference clock signal to memory device 253 (i.e., as forwarded reference clock signal, RCK, and received via receiver/driver 393) and to enable internal clock driver 315 to output an internal, controller-side instance of the reference clock signal, RCK1, to alternative "fast-wake" command/address serializers 277 coupled, via respective multiplexers 279, to output drivers 280 for the command, mask and data links. Memory-state logic 341, receiving notification of the power-state transition via sideband link SL[1], similarly asserts clock-enable signal EnRCK1 to enable internal clock driver 369 to output an internal, memory-side instance of the reference clock signal (also denoted RCK1) to alternative, fast-wake command/address deserializers 359 coupled to respective signal receivers 358 for the command, mask and data links. Memory-state logic 341 also asserts resource-select signal, SelCCK, at a control input of multiplexer 371 to select the forwarded reference clock as the memory-side core clock, CCK. By these operations, the relatively-low frequency reference clock is established as an alternative command transmission/reception timing source (i.e., alternative to the higher-frequency controller-side and memory-side I/O clocks) as well as an alternative memory-core timing source (i.e., alternative to MCK1, the frequency-divided instance of the forwarded I/O clock), thus enabling transmission and execution of memory access commands while peak-rate signaling resources are being restored.

Still referring to FIG. 4, controller-state logic 271 and memory-state logic 341 also raise respective resource-select signals, SelCA, in the transition from powerdown to fast-wake operating modes (i.e., the start of the "wake-up" interval) to select, via controller-side multiplexers 279 and memory-side multiplexer 407, an alternative command-signaling path (the "fast-wake command path") that includes the fast-wake serializers and deserializers 277 and 359, and the command, mask and data signal drivers/receivers (280, 358) coupled therebetween. The controller-state logic and memory-state logic also assert driver/receiver enable signals, EnCA and EnW (and optionally EnR) to enable fast-wake command signaling, even though peak-rate timing signals and/or other peak-rate signaling resources remain unavailable.

As shown, the fast-wake command serializers and deserializers 277, 359 are clocked by respective controller-side and memory-side instances of the reference clock and have 2:1 (and 1:2) serialization depths. Thus, the fast-wake serialization/deserialization depth is one-fourth the active-mode serialization/deserialization depths (i.e., 8:1 and 1:8) in accordance with the 4× ratio of the forwarded I/O clock frequency to the forwarded reference clock frequency. The command-bandwidth reduction that would otherwise result from the reduced clock rate is avoided (or at least mitigated), however, by the increased bit-width of the fast-wake command path relative to the active-mode command path. In the specific embodiment shown, for example, the fast-wake command path (fed by core output driver 319) includes four times as many links (12 links total, including eight data links, one mask link and three command/address links) as the active-mode command path (fed by core output driver 317), thus enabling a net fast-wake command signaling bandwidth that exactly matches the active-mode command-signaling bandwidth. Although this need not be the case, this arrangement simplifies system timing as no special command buffering or timing circuitry is required to account for different active-mode and fast-wake mode command bandwidths. In the embodiment shown, for example, double-data rate operation within the twelve fast-wake serializers 277 enable a 24-bit command/address value ("AltCAdata[2:0][7:0]") to be transmitted to the memory device per reference clock cycle (i.e., two command/address bits transmitted on each signaling link of the 12-link fast-wake command path during each cycle of the reference clock), and thus enables the controller core 252 to output a respective command/address value per core clock cycle. Similarly, double-data-rate operation within the twelve fast-wake deserializers 359 enable a 24-bit command/address value conveyed on the fast-wake command path to be deserialized and delivered in parallel form to the memory core 254 in each cycle of the memory core clock. As discussed below, command buffering logic 405 may be provided at the memory-side core interface to enforce inherent timing constraints of the memory device, thereby freeing memory controller 251 to issue commands via the fast-wake command path in rapid succession (e.g., in respective reference clock cycles) and making it possible to create a bridging gap during which memory system 250 may seamlessly transition between fast-wake and active operating modes.

Figure 6:
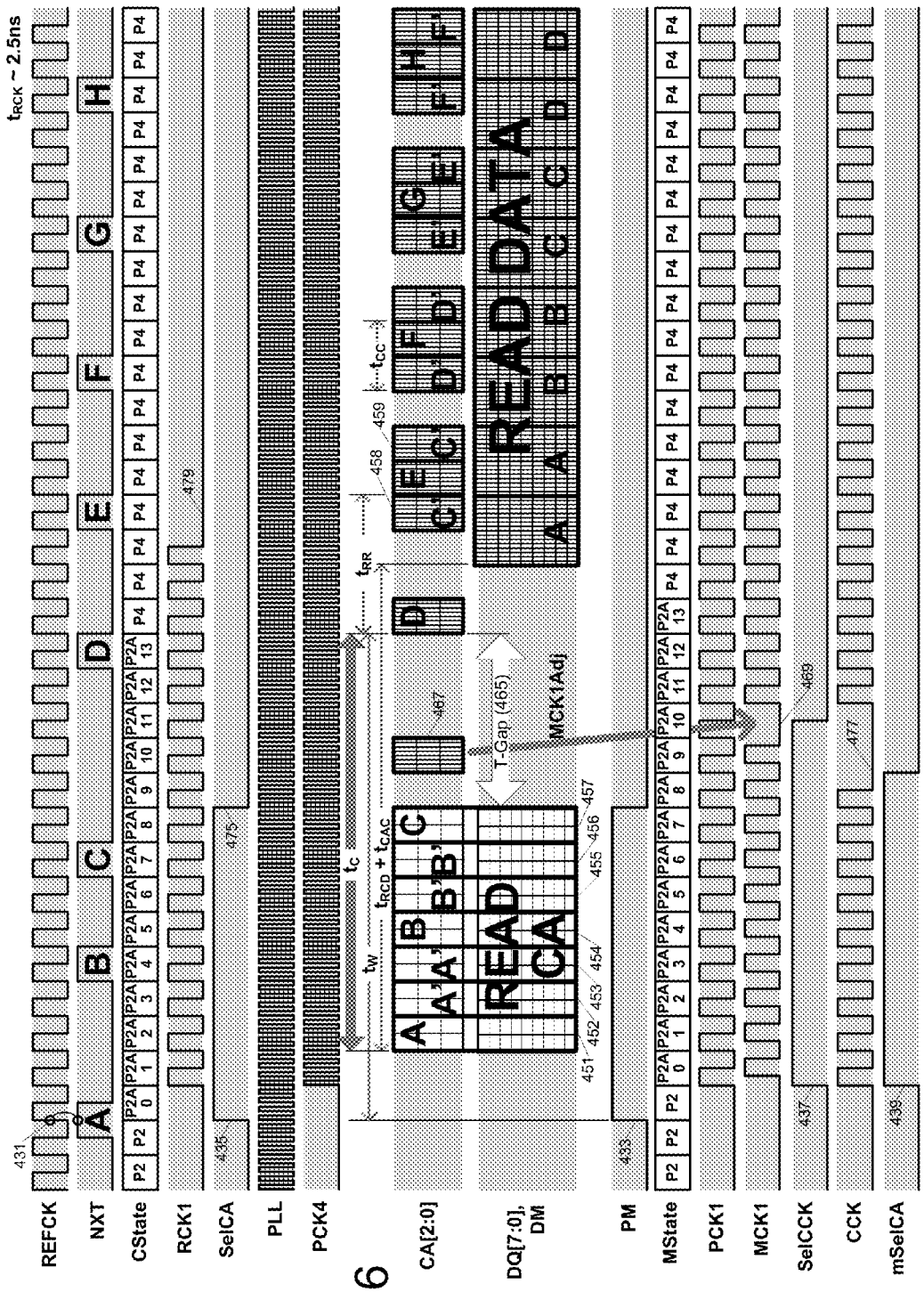
FIG. 6 is an exemplary timing diagram illustrating fast-wake operation within the memory system of FIG. 4.

FIG. 6 is an exemplary timing diagram illustrating fast-wake operation within the memory system of FIG. 4. As shown, the memory controller and memory device are initially in power-state P2 (i.e., controller state and memory state or "CState" and "MState" are both P2), but is awakened when the controller core asserts the Next signal (NXT) to indicate that one or more host requests for memory access have been received. More specifically, the Next signal is sampled by the controller-state logic in response to rising edge 431 of the reference clock signal (REFCK), which responsively raises the power-mode signal as shown at 433 to transition the memory controller from powerdown mode P2 to fast-wake mode P2A for the duration of a wakeup-interval denoted by PState cycles P2A0-P2A13. The controller-state logic also transmits the power-mode signal to the memory device via the sideband data link. At the start of fast-wake mode, the power-state logic raises resource-select signal SelCA as shown at 435 to enable memory access commands corresponding to queued host requests to be routed via the fast-wake command path. Though not specifically shown, the power-state logic also asserts clock-enable signals EnRCK and EnRCK1 to enable the reference clock signal to be forwarded via sideband link SL[0] and distributed to the fast-wake serializers as discussed above, and asserts driver-enable signals EnCA and EnW, at least, to enable the signal drivers used to effect fast-wake command signaling. Further, the controller-state logic begins operations to restore peak-rate signaling, including enabling the controller-side I/O clock driver (i.e., asserting EnPCK8 to enable clock driver 312 to output PCK8, a clock signal illustrated alternatively as PCK4 in FIG. 6) to distribute the controller-side I/O clock and thus enabling restoration of interpolated receive/transmit clock phases, bit-alignment and packet-alignment circuitry, chip-to-chip core-clock synchronization circuitry and/or other peak-rate signaling resources as necessary during the fast-wake interval. In the example shown, peak-rate signaling resources become fully operational after a wakeup interval of approximately 30 nanoseconds, and thus the memory controller and memory device transition to active power mode P4 after approximately 13 reference clock cycles, starting with peak-rate (active-mode) transmission of memory commands corresponding to host memory request "D."

The memory-state logic responds to the power-mode signal assertion 433 (i.e., transmitted on the sideband data link by the memory controller) by transitioning the power mode of the memory device (i.e., MState) from powerdown mode P2 to fast-wake mode P2A one core clock cycle later than the memory controller and similarly transitions the memory device from fast-wake mode to active mode after approximately 13 reference clock cycles. Different timing offsets between power-mode transitions in the memory controller and memory device may apply in different embodiments, depending, for example, upon the propagation delay of the power mode signal on the sideband link.

Though not specifically shown in FIG. 6, the memory-state logic raises clock-enable signal EnRCK1 to enable distribution of the forwarded reference clock signal to the fast-wake deserializers and command buffering logic (e.g., elements 359 and 405 of FIG. 4). The memory-state logic (i.e., element 341 of FIG. 4) also asserts receiver-enable signals, EnW and EnCA, to enable command reception via the fast-wake command path, and further asserts clock-enable signals EnCk, EnMCK1 and EnMCK4 to enable restoration of peak-rate signaling resources within the memory device, including enabling clock drivers for the forwarded I/O clock (CK), the corresponding memory-side I/O clock (MCK4) and the core clock derived from the forwarded I/O clock (MCK1). Further, the memory-state logic raises resource-select signal, Sel-CCK, as shown at 437 and asserts clock-enable signal EnCCK to enable the reference clock signal to clock the memory core during fast-wake mode and raises the memory-side SelCA signal (designated "mSelCA" in FIG. 6) as shown at 439 to select the fast-wake command path to deliver commands to the memory core.

As shown, the internally-driven instance of the controller-side reference clock signal, RCK1, begins toggling approximately one reference clock cycle after entering fast-wake mode (i.e., during cycle P2A$_1$) and is used to serialize a leading memory access command 451 for transmission on the fast-wake command path during the ensuing reference clock cycle (i.e., during cycle P2A2). Thus, only 5 nS after exiting a low-power mode in which peak-rate signaling resources are disabled and well before such signaling resources are restored to operability, the memory system begins transmitting memory access commands corresponding to the newly queued host request. Further, by commandeering the data and mask signals to form the widened fast-wake command path, the command bandwidth is equalized between fast-wake and active modes. Accordingly, each memory access command may be transmitted in the same number of core clock cycles in fast-wake mode as in active mode (one core clock cycle in this example), thus simplifying internal timing logic.

In the embodiment of FIG. 6, the host requests that trigger wakeup from powerdown mode are assumed to be memory read requests (generally the most time critical host request upon wakeup, as the host system is waiting for data to be returned), and each host memory read request is assumed to result in transmission of a sequence of three memory access commands, including a row activation command directed to a given storage bank and row within the memory device (i.e., specified by address bits included with the command), followed by a pair of column read commands instructing the memory device to return data from respective columns within the activated row. Thus, the host memory read request designated by NXT pulse 'A' results in fast-wake transmission of activation command A (451) followed by two column read commands A' (452 and 453), host memory read request "B" results in fast-wake transmission of activation command B (454) followed by two column read commands B' (455 and 456) and host memory read request "C" results in fast-wake transmission of activation command C (457, the final fast-wake command in this example) followed eventually by active-mode transmission of two column read commands C'. More or fewer column read commands may be issued for all or a given one of the row activation commands in alternative embodiments, and precharge or other commands may also be issued as part of the command sequence for each host-requested memory read. More generally, while the row-activation/column-read command protocol corresponds to DRAM operation, other command protocols intended for use with different core storage technologies (e.g., NAND or NOR flash memory) may apply in alternative embodiments.

In the exemplary timing diagram of FIG. 6, a burst of host memory read requests (A, B, C, . . . ) is assumed, and corresponding memory access commands 451-457 are transmitted back-to-back (i.e., without timing gap) over the fast-wake command path to deliver as many commands as possible to the memory device before switching over to active-mode command signaling. By this operation, a timing gap is opened between transmission of the final fast-wake command and the first active-mode command, thereby enabling transitional calibration operations to be completed without impeding continuous read-data return. Thus, starting after a delay $t_{RCD}$+ $t_{CAC}$ (an inherent row-to-column delay and column access delay imposed by the memory device in the example shown), and one core clock cycle after the memory device transitions to active-mode P4, the memory device begins outputting read data corresponding to the first column read request A' (152), and continuously outputs data thereafter corresponding to subsequent memory access requests, including the second column read request A' (153), and then row activations and column read requests corresponding to host memory read requests B, C, D and so forth. Further, as shown, the memory access latency associated with the lead command sequence 451-453 (marked "$t_{RCD}$+$t_{CAC}$" in FIG. 6) overlaps wake-up interval $t_W$ (i.e., the interval over which peak-rate signaling resources are restored) during concurrency interval, $t_C$, effectively hiding the peak-rate restoration effort (and latency associated therewith) under the inherent memory access latency. Accordingly, the net effect is to dramatically accelerate the time at which data is output following exit from powerdown mode P2, and thus effectively reduce the wakeup latency.

As mentioned, the back-to-back (gapless) command signaling during fast-wake mode creates a timing gap 465 that enables transitional timing synchronization operations to be completed without data transmission discontinuity. In one embodiment, for example, the active-mode memory core clock, MCK1, may be out of bit-synchronism with counterpart controller-side core clock, PCK1, upon exit from the powerdown state so that a calibration operation is performed to adjust the MCK1 phase as necessary. In the particular embodiment shown in FIG. 6, peak-rate clocks become available shortly after the start of timing gap 465 (though resources clocked by those peak-rate clock signals, such as the frequency divider (225) that generates MCK1, may require adjustment before all peak-rate signaling resources are fully restored), thus enabling the memory controller to issue a core-clock calibration packet 467 over the active-mode command path at the I/O clock rate. The memory-state logic receives and evaluates the core-clock calibration packet 467 (or at least part of the packet) to determine any bitwise misalignment between MCK1 and controller-side core clock and sets a calibration value, MCK1Adj, accordingly to restore the desired core-clock alignment. Thereafter, MCK1 is bit-wise aligned to the controller core clock and thus available for use as the active-mode core clock upon switchover from fast-wake to active-mode operation.

In one embodiment, core-clock calibration packet 467 includes a logic '1' bit in a predetermined location within at least one "test packet" of the three eight-bit packets transmitted on respective CA links (e.g., CA[0][7:0]), and the memory-state logic evaluates the test packet to determine any bitwise offset between the bit and the packet-boundary indicated by MCK1, setting MCK1Adj to advance MCK1 by the number of forwarded I/O clock edges necessary to effect the desired alignment. This adjustment is exemplified in FIG. 6 by the extended low interval (469) within the MCK1 waveform. Note that the core-clock alignment operation (also referred to herein as the MCK1 adjustment operation) may be carried out concurrently with restoration of other resources required to enable peak-rate command and/or data signaling.

Still referring to FIG. 6, the gapless transmission of memory access commands during fast-wake mode effectively relegates enforcement of memory access timing constraints (e.g., $t_{RCD}$, $t_{CAC}$, $t_{RR}$ and/or $t_{CC}$ in a DRAM) to the memory device, a timing enforcement carried out by command buffering logic 405 of FIG. 4. In one embodiment, for example, the command buffering logic 405 expects to receive a sequence of memory access commands according to the pattern shown (A, A', A', B, B', B', C) and thus assumes that delivery of the first column read command A' (452) to the memory core is to be delayed relative to delivery of the preceding row activation command A (451) to the memory core by a period equal to $t_{RCD}$-$t_{RCK}$. The command buffering logic 405 further assumes that delivery of second column read command 453 is to be delayed relative to delivery of row activation command 451 by a period equal to $t_{RCD}$+$t_{CC}$− 2tRCK (or $t_{RCD}$ in this example), that delivery of the second row activation command 454 (i.e., command B) is to be delayed relative to delivery of row activation command 451 by a period equal to $t_{RR}$−3$t_{RCK}$ (or $t_{RCK}$ in this example) and so forth. As discussed in further detail below, the specific delay intervals that may apply for a given memory device (i.e., in accordance with device specific timing constraints) and/or memory core technology may be programmed within volatile or non-volatile configuration registers of the memory device during device or system manufacture, or during system runtime (e.g., as part of initial memory system setup and configuration). Also, the delays may be defined (and programmed) relative to various different events including the power-mode transition (e.g., from P2 to P2A), delivery of a given command to the memory core and/or delivery of the immediately preceding command to the memory core. In the later cases, command decode logic within the memory core may signal the buffering circuitry with respect to the expected delay based on the type of command received.

Concluding with FIG. 6, the controller-state logic lowers the power-mode signal at 475 to signal the memory device that fast-wake command transmission has been completed and that final operations in preparation for transition to active mode are to be completed via transmission on the active-mode command path (e.g., transmission of the test packet used to align the memory-side and controller-side core-clocks). Accordingly, the memory-state logic lowers the memory-side SelCA signal in time to enable reception of the core-clock alignment test pattern via the active-mode command path (with test-packet reception timed by the memory I/O clock, MCK4), and lowers SelCCK a predetermined number of clocks after receipt of the lowered power-mode signal to select the now-calibrated MCK1 as the memory-side core clock. Note that the clock-stop interval 477 shown in the memory-side core-clock signal results from deassertion of EnCCK in response to the reference clock signal edge (i.e., falling edge) that succeeds the power-mode signal deassertion. EnCCK is re-asserted when SelCCK is lowered, thus enabling MCK1 to be output as the memory-side core clock. As shown at 479, reference clock forwarding may be disabled by the controller-state logic shortly after transitioning from fast-wake mode to active mode.

Figure 7A:
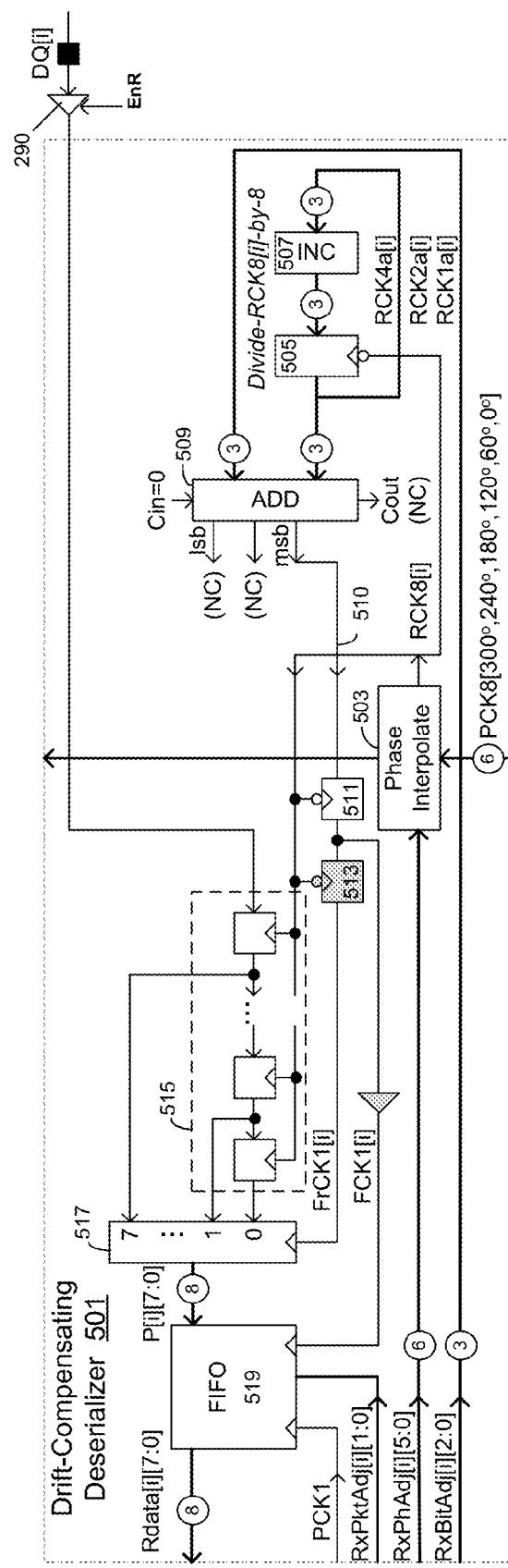
FIGS. 7A and 7B illustrate an embodiment and timing diagram of a drift-compensating deserializer that may be used to implement controller-side deserializers depicted in FIG. 4.
Figure 7B:
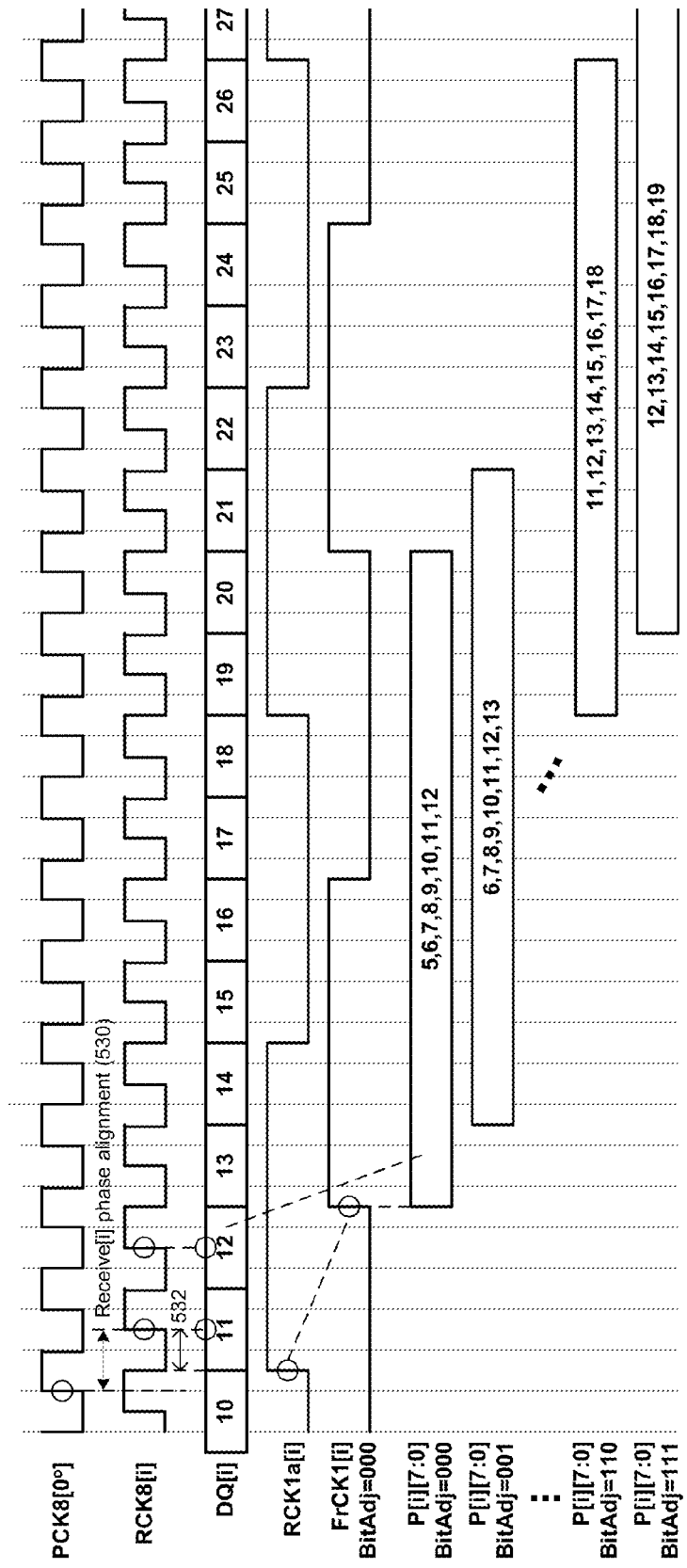

FIGS. 7A and 7B illustrate an embodiment and timing diagram of a drift-compensating deserializer 501 that may be used to implement any of the controller-side deserializers 273 shown in FIG. 4. Accordingly, each input signal and output signal dedicated to a given one of the eight deserializers 273 referenced in FIG. 4 is depicted by an index "[i]" in FIGS. 7A, 7B to indicate that separate instances of the same signals are input to or output from the other seven deserializers (i.e., i=0, 1, 2, . . . , 7). Thus, deserializer 501 is coupled to data link DQ[i] to receive a serial data signal via signal-receiver 290 and outputs an 8-bit wide read-data packet, Rdata[i][7:0], to the controller core. As shown, signal receiver 290 may be enabled and disabled by assertion and deassertion of resource-enable signal, EnR, as discussed above.

Deserializer 501 additionally receives a 6-bit phase-adjust signal RxPhAdj[i][5:0], a 3-bit bit-adjust signal RxBitAdj[i][2:0] and a two bit packet-adjust signal RxPktAdj[i][2:0], each of which may be included within a respective instance of the $ADJ_{RCK}$ value shown in FIG. 4. Deserializer 501 also receives, along with all other deserializers, the controller core clock, PCK1, and the multi-phase controller I/O clock, PCK8. In the embodiment shown, the controller I/O clock is generated by a three-stage ring oscillator (e.g., within PLL 301 of FIG. 4), and thus outputs a set of three differential clock signals that are phase distributed within the PCK8 cycle time. In other words, in the embodiment of FIG. 7A, the controller I/O clock includes clock phases of 0°, 120° and 240° and their complements of 180°, 300° and 60°, thus providing a set of six clock phases from which a phase-shifted receive clock, RCK8[i], having any phase offset (i.e., clock phase or phase angle) within a PCK8 cycle may be synthesized. In one implementation, for example, phase interpolator 503 responds to the most significant three bits (MSBs) of the six-bit phase adjust value by selecting one of six possible pairs of phase-adjacent clock phases (i.e., 0°/60°, 60°/120°, 120°/180°, 180°/240°, 240°/300° or) 300°/0° and by interpolating (or mixing) between the selected clock-phase pair in response to the least significant three bits of the phase adjust value, thus providing a 60°/8 or 7.5° phase step (or resolution) with each increment or decrement of the phase adjust value. More or fewer clock phases may be provided in alternative embodiments (with corresponding change in number of phase selection bits as necessary to meet the number of selectable clock-phase pairs), and/or finer or coarser phase interpolation may be provided. Also, phase interpolator 503 may itself be implemented by any type of phase shift circuitry including, for example and without limitation, amplifiers having inputs coupled respectively to receive the MSB-selected phase vectors, outputs tied in common and respective drive strengths controlled by complementary instances of the least-significant three-bits of phase adjust value. More generally, any type of circuitry capable of providing a selectable phase offset relative to the controller I/O clock, PCK8, may be used in alternative embodiments. Also, Phase interpolator 503 may include circuitry to enable the interpolated clock RCK8[i] to be glitchlessly stopped and re-started (i.e., no shortened (runt) pulses or invalid logic levels) when the controller-side I/O clock, PCK8, is stopped and re-started. As an example, in some embodiments, glitch-free starting and stopping of the interpolated clock is enabled by distribution of an extra pair of one-cycle-delayed copies of the PCK8[0°] and PCK8[180°] waveforms to the interpolator circuitry. Similar arrangements may be used to ensure glitch-free starting and stopping of the controller-side transmit clock phases discussed in reference to FIG. 7C below.

As discussed, the receive clock phase may initially be calibrated by stepping the phase adjust value through a range of values (or through a binary or other search pattern) to distinguish resulting clock phases that yield error-free data reception from those that yield bit errors (i.e., passing clock phases from failing clock phase). In one embodiment, for example, clock phases that lie on the pass/fail boundaries (i.e., adjacent clock phases that respectively yield error-free reception and bit error) on opening and closing sides of a data eye (or on closing side of one data eye and the opening side of a subsequent data eye) are identified, and the phase centered between those boundaries selected as the calibrated receive clock, RCK8[i]. Thereafter, the receive clock phase may be periodically (or occasionally) adjusted to account for memory-side (or system-wide) phase drift by re-testing the boundary phases to confirm that they yield the same passing (or failing) results, and incrementing or decrementing the phase-adjust value for the final receive clock phase to counteract any drift indicated by a change in the pass/fail boundary.

Flop stages (or latches) 515 form an 8-bit shift register which is serially loaded in response to transitions of the receive clock signal, RCK8[i]. A framing clock signal, FrCK1[i] cycles once for every eight cycles of the receive clock signal, and is used to transfer the contents of the shift register in parallel into a parallel-output register 517, thereby effecting a 1:8 serial-to-parallel conversion. Bit alignment circuitry, including modulo-8 counter (formed by 3-bit-wide register 505 and increment logic 507) to count negative-going edges of the receive clock (RCK8[i]) and an adder circuit 509 which adds the three-bit bit-adjustment value (RxBitAdj[2:0]) to the three-bit modulo-8 counter output, provides selectable control over the alignment between the receive clock signal and the framing clock signal. More specifically, if the bit-adjustment value is zero (i.e., RxBitAdj[i][2:0]=000b, 'b' designating binary), then each time the counter value transitions from three to four (011b to 100b), the MSB of the adder output (510) goes high and triggers, two receive-clock cycles later (owing to flop stages 511 and 513), a corresponding high-going edge of the framing clock (FrCK1[i]) signal to load the contents of the parallel-output register. Each increment of the bit-adjust signal causes the adder MSB (and therefore FrCK1[i]) to go high one bit-time earlier, thus enabling alignment of FrCK1[i] (or the high-going transition thereof) with the falling edge of any one of every eight RCK8[i] cycles and thus allowing serial-to-parallel framing to be shifted to any of the eight possible packet-framing boundaries within the incoming serial bit stream. In the embodiment shown, each rising edge of FrCK1[i] is aligned with a falling edge of the RCK8[i] signal, so that transfer to the parallel register occurs a half-RCK8[i] cycle after the shift register has been loaded with a new 8-bit packet (and a half RCK8[i] cycle before the first bit of the subsequent packet is loaded into the shift register).

FIG. 7B illustrates the timing arrangement described above, starting with the multi-phase controller I/O clock, PCK8, (of which only the 0° clock phase is shown) and an instance of the phase-shifted receive clock, RCK8[i], having an arbitrary phase offset 530 with respect to PCK8[0°] and an exemplary phase offset 532 to effect quadrature (i.e., bit-time-centered) alignment with the incoming data waveform on line DQ[i]. The most-significant-bit output of the modulo-8 counter (i.e., RCK1a[i]) cycles once every eight cycles of the receive clock signal and transitions in alignment with a falling receive-clock edge. As discussed, the framing clock FrCK1[i] transitions N+2 receive-clock cycles after the counter output (due to serially-coupled flop stages 511, 513) where N ranges from 0 to 7, according to the value of the bit adjustment value, RxBitAdj[i][2:0]. Thus, if the bit adjustment value is zero (000b), the framing clock signal transitions two cycles after the raw counter output and, in the figure shown, a half-cycle after data bit 12 (arbitrarily numbered) is loaded into the back end of the shift register. Accordingly, with RxBitAdj[i][2:0]=000b, eight bits, numbered 5-12, are transferred in parallel from the shift register flops 515 to the parallel-output register 517, framing those bits as a packet on the starting and ending bit boundaries between bits 4 and 5, and 12 and 13, respectively. Continuing the example, if RxBitAdj=1 (001b), bits 6-13 are framed into a packet, if RxBitAdj=2 (010b), bits 7-14 are framed into a packet, and so forth to BitAdj=7 (111b), in which case bits 12-19 are framed into a packet.

Still referring to FIGS. 7A and 7B, it can be seen that the core clock and framing clock have an arbitrary phase relative to one another due to the intra-bit phase offset between the receive clock and controller I/O clock and the bit-wise offset achieved by adding some number (zero to seven) of whole receive clock cycles to the base framing clock phase (RCK1$a$ [i]). Consequently, data transfer from drift-compensating deserializer 501 to the controller core involves a clock domain crossing from the framing clock domain to controller core clock domain. This transfer is complicated further by the potentially different framing clock domains that may exist within each of the eight drift-compensating deserializers. Moreover, if the memory controller (or multiple same-die or separate-die memory controllers sharing the same clock generation circuitry) is communicating with two or more memory devices, the data-timing variability may become even larger than the worst-case for a single memory device. Thus, in addition to the phase-adjust circuit for intra-bit sampling phase adjustment and the bit-alignment circuitry to control the packet-framing boundary, a packet-alignment circuit is provided to align the collective set of packets received via respective data links for simultaneous transfer into the controller core domain. That is, even though eight packets are transferred in alignment from the memory core to the memory-side I/O circuitry, phase differences between the various data links may result in time-staggered arrival of the packets at the memory controller and, consequently, framing of the packets at different bit-offsets relative to one another (and relative to the controller core clock, MCK1). As a result, one or more of the originally-aligned packets may be available relative to a latching edge of the controller core clock (PCK1) before others meaning that, absent a mechanism for delaying transfer of the sooner-arriving packets for alignment with the later-arriving (more-latent) packets, the constituent packets of the original multi-packet memory word retrieved from the memory core (e.g., 8-byte value in this example) may be temporally dispersed among two or more memory words upon transfer to the controller core (i.e., the memory-side timing relationship between the constituent packets may be lost).

Accordingly, in one embodiment, circuitry for ensuring that the memory-core packet alignment is maintained (or restored) in the packet transfer from the controller I/O circuitry to the controller core. In the embodiment of FIG. 7A, for example, such packet alignment circuitry is implemented by a packet-wide first-in-first-out (FIFO) buffer 519 that is loaded by the framing clock (or a one-bit-time-advanced version thereof referred to as the FIFO clock, FCK1[$i$]), unloaded by the controller core clock, PCK1, and deep enough to hold a number of packets equal to the integer number of core clock cycles spanned by the interval between the most latent and least-latent packet-framing times under worst-case timing conditions. In the embodiment shown, the worst-case latency difference between the most latent and least latent packet-framing times is assumed to be four core clock cycles. Accordingly, a two-bit packet-alignment value, RxPktAdj[$i$][2:0] is provided to delay output of the framed packet P[$i$][7:0] by zero, one, two or three core clock cycles, as necessary to align packets output from all drift-compensating deserializers.

Figure 7C:
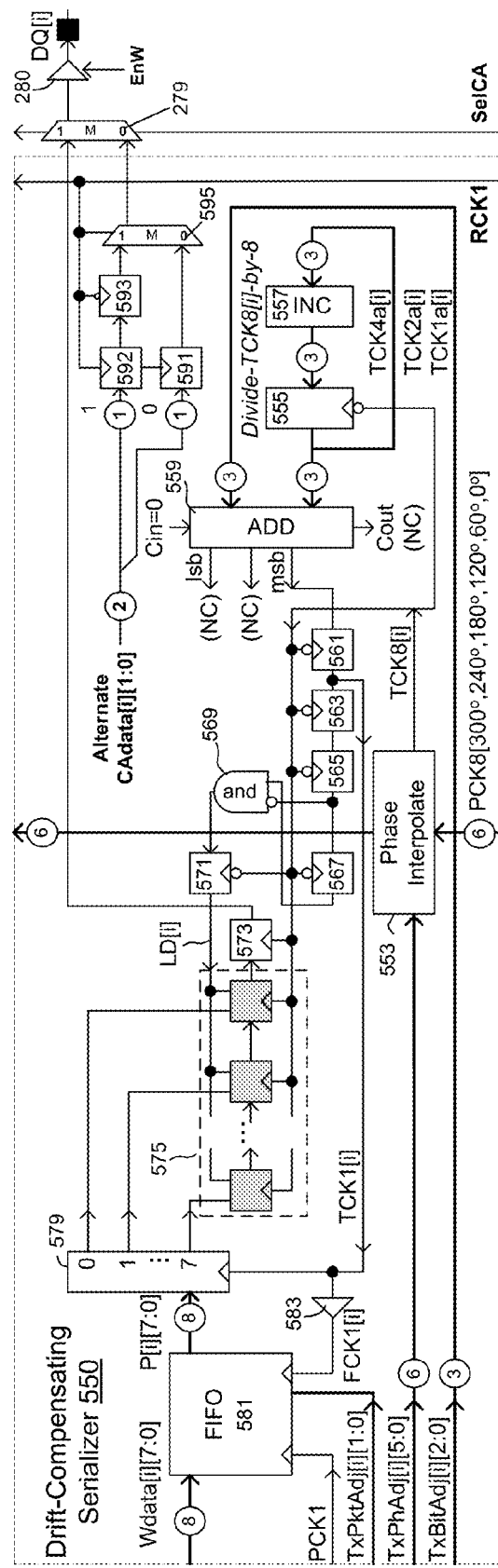
FIGS. 7C and 7D illustrate an embodiment and timing diagram of a drift-compensating serializer that may be used to implement controller-side serializers depicted in FIG. 4.
Figure 7D:
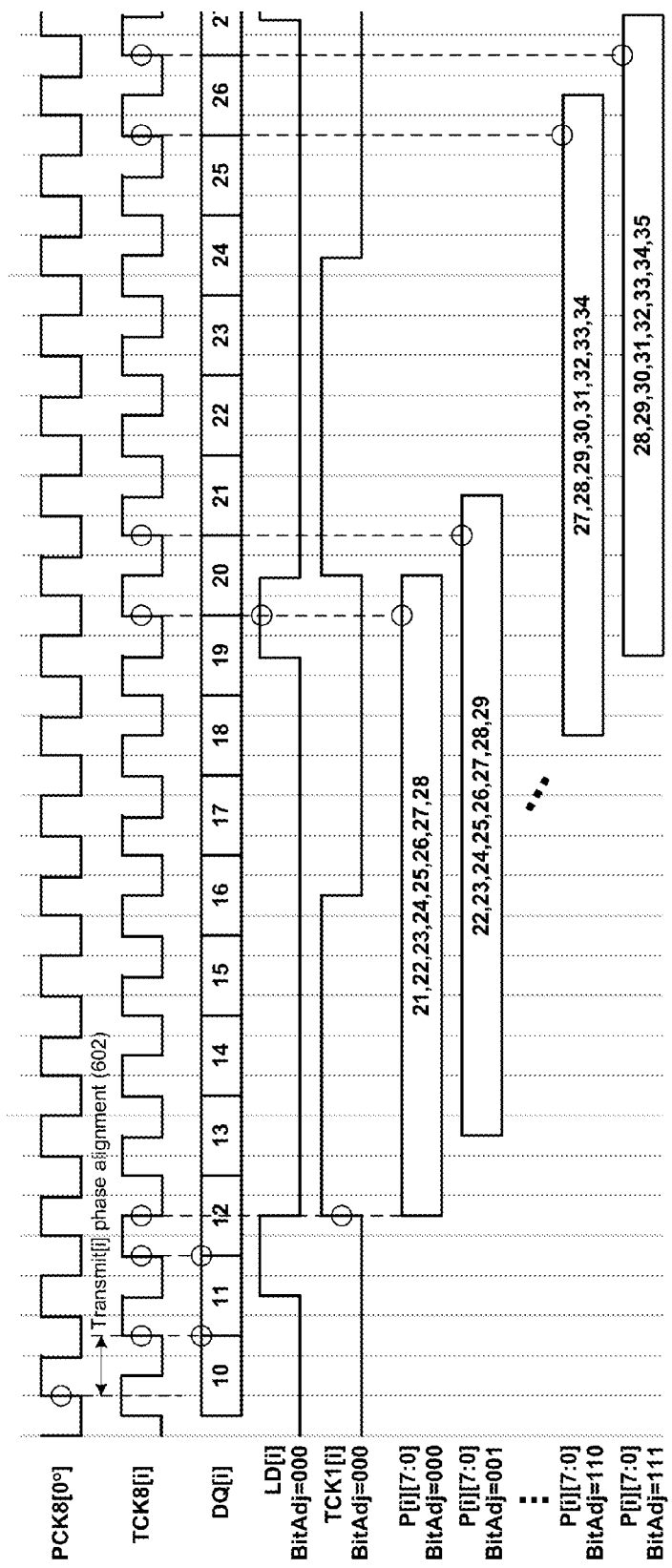

FIGS. 7C and 7D illustrate an embodiment and timing diagram of a drift-compensating serializer 550 that may be used to implement any of the controller-side serializers shown in FIG. 4 (i.e., command serializers 263, mask serializer 265, data serializers 273), and is shown in particular in the context of data serializers 273. Accordingly, each input signal and output signal dedicated to a given one of the eight data serializers 273 referenced in FIG. 4 is depicted by an index "[$i$]" in FIGS. 7C, 7D to indicate that separate instances of the same signals are input to or output from the other seven data serializers (i.e., i=0, 1, 2, ..., 7). Thus, serializer 550 is coupled to output a serial data signal onto data link DQ[$i$] (i.e., via path multiplexer 279 and signal-driver 280) and is coupled to receive an 8-bit wide write-data packet, Wdata[$i$][7:0], from the controller core. Command and mask serializers are similarly coupled to command and mask links, respectively, and receive 8-bit wide command packets and mask packets for serial output onto respective signaling links.

Like the drift-compensating deserializer of FIG. 7A, drift-compensating serializer 550 includes circuitry to perform packet alignment, bit alignment and intra-bit timing phase adjustment, all in the reverse order relative to the deserializer. In effect, the drift-compensating serializer pre-skews the packets of each signaling link (packet-alignment) relative to one another, the bits of each packet (bit-alignment) and the intra-bit phase of the data-rate transmit clock signal to align the data transmission for each link, thereby enabling the counterpart memory-side receive circuit to sample each bit at a desired intra-bit instant, frame each group of bits into a packets in accordance with the packet-framing intended by the memory controller, and transfer all packets that form part of the same multi-packet data word into the memory core domain in synchrony, all without requiring any phase memory-side timing compensation circuitry. Accordingly, a packet-alignment FIFO 581 is loaded with a sequence of write data packets (Wdata[$i$][7:0] and thus each an 8-bit packet in this example) in response to the controller core clock (PCK1) and unloaded (i.e., packet popped from head of FIFO or queue) into parallel register 579 in response to a buffer-delayed instance (FCK1[$i$]) of a de-framing clock signal (TCK1[$i$]), thereby allowing packets from the same multi-packet word from the controller-core to be loaded into the controller I/O domain at different times as necessary to compensate for controller-core-to-memory-core propagation time differences over the different links. The contents of the parallel register 579 are loaded into a serial-output shift register 575 in response to the de-framing clock signal TCK1[$i$] which is generated in the same manner as the framing clock signal FrCK1[$i$] within the deserializer of FIG. 7A. That is, the de-framing clock signal is generated by dividing a bit-rate transmit clock signal TCK8[$i$] by eight in modulo-8 counter (formed by register 555 and increment logic 557), and adding a 3-bit bit adjustment value to the counter output in adder 559, thereby enabling the output of the modulo-8 counter to be offset by a value that ranges from 0 to 7 and thus enabling de-framing to occur on any of the eight possible bit boundaries. The MSB of the adder output, which cycles once every eight cycles of TCK8[$i$], after synchronization with a negative going edge of the transmit clock, TCK8[$i$] in flop stage 561, forms the de-framing clock, TCK1[$i$]. The de-framing clock is shifted through a sequence of three of negative-TCK8[$i$]-edge-triggered flip-flops (563, 565, 567), with the outputs of the final two flop stages (565, 567) being supplied to inverting and non-inverting inputs of AND gate 569 to generate a single-TCK8[$i$]-cycle load pulse, LD[$i$], once per de-framing clock cycle. The load pulse is re-timed to a falling edge of TCK8[$i$] in flop 571 and supplied to load-enable inputs of the flop stages within serial-out shift register 575 so that, when the load pulse goes high, the contents of parallel register 579 are loaded into serial-out shift register 575 and, half a TCK8[i] cycle later (owing to negative-edge-triggered flop stage 571), are shifted bit by bit into output flop 573 and driven onto the DQ[i] link.

As in the deserializer of FIG. 7A, serializer 550 includes an interpolator 553 (or other clock-phase shifter) to enable a calibrated intra-bit (or intra-cycle) phase offset between the transmit clock signal TCK8[i] and the controller I/O clock, PCK8. Various different calibration operations may be applied to establish and adjust this drift-tracking phase offset, including the trial-and error calibration operations discussed above. As discussed in reference to the drift-compensating deserializer of FIG. 7A, in some embodiments, glitch-free starting and stopping of the interpolated clock, TCK8[i], is enabled by distribution of an extra pair of one-cycle-delayed copies of the PCK8[0°] and PCK8[180°] waveforms to the interpolator circuitry 364, though alternative techniques may be used to ensure glitch-free stop/start operation.

FIG. 7D illustrates the timing relationship between the various clock, control and data signals described above. More specifically, the arbitrary phase relationship between the PCK8 and TCK8[i] domains is shown at 602 (note that only the 0° clock phase of the multi-phase PCK8 clock signal is shown), along with the timing of the load pulse, LD[i] and its dependence on the bit adjust signal, TxBitAdj[i][2:0], to de-frame a given packet of data for transmission at incrementally bit-shifted positions within the serial output stream. More specifically, the packet of data within the parallel register is transferred to the serial-out register at different de-framing intervals in accordance with bit adjustment value TxBitAdj[i][2:0], thus enabling the packet boundary to be bit-wise shifted within the outgoing serial bitstream. That is, if the bit adjustment value is zero (TxBitAdj[i]=0, or 000b), the packet of data within parallel register 579 is loaded into the serial-out shift register 575 at the end of the transmission of bit 19 (an arbitrarily assigned number), and then transmitted as bits 21-28. If TxBitAdj[i]=1, the packet is loaded into the serial-out shift register one bit time later, at the end of the transmission of bit 20, and then transmitted as bits 22-29. Continuing, if TxBitAdj[i]=2, 3, 4, . . . , 7, the packet from the parallel register is loaded into the serial-out shift register a corresponding number of bit-times later than if TxBitAdj[i]=0 (i.e., 2, 3, 4, . . . , or 7 bit times later), and then transmitted a corresponding number of bit-times later as bits 23-30, 24-31, 25-32, . . . , or 28-35 within the serial bitstream.

Returning to FIG. 7C, drift compensating serializer 550 additionally includes register elements 591 and 592 coupled to store respective bits of fast-wake command data (i.e., received via the alternative core-to-I/O command/address path driven by internal fast-wake command signal driver 319 of FIG. 4) during fast wake mode. As shown, the register elements store the command bit pair in response to a rising edge of the internally driven reference clock signal, RCK1, with even bit '0' being selected for transmission on the DQ link (or command link or DM link as the case may be) via multiplexer 595 during the even (i.e., logic high) phase of RCK1, and odd bit '1' being registered within flop 593 in the falling edge transition of RCK1 that marks the end of the even-bit transmission interval, and then selected for transmission via multiplexer 595 during the ensuing odd (logic low) phase of RCK1. By this operation, two bits of a fast-wake memory access command may be output onto the external signaling link one after another starting at respective rising and falling edges of RCK1 (i.e., at double-data rate with respect to RCK1), and thus a complete 24-bit command may be transmitted via the 12-link fast-wake command path shown in FIG. 4 during each RCK1 cycle. After all fast-wake mode commands have been transferred, resource-select signal SelCA may be lowered to enable path multiplexer 279 to select the active-mode signal source (i.e., output from register 573) instead of the fast-wake-mode signal source (output of multiplexer 595) as the source of information transmitted onto the external signaling link. Also, as shown, signal driver 280 may be enabled and disabled by assertion and deassertion of resource-enable signal EnW (or EnCA for a signal driver coupled to a command signaling link) as discussed above.

In an alternative embodiment, the fast-wake command/address information may be serialized via the same serialization circuitry used during active-mode operation (i.e., FIFO buffer 581, parallel register 579, shift register 575 and output element 573), except operating at a reduced clock rate. More specifically, in an embodiment that uses a unified clocking architecture (e.g., as described in reference to embodiment 180 of FIG. 2), the active-mode serializing circuitry may be operated in "partial fill" mode, with only two valid bits of command/address information being included in each packet and the remaining six bits loaded with '0' or other placeholder ("dummy") data. Further, upon gear shifting to the reference clock rate, the controller core may distribute a two-bit portion of each 24-bit command to a respective one of the twelve serializers (263, 265, 273) shown in FIG. 4, with each serializer shifting out a total of two bits during a given command-transmission interval.

Figure 8A:
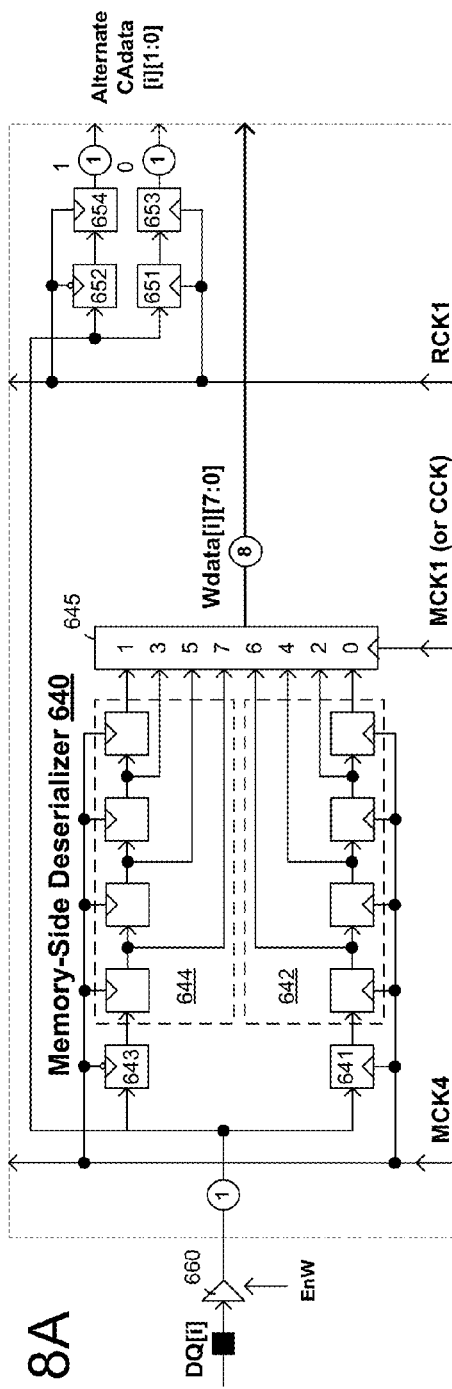
FIGS. 8A and 8B illustrate embodiments of deserializer and serializer circuits, respectively, that may be used to implement memory-side deserializer and serializer circuits depicted in FIG. 4.
Figure 8B:
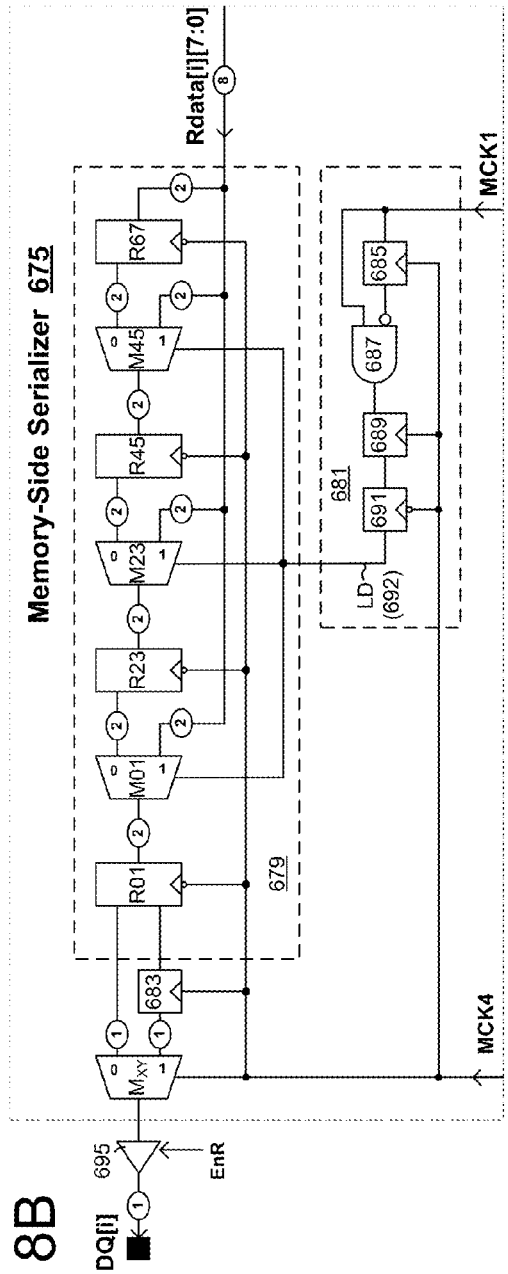

FIGS. 8A and 8B illustrate embodiments of deserializer and serializer circuits, 640 and 675 respectively, that may be used to implement any of the deserializer and serializer circuits within the memory device of FIG. 4. As shown, the active-mode memory core clock, MCK1, may be used as the packet-framing and de-framing clock during active-mode operation without adjustment, and no other phase-adjustment or bit-adjustment circuitry need be provided. Also, because the memory I/O clock MCK4 signal oscillates at half the data-rate, both rising and falling edges of MCK4 (or rising edges of MCK4 and falling edges of complementary clock, /MCK4 (or vice-versa)) may be used to time active-mode data transmission and reception within the memory-side serializer and deserializer circuits, thus effecting data-rate timing.

During active-mode operation of the memory device, deserializer 640 receives a bit-serial write-data signal via signal receiver 660. As discussed, the signal receiver may be enabled and disabled in different power modes through assertion and deassertion of resource-enable signal, EnW. Also, the incoming signal may alternatively convey command/address information, mask information, calibration information, programming information and so forth, depending on the external signaling link to which the deserializer is coupled and the operating mode of the memory system.

Continuing with active-mode operation, data conveyed in the incoming signal is clocked alternately into even-data flop 641 and odd-data flop 643 in response to rising and falling edges, respectively, of the memory-side I/O clock, MCK4. Thereafter, data captured within the even-data and odd-data flops are shifted together into even-data shift register 642 and odd-data shift register 644, with each shift register having, in this 8-bit packet example, four flop stages. Once every four cycles of the MCK4 signal, after the even and odd shift registers have been loaded with a complete packet of data, a rising edge of MCK1 is used to latch the packet of data (available in parallel at the outputs of the shift registers 402, 404) within parallel-out packet register 645, thus effecting transfer of the packet to the memory core domain interface as write data Wdata[i][7:0]. As explained, the packetized data may alternatively include command information, mask information, programming data, calibration data, etc., depending upon the operating mode of the memory device and signaling link to which deserializer 640 is coupled.

When the memory device is operated in fast-wake mode, successive even and odd bits of fast-wake command information conveyed in the incoming signal are clocked into storage elements 651 and 652, respectively, in response to respective rising and falling edges of clock signal, RCK1 (the internally driven instance of the forwarded reference clock signal). The parallelized bit pair within registers 651, 652 may then be transferred to another register stage formed by registers 653 and 654 (and thus synchronized) in response to a subsequent rising edge of RCK1, thus delivering two bits of a 24-bit fast-wake command (i.e., bit pair "Alternate CAdata[i][1:0]" of overall fast-wake command Alternate CAdata[11:0][1:0]) to the command buffering logic described above. Note that registers 653 and 654 may alternatively form part of a 24-bit register within the command buffering logic thus avoiding an additional register stage between parallelizing registers (651, 652) and the command buffering logic.

In a system that employs the unified clocking architecture shown at 180 of FIG. 2, the forwarded I/O clock may be routed onto the RCK1 input (thus enabling deserializer 640 to be implemented as shown), or the active-mode circuitry may be operated at a reduced rate in response to the reduced-frequency I/O clock signal. In the latter case, flops (or registers) 651-654 may be omitted, and the rising and falling edges of the reduced-frequency I/O clock used to clock two bits of data into registers 641 and 643 in each core clock cycle (i.e., the incoming reduced-frequency I/O clock being selected as the memory core clock) and then into the leading flop stages of shift registers 642 and 644. Accordingly, only two fast-wake command bits are captured within packet register 645 at a given core clock edge (i.e., in bit positions 0 and 1), with the other six bits of data being unused. Accordingly, two bits of each of the twelve packets output by respective memory-side deserializers may be supplied to the fast-wake command-buffering logic (e.g., element 405 of FIG. 4) to form the 24-bit fast-wake command delivered during a given memory core cycle, with those same bits being routed to the memory core via active-mode command and data paths (according to the serializer from which they are output) as part of active-mode commands or write data (i.e., according to the deserializer from which they are output).

In the exemplary serializer 675 of FIG. 8B, an eight-bit read data packet, Rdata[i][7:0], is parallel-loaded into a four-stage, 2-bit-wide shift register 679 (which may be viewed as a pair of single-bit shift registers for even-numbered and odd-numbered bits of the packet, respectively) in response to a load pulse 692 generated once per MCK1 cycle. Thereafter, the two bits at the head of the shift register (i.e., in flop stage R01) are applied to output driver (and thus driven on to link DQ[i]) in respective low and high phases of a given MCK4 cycle, before the next pair of bits is shifted forward for transmission in the subsequent MCK4 cycle. As shown, flip-flop 683 is provided to ensure hold-time for the bit being provided for output during the high phase of the MCK4 cycle and may be omitted if sufficient hold time is otherwise available.

The load pulse 692 may be generated in any number of ways, but in the embodiment shown is generated by flop 685 and AND gate 687. More specifically, AND gate 687 receives the output of flop 685 at an inverting input and MCK1 at a non-inverting input and therefore generates a pulse that extends for the first cycle of MCK4 following each rising edge of the core clock, MCK1. The pulse from AND gate 687 is buffered in flop 689 to ensure sufficient hold time before being re-timed a half MCK4 cycle later in negative-MCK4-edge-triggered flop 691 to yield load pulse 692. The load pulse itself is supplied to multiplexer stages M01, M23 and M45, thereby enabling component registers R01, R23 and R45 of the shift register to be parallel-loaded with constituent bits of the packet to be serialized (i.e., bits 0, 1 into R01; bits 2, 3 into R23; and bits 4, 5 into R45) while bits 6 and 7 of the packet are simultaneously loaded into input-stage register R67.

In alternative embodiments, various implementation details may be changed within the serializer and deserializer circuits of FIGS. 8A and 8B. For example, instead of clocking shift registers with a data-rate clock (a half-bit-rate clock in the examples shown) to achieve 8:1 serialization, a sequence of 2:1 multiplexers and flip-flop stages may be provided to select, in successive stages, alternating 4-bit portions of an 8-bit packet in response to high and low phases of MCK1 (stage 1), alternating 2-bit portions of each 4-bit portion in response to high and low phases of a divided-by-two instance of MCK4 (stage 2), and alternating single bits of each 2-bit portion in response to high and low phases of MCK4 in an output stage. A similar arrangement may be employed to perform 1:8 deserialization, combining individual bits into 2-bit portions of a packet in an input stage, combining bit pairs into 4-bit portions of a packet in a second stage, and then combining 4-bit portions of a packet in a third stage. Drift-compensating serializers and deserializers within the memory controller may similarly be implemented with successive 2:1 multiplexing (or demultiplexing) stages rather than shift registers clocked by a data-rate clock. In that case, bit adjustment may be effected by adding offset values to frequency-divided local clocks.

Figure 9:
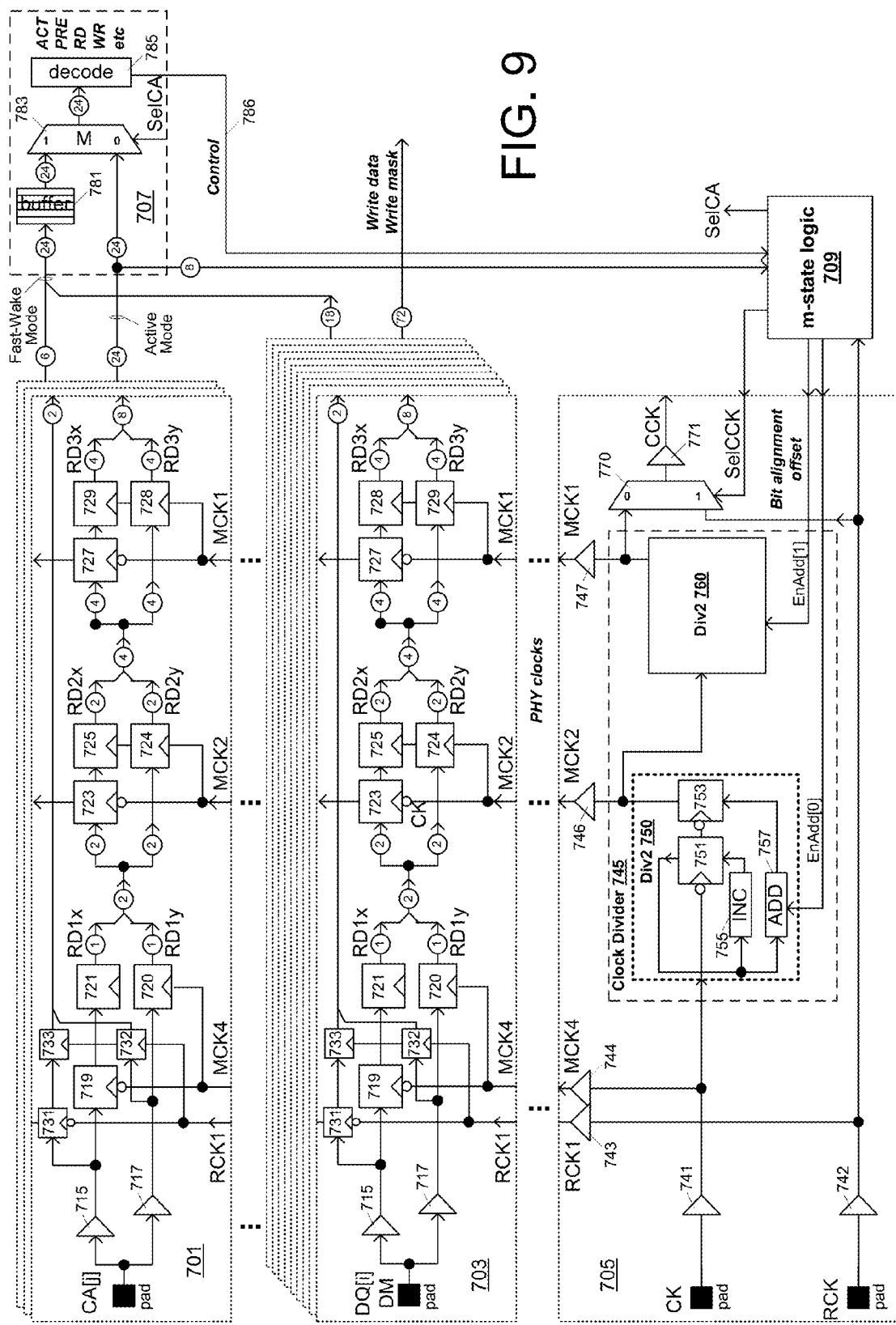
FIG. 9 illustrates alternative embodiments of memory-side deserializers and their interconnection to logic and clocking circuitry within a memory device.

FIG. 9 illustrates alternative embodiments of memory-side deserializers (701, 703) and their interconnection to command logic 707, memory-state logic 709 and clocking circuitry 705. As shown, the three command/address deserializers 701, eight data deserializers 703 and data-mask deserializer (also designated 703) are coupled to receive incoming command, data and mask signals via respective interconnect pads (or other interconnect structures), and clocking circuitry 705 is likewise coupled to receive the forwarded I/O clock (CK) and forwarded reference clock (RCK) via respective interconnect pads. The forwarded I/O clock (i.e., a bit-rate clock signal as described above) is buffered in clock receiver 741 and used to clock divide-by-2 and divide-by-4 circuitry within clock divider 745, thereby generating a half-rate clock (half the frequency of the forwarded clock, CK) and quarter-rate clock (one-fourth the frequency of the forwarded clock, CK). The bit-rate clock, half-rate clock and quarter-rate clock are supplied to respective clock drivers 744, 746 and 747 which output respective bit-rate, half-rate and quarter-rate memory I/O clocks, MCK4, MCK2 and MCK1, to the command/address, data-mask and data deserializers 701 and 703 (and also the memory-side serializers, not shown). Multiplexer 770 is coupled to receive the quarter-rate clock from the clock divider 745 (or alternatively from the output clock driver 747) and the forwarded reference clock signal, RCK (buffered in clock receiver 742), at respective input ports, and to receive core-clock selection signal, Sel-CCK, from memory-state logic 709 and thus selectively output (via core clock driver) either a frequency-divided instance of the forwarded I/O clock or the forwarded reference clock as the memory core clock, CCK. The forwarded reference clock is supplied to memory-state logic 709 as shown and also to clock driver 743 which, in turn, drives internal reference clock signal, RCK1, to the command, mask and data deserializers (701, 703) to enable fast-wake command deserialization.

In one embodiment, the implementation of each command, mask and data deserializer (701, 703) is identical to the others and includes a pair of signal receivers 715, 717 coupled to a respective I/O pad (i.e., CA, data-mask or data pad, as the case may be), together with three active-mode deserializer stages and one fast-wake deserializer stage. The active-mode deserializer stages include a 1:2 stage formed by registers 719, 720, 721 and clocked by bit-rate I/O clock, MCK4; a 2:4 stage formed by registers 723, 724 and 725 and clocked by half-rate I/O clock, MCK2; and a 4:8 stage formed by registers 727, 727 and 729 and clocked by quarter-rate I/O clock, MCK1 (i.e., the active-mode memory core clock). Within 1:2 stage, register 731 samples the conditioned signal output from signal receiver 715 in response to a falling edge of MCK4, while register 720 samples the output of signal receiver 717 in response to the MCK4 rising edge. By this operation, double-data-rate sampling is implemented with each of the two bits transmitted per MCK4 clock cycle (i.e., during active-mode transmission) being latched within a respective one of registers 719 and 720. The bit captured within register 719 in response to a given falling MCK4 edge is transferred to register 721 during the ensuing rising MCK4 edge, so that the two bits delivered serially in the incoming signal (i.e., in respective halves of an MCK4 cycle) are output in parallel from registers 720 and 721 for a full MCK4 cycle. Thus, the 1:2 stage converts a serial pair of bits each present at the input of the 1:2 stage for a respective half-MCK4 cycle (i.e., bit interval=0.5 MCK4 cycle) into a parallel pair of bits each present at the input of the succeeding 2:4 stage for a full MCK4 cycle.

The 2:4 stage operates in essentially the same manner as the 1:2 stage, except at half the rate (i.e., registers 723, 724 and 725 are clocked by the half-rate clock, MCK2) and with twice the number of bits. More specifically, register 723 captures the two-bit output from the 1:2 stage in response to a falling edge of MCK2 (e.g., every odd rising edge of MCK4), while register 724, samples the two-bit output of the 1:2 stage in response to the rising edge of MCK2 (e.g., every even rising edge of MCK4), thus capturing two pairs of bits in respective registers 723 and 724 during each cycle of MCK2 (and each two cycles of MCK4). The bit-pair captured within register 723 in response to a given falling MCK2 edge is transferred to register 725 during the ensuing rising MCK2 edge so that the two bit-pairs delivered serially from the 1:2 stage (i.e., output in respective MCK4 cycles and thus in respective halves of an MCK2 cycle) are output in parallel from registers 724 and 725 for a full MCK2 cycle. Thus, the 2:4 stage converts a serial pair of 2-bit values each present at the input of the 2:4 stage for a respective half-MCK2 cycle (i.e., bit interval=0.5 MCK2 cycle or full MCK4 cycle) into a parallel pair of 2-bit values (i.e., four bits in all), each present at the input of the succeeding 4:8 stage for a full MCK2 cycle (and thus for two MCK4 cycles).

The 4:8 stage operates similarly to the 2:4 stage, but again at half the clock rate (i.e., registers 727, 728 and 729 are clocked by the quarter-rate clock, MCK1) and with twice the number of bits. More specifically, register 727 captures the four-bit output from the 2:4 stage in response to a falling edge of MCK1 (e.g., every odd rising edge of MCK2), while register 728 samples the four-bit output of the 2:4 stage in response to the rising edge of MCK1 (e.g., every even rising edge of MCK2), thus capturing respective 4-bit values in registers 727 and 728 during each cycle of MCK1 (i.e., during two MCK2 cycles and during four MCK4 cycles). The 4-bit value captured within register 727 in response to a given falling MCK1 edge is transferred to register 729 during the ensuing rising MCK1 edge so that the two four-bit values delivered serially from the 2:4 stage (i.e., output in respective MCK2 cycles and thus in respective halves of an MCK1 cycle) are output in parallel from registers 727 and 729 for a full MCK1 cycle. Thus, the 4:8 stage converts a serial pair of 4-bit values each present at the input of the 4:8 stage for a respective half-MCK1 cycle (i.e., bit interval=0.5 MCK1 cycle or full MCK2 cycle) into a parallel pair of 4-bit values (i.e., an eight-bit value in total, and thus a byte-sized packet), each present at the serializer output for a full cycle of the memory core clock.

The fast-wake deserializer stage, formed by registers 731, 732 and 733 operates in generally the same manner as the 1:2 active-mode stage, but at a slower clock rate (thus enabling a correspondingly slower signaling rate). That is, register 731 samples the signal output from signal receiver 715 in response to a falling edge of reference clock, RCK1, while register 732 samples the output of signal receiver 717 in response to the rising RCK1 edge. By this operation, double-data-rate sampling is implemented with each of the two bits transmitted per RCK1 clock cycle (i.e., at the relatively-slow, fast-wake signaling rate) being latched within a respective one of registers 731 and 732. The bit captured within register 731 in response to a given falling RCK1 edge is transferred to register 733 during the ensuing rising RCK1 edge so that the two bits delivered serially in the incoming signal (i.e., in respective halves of an RCK1 cycle) are output in parallel from registers 732 and 733 for a full RCK1 cycle. Thus, the fast-wake deserializer converts a serial pair of bits each present at the input of the fast-wake deserializer for a respective half-RCK1 cycle (i.e., bit interval=0.5 RCK1 cycle) into a parallel bit pair present at deserializer output for a full RCK1 cycle and thus for a full memory core clock cycle during fast-wake command signaling.

Within command logic 707, command-path multiplexer 783 selects between fast-wake and active-mode command paths according to the state of resource-select signal, SelCA, from memory-state logic 709. More specifically, during fast-wake command signaling, memory-state logic 709 (which may operate as described in reference to FIGS. 4-6) asserts SelCA to enable the fast-wake outputs of the twelve deserializers (i.e., three command deserializers 701, one data-mask deserializer 703 and eight data deserializers 703) to deliver a 24-bit fast-wake command to command decoder 785 via command-buffering logic 781. Command-buffering logic 781 stores each command for a predetermined period (which may be programmed within a configuration register) to meet memory device timing constraints, then forwards the fast-wake command to command decoder 785 via command-path multiplexer 783. By contrast, during active-mode command signaling, memory-state logic 709 deasserts SelCA to enable the byte-wide active-mode outputs of the three command deserializers 701 to deliver a 24-bit active-mode command to command decoder 785 via command-path multiplexer 783.

Still referring to FIG. 9, command decoder 785 may output one or more control signals to memory-state logic 709 to coordinate power-state transitions, including the core clock synchronization operation described above. In the embodiment shown, for example, a core-clock adjustment test packet (e.g., test packet used to generate MCK1Adj as discussed above) transmitted via the active-mode command path may be delivered to memory-state logic 709 (e.g., via connection of the byte-wide active-mode output from one of command serializers 701 to memory-state logic 709 as shown), and the command decoder 785 may assert a control signal 786 upon receipt of the test packet (e.g., a non-parse-able command) to signal memory-state logic 709 that the test packet is available at the command-deserializer output.

In the embodiment of FIG. 9, memory-state logic 709 evaluates the core-clock adjustment test packet to determine any bit-wise (i.e., packet framing) misalignment between the controller-side core clock and soon-to-be memory-side core clock MCK1 (e.g., by determining the bit offset between the actual and desired positions of a solitary logic '1' within the test packet framed by MCK1) and then outputs a corresponding bit-adjustment value, EnAdd[1:0], to adjust the phase of divided clocks, MCK1 and MCK2, within clock divider 745. In the embodiment shown, for example, clock divider 745 includes two phase-adjustable divide-by-two divider circuits 750 and 760, each implemented, for example, by a pair of flip-flops 751, 753, incrementer 755 and adder 757, as shown in the detail view of divider circuit 750. Within divider circuit 750, flip-flop 751 and incrementer 755 form a toggle circuit that changes state at every falling edge of the bit-rate I/O clock, thus delivering a half-rate clock to the input of adder 757. Adder 757 adds zero (+0, no change) or one (+1) to the output of flip-flop 751 depending on the state of an enable-add signal (EnAdd[0]) output from memory-state logic 709, and delivers the sum to the data input of flip-flop 753. Flip-flop 753 is also clocked by the falling edge of MCK4, and is consequently updated with the adder output once per MCK4 cycle. By this operation, the output of flip-flop 753 toggles at half the MCK4 clock rate and has a phase that may optionally be advanced by 180 degrees by assertion of the "EnAdd[0]" signal. Accordingly, the half-rate clock output from flip-flop 753 is delivered to clock driver 746 to become half-rate clock signal, MCK2, and may be advanced by 180 degrees (i.e., one MCK4 cycle or two bit intervals) in order to adjust the bit framing interval within the serializers. The half-rate clock output from flip-flop 753 is also supplied to the clock input of divider circuit 760. In one embodiment, divider circuit 760 is implemented in generally the same manner as divider circuit 750 and thus yields a quarter-rate clock that may be advanced by 180 degrees (i.e., two MCK4 cycles or 4 bit intervals) in response to assertion of EnAdd[1] from memory-state logic 709 in order to further adjust the bit framing interval within the serializers. As shown, the quarter-rate clock output from clock divider 760 is supplied to driver 747 to become the quarter-rate I/O clock, MCK1, and also to an alternate input port of multiplexer 770 to be output via clock driver 771 as core clock, CCK, during active-mode operation when Sel-CCK is low.

In an alternative embodiment that employs the unified clocking architecture shown at 180 of FIG. 2 (i.e., frequency-shifting between low and high frequency I/O clocks on the same clock line), flop stages 731-733 may be omitted from each deserializer, and the output of flop stages 720 and 721 instead used to output the two fast-wake command bits contributed by each of the twelve deserializers. Accordingly, clock drivers 742 and 743 may be omitted from clocking circuitry 705, and the output of clock driver 741 may instead be supplied to the logic '1' port of multiplexer 770. Accordingly, during fast-wake operation, the reduced-frequency reference clock may be selected as the core clock, and also supplied to the deserializers to enable reduced-frequency 2:1 deserializing. Clock drivers 746 and 747 may be disabled during fast-wake mode (or at least during transmission of fast-wake command(s)) as the 2:4 and 4:8 deserializing stages need not be driven.

Figure 10:
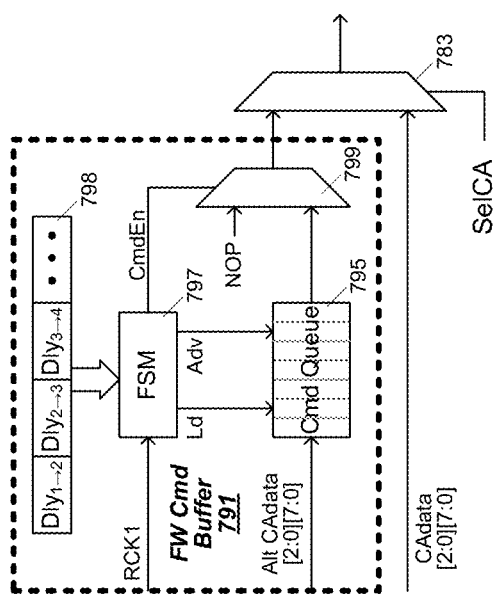
FIG. 10 illustrates an embodiment of a fast-wake command buffer that may be used to implement the memory-side command buffers shown in FIGS. 4 and 9.

FIG. 10 illustrates an embodiment of a fast-wake command buffer 791 that may be used to implement the memory-side command buffers shown in FIGS. 4 and 9 (i.e., elements 405 and 781, respectively). As shown, command buffer 791 includes finite state machine 797, command queue 795, multiplexer 799 and delay-control register 798. State machine 797 is clocked by memory-side reference clock signal RCK1 and enables incoming fast-wake commands to be loaded into and advanced within command queue 795 through assertion of load and advance signals ("Ld" and "Adv"), respectively. State machine 797 also asserts a command-enable signal ("CmdEn") at the conclusion of intervals specified by values programmed within delay-control register 798 to enable multiplexer 799 to pass the command at the head of the command queue to the fast-wake command input of command-path multiplexer 783. In the RCK1 cycle following assertion of the command-enable signal (i.e., after outputting the fast-wake command at the head of command queue 797 to downstream logic), state machine 797 deasserts the command-enable signal to block further output of queued commands (e.g., by selecting a no-operation command value "NOP" to be output via multiplexer 799) and asserts the advance signal to advance a new fast-wake command (including any constituent command, control and/or address bits) to the head of command queue 795. By this operation, the command buffer 791 is poised to output the fast-wake command now at the head of command queue 795 by asserting the command-enable signal following the command-to-command delay (i.e., the "inter-command delay") indicated by delay-control register 798. In an embodiment in which fast-wake commands are received in successive clock cycles (e.g., as shown in FIG. 6), state machine 797 may assert the load signal in response to successive RCK1 rising (or falling) edges to load the commands into the command queue. More specifically, state machine 797 may be signaled when fast-wake mode is entered (e.g., by a signal from memory-state logic, not specifically shown and/or by transitions of the RCK1 signal itself) and assert load signal assertion beginning and/or ending a predetermined or programmed number of RCK1 cycles after entering fast-wake mode.

In one embodiment, fast-wake command buffer 791 is designed to accommodate a predetermined number and type of memory access commands following entry into fast-wake mode, loading the commands in response to predetermined RCK1 edges and applying pre-programmed or hardwired delays (e.g., measured in numbers of RCK1 cycles) between successive assertions of the command-enable signal to emulate the command delays enforced by scheduling logic within the memory controller during active-mode operation. More specifically, state machine 797 may assume the command sequence shown in FIG. 6, and thus back-to-back receipt of seven memory access commands, including row activation command 'A' and a pair of corresponding column read commands (A'A'), row activation command 'B' and corresponding column read commands (B'B'), and finally row activation command 'C'. Because the actual number of RCK1 cycles of delay to be imposed between successive commands may vary depending upon, for example, the exact command sequence (more or fewer column read operations could follow each row activation) and the timing relationship between the reference clock period and inherent operational delays within the memory device (i.e., more or fewer reference clock cycles may transpire during a required delay interval depending upon the reference clock frequency), the reference clock cycles that are to transpire between application of successive commands may be programmed within delay-control register 798 during system initialization (or, if the content of register 798 is non-volatile, during system or device production), thereby enabling a flexible fast-wake command sequence and tolerance for various clock frequencies and topologies. To establish the desired timing for command sequence of FIG. 6 (A, A', A', B, B', B', C), for example, six command delays may be programmed within delay-control register 798, each indicating the number of RCK1 cycles to transpire between output of successive commands. In the particular example shown, for instance, delay value $Dly_{1\to2}$ specifies the number of RCK1 cycles to transpire between the first-received and second-received fast-wake commands and thus the delay imposed between assertion of the command-enable signal for row activation command, A (which is stored at the head of the queue and output without delay to the downstream logic), and the command-enable signal for the ensuing column read command, A', and each of the following delay values control respective delays imposed before re-asserting the command-enable signal to enable output of a subsequent command (i.e., $Dly_{2\to3}$ specifies the number of RCK1 cycles to transpire between output of the first and second column read commands (A'); $Dly_{3\to4}$ specifies the number of RCK1 cycles to transpire between output of the second column read command (A') and row activation command, B, and so forth). Each programmed delay value (e.g., a value that indicates the number of RCK1 cycles to transpire between successive assertions of the command-enable signal) may be determined based on the RCK1 period and timing parameters specified for the subject memory device (e.g., $t_{RCD}$, $t_{CAC}$, $t_{RR}$, $t_{CC}$, etc. as discussed above). Thus, assuming that $t_{RCD}$ rounds up to seven RCK1 cycles, then a value of seven may be programmed for $Dly_{1\to2}$ to enforce the $t_{RCD}$ delay between memory-core execution of row activation command, A, and the first column read command, A' regardless of when those commands are actually received (i.e., assuming the back-to-back fast-wake command transmission shown in FIG. 6, the first column read command, A' second-received fast-wake command may not be received until after the first of the seven RCK1 clock cycles has transpired so that the second fast-wake command, A', actually sits at the head of the command queue for only six RCK1 cycles before being output to the memory core). Similarly, assuming that the timing constraint $t_{CC}$ to be imposed between memory-side execution of successive column read commands spans two RCK1 cycles, delay-control value $Dly_{2\to3}$ may be programmed with a value of two to enforce the $t_{CC}$ delay between the first and second column read commands A'. Each successive delay may likewise be programmed based on a deterministic delay to be imposed between successive commands, thus effecting delivery of each fast-wake command to the memory core at a desired time.

It should be noted that numerous alternative structures may be used to implement the command buffering function carried out by command buffer 791. For example, multiplexer 799 may be omitted and NOP commands instead inserted between command within command queue 795 (thus presenting NOP to the command buffer output until the interposed NOP command is evicted from the queue). Further, instead of pre-storing delay values within register 798, delay values that indicate the delay to be imposed by the command buffering logic between successive commands may be encoded within bit-fields of individual fast-wake commands (e.g., within otherwise unused bits a 24-bit command packet), with the "delay" bit-field being supplied to the finite state-machine to control propagation of the command (i.e., with appropriate delay) through the command buffer.

Figure 11:
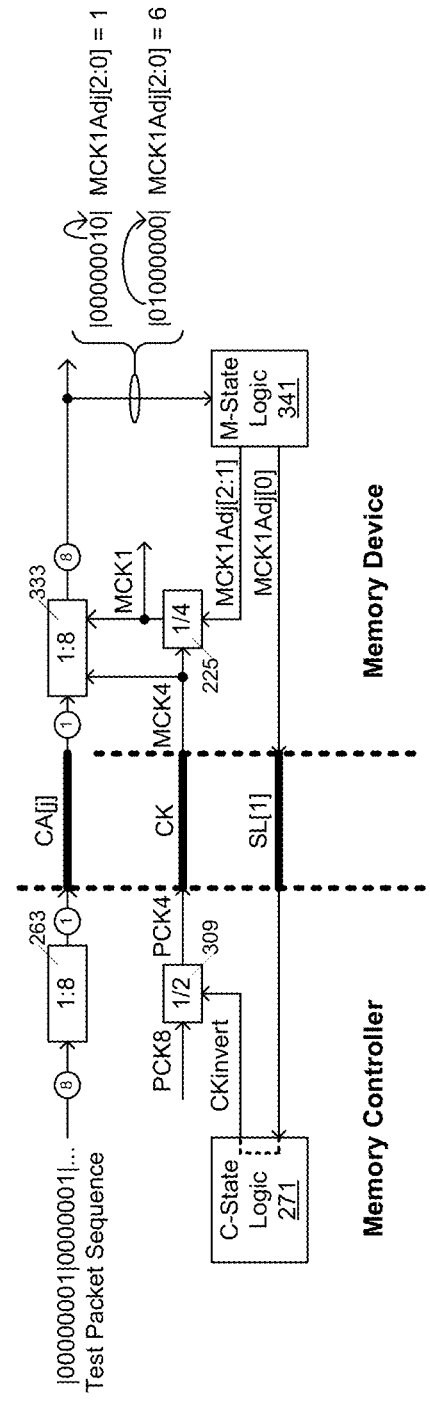
FIG. 11 is a flow diagram illustrating an exemplary determination of the core clock adjustment value, MCK1Adj, within a system corresponding to FIG. 4.

FIG. 11 is a flow diagram illustrating an exemplary determination of the core clock adjustment value, MCK1Adj, within a system corresponding to FIG. 4. As shown, a test packet or sequence of test packets including a solitary '1' in a predetermined position within each packet is transmitted from the memory controller to the memory device via at least one of the controller-side command serializers 263 and command links, CA[j], and deserialized within the counterpart memory-side command deserializer (or deserializers) 333. The deserialized test packet (or packets) is provided to the memory-state logic which includes circuitry to determine a bit offset (or misalignment) between the actual and expected positions of the '1' bit, and to generate a MCK1Adj value representative of the bit based on the bit offset. In one embodiment, the upper two adjustment bits, MCK1Adj[2:1], are supplied to divide-by-four clock divider 225 (i.e., which generates a quarter rate clock, MCK1, and possibly a half-rate clock, MCK2, as in clock divider 745 of FIG. 9) and thus used to effect a bit-wise shift of 0, 2, 4 or 6 bit positions (i.e., advancing the MCK1 phase by zero, one, two, or three cycles of MCK4). The least significant adjustment bit, MCK1Adj[0] is supplied, via sideband link, SL[1], to the controller-state logic 271 (e.g., as return signal SQ1 via the sideband logic circuits 391, 325 and driver/receiver pair 397, 331). In one embodiment, controller-state logic 271 asserts or deasserts clock-invert signal, CKinvert, to clock divider 309 according to the state of the incoming MCK1Adj[0] signal (or value thereof represented by SQ0). By this operation, the forwarded I/O clock, PCK4, may be selectively inverted within clock divider 309 to effect a single-bit (half-PCK4 cycle and therefore half-MCK4 cycle) adjustment that enables selection between bit-wise shift 0, 2, 4, 6 and 1, 3, 5, 7, as necessary to correct the bit offset indicated by the deserialized test packet.

In an alternative embodiment, PCK4 inversion (and thus MCK4 inversion) is obviated by ensuring that the forwarded I/O clock (CK) is paused for an integer number of reference clock cycles, thus guaranteeing bit-alignment between the forwarded I/O clock (when re-started) and CA/DQ/DM signals. However, if the forwarded I/O clock is paused for a non-integer number of reference clock cycles or if there is the possibility of a glitch when forwarded I/O clock is re-started, the output of the command-address deserializer (e.g., element 333 of FIG. 4) may be sampled (e.g., after transmission of a test pattern) during the wakeup interval to enable calculation of the bit alignment offset value and thus establish MCK2 and MCK1 at the correct phases. Yet other phase adjustment circuits may be employed in alternative embodiments.

Figure 12:
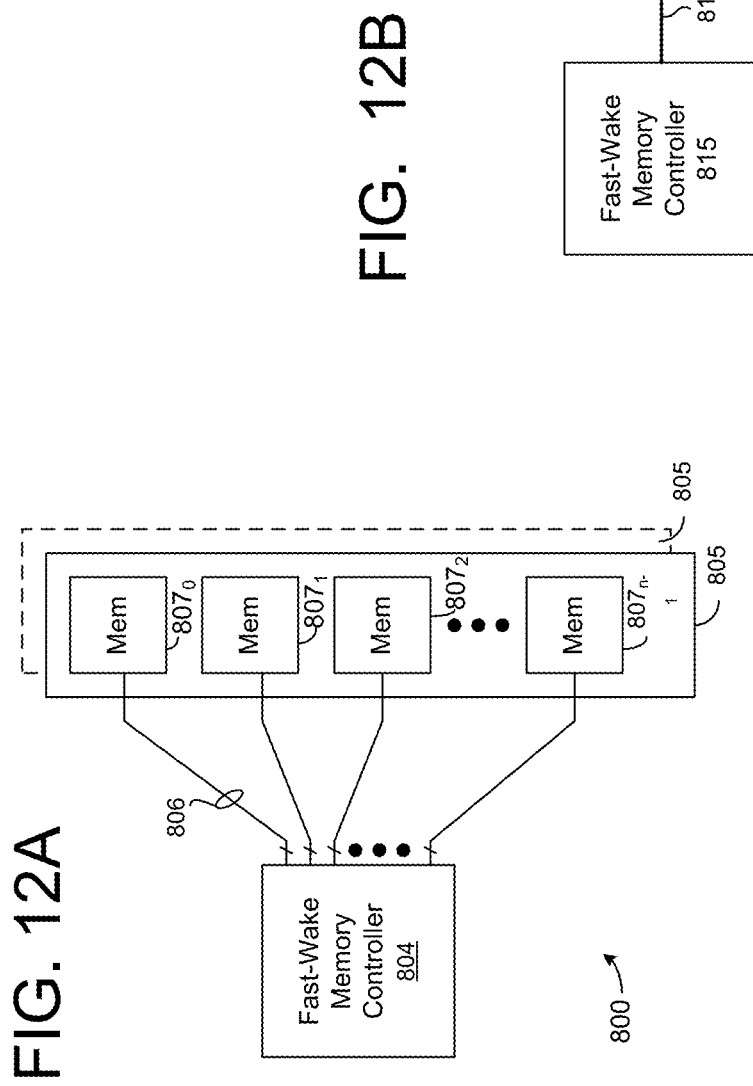
FIG. 12A illustrates an embodiment of a fast-wake memory system having a single controller IC and multiple memory ICs.
FIG. 12B illustrates an embodiment of a fast-wake memory system having a module-mounted buffer IC that implements an interface corresponding to the memory-side I/O interface shown in FIG. 4.

FIG. 12A illustrates an embodiment of a fast-wake memory system 800 having a single controller IC 804 and multiple memory ICs $807_0$-$807_{n-1}$. In the embodiment shown, the memory devices (collectively, 807) are disposed on a memory module 805 (generally, a circuit board having an edge connector for removable connection to a backplane or motherboard, and thus permitting memory capacity expansion as additional memory modules are inserted) and individually include an I/O interface and clock distribution arrangement as shown in FIG. 4. Within a given memory module, one or more sets or "ranks" of memory devices may be configured for simultaneous access, for example, by being coupled to respective, dedicated data lanes (i.e., sets of one or more data links) but enabled to respond simultaneously to a given memory access command (e.g., coupled in common to the same set of command links, including for example, a chip-select link). In one embodiment, all the memory devices on a given memory module are identically implemented and may include circuitry to support the fast-wake operation described above. Accordingly, the memory module itself may be characterized as having or lacking fast-wake support (i.e., being a fast-wake memory module or not) according to whether the memory devices disposed thereon support fast-wake mode. Moreover, the overall memory system may be composed of mixed module types, including one or more fast-wake memory modules and one ore more memory modules that lack fast-wake capability. A non-volatile storage device, such as a flash memory device provides "serial presence detect" memory (SPD) function and may be included on the memory module to store information, retrievable by the memory controller, indicative of parameters, capabilities and characteristics of the memory module and constituent memory devices including whether the memory devices include circuitry to support fast-wake operation as well as inherent timing constraints of the memory devices that may be used to determine delay intervals to be imposed by memory-side command buffering logic during fast-wake operation.

Still referring to FIG. 12A, each of the signaling-link groups shown (806) may include a point-to-point connection between the memory controller 804 and a respective one of the memory devices 807 and may include dedicated I/O clock link, CA and data links (and data-mask, if needed). Alternatively, some or all the signaling links may be distributed to all the memory devices of the memory module (e.g., shared clock link coupled to all memory devices in parallel, and/or command link(s) coupled to all the memory devices in parallel, but a dedicated data link or set of data links per memory device within a given module or rank of devices on the module). Additionally, each signaling link may be coupled to multiple memory devices (e.g., data links being coupled to a slice of memory devices across a number of memory modules, as in data links [0 to N−1] being coupled to a first memory IC on each of multiple memory modules 753, data links [N+1 to 2N] being couple to a second memory IC on each of the memory modules, etc.) thus establishing shared data and/or command paths between respective ICs of the memory modules. In the latter configuration, different timing calibration values may be applied within the controller-side serializers and deserializers depending on the memory module (or rank of memory devices if a given module includes more than one rank of memory devices) selected for a given memory access transaction. In that case, packet, bit and phase adjust values may be switched dynamically, depending on the group of memory devices targeted for a given memory access transaction, with separate set of alignment registers maintained for each group.

FIG. 12B illustrates another fast-wake memory system embodiment, in this case having a module-mounted buffer IC 820 that implements an interface 822 corresponding to the memory-side I/O interface shown in FIG. 4. That is, the I/O interfaces of fast-wake memory controller 815 and buffer IC 820 include circuitry to disable one or more peak-rate signaling resources in a reduced power mode, and, upon waking from the reduced power mode, to apply alternative signaling resources to convey one or more memory access commands from memory controller 815 to buffer IC 820 (and thus to memory ICs coupled to buffer IC 820) concurrently with actions taken to restore the peak-rate signaling resource(s). Thus, a fast-wake signaling interface may be established between memory controller 815 and buffer IC 820, with more conventional interfaces 824 implemented between the buffer IC and memory devices $826_0$-$826_{N-1}$, $827_0$-$827_{N-1}$ disposed alongside the buffer IC 820 on the memory module 819. In one embodiment, for example, command/address values communicated from the memory controller to the buffer IC include not only bank, row and column addresses, but also addresses of individual memory devices (or groups of memory devices 826, 827) to which the buffer IC 820 is to forward the command. Buffer IC 820 may additionally include a data input/output buffer to queue incoming write data for eventual distribution to an address-selected memory device (or memory device group), and read data to be forwarded to memory controller 815. As an example, in one embodiment, the buffer IC-to-memory device interfaces 824 are relatively slow signaling interfaces that do not require on-memory PLL/DLL to maintain link integrity, or may be implemented using strobe-based data and/or command signaling.

Figure 13:
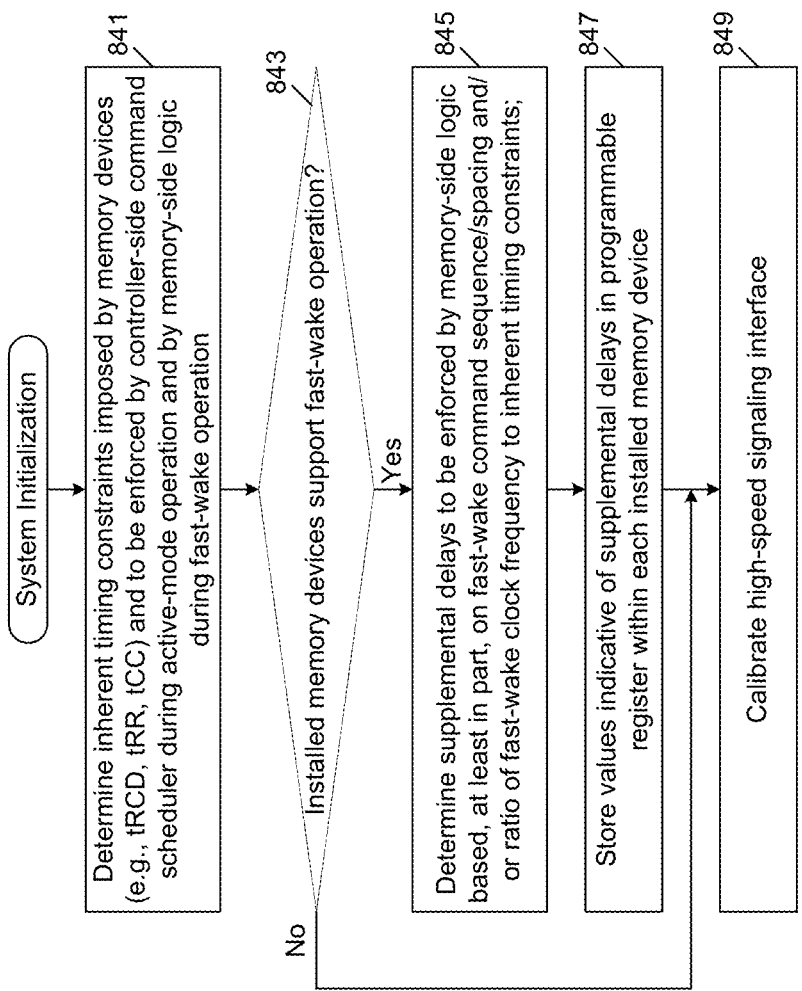
FIG. 13 illustrates an exemplary sequence of operations that may be carried out to initialize fast-wake operating mode within a set of installed memory devices, such as a rank of memory devices on a memory module.

FIG. 13 illustrates an exemplary sequence of operations that may be carried out to initialize fast-wake operating mode within a set of installed memory devices, such as a rank of memory devices on a memory module. At 841, the memory controller determines timing constraints imposed by the installed memory devices (e.g., $t_{RCD}$, $t_{RR}$, $t_{CC}$, etc.) that are to be enforced by controller-side command scheduling logic during active-mode operation and by memory-side command buffering logic during fast-wake operation. In one embodiment, for example, the memory controller determines the timing constraints by accessing information within a module-characterizing non-volatile memory (e.g., an SPD or the like provided on the memory module to store non-volatile information indicative of memory-module timing constraints, capacity, and any other optional function and/or variable characteristic of the memory module or the memory devices disposed thereon). At 843, the memory controller determines whether the installed memory devices support fast-wake operation (e.g., by evaluation of information obtained from the module-characterizing non-volatile memory). If not, then initialization proceeds to an initial calibration operation (849) in which phase, bit and/or packet alignment calibrations are carried out to enable operation of the high-speed signaling interface.

If the installed memory devices support fast-wake operation (i.e., affirmative determination at 843), the memory controller determines supplemental delays to be enforced by memory-side command buffering logic (845) based, at least in part, on a desired fast-wake command sequence, spacing between fast-wake commands and fast-wake clock frequency (the fast-wake clock frequency defining the number of fast-wake clock cycles that are to transpire in order to enforce a memory-device timing constraint, including $t_{RCD}$, $t_{RR}$, $t_{CC}$, etc.). Within the embodiment of FIG. 4, for example, the memory controller may assume the command sequence, command spacing and reference clock period shown in FIG. 6. That is, seven memory access commands are (e.g., two memory read sequences, each including a row activation command followed by two column read commands, and concluded by a final row activation command) transmitted back-to-back in successive reference clock cycles, information that yields deterministic numbers of reference clock cycles that are to transpire between delivery of fast-wake commands to the command decoder within a given memory device. After determining the supplemental delays (e.g., in terms of numbers of reference clock cycles to transpire), the memory controller stores (or programs) corresponding delay values within one or more programmable registers within each installed memory device at 847. To the extent that high-speed signaling is not yet available, such programming operations may be directed via sideband signaling.

After programming the supplemental delays at 847, the memory controller proceeds with signaling calibration operation at 849, and possibly other configuration operations. Further, after initializing a given set of installed memory devices, the memory controller may repeat the initialization operations starting at for another set of installed memory devices (e.g., another rank of memory devices on the same or different memory module).

Note that the operations shown in FIG. 13 may be carried out in a different order than those shown (including concurrently where feasible), that information known in advance or hardwired into the memory system need not be determined (i.e., such determination operations may be omitted), and that the operations may be carried out by a processor or other entity instead of the memory controller (e.g., obtaining module-characterizing information and/or communicating programming information to the memory devices via the memory controller).

FIG. 14 illustrates an exemplary physical layout of structures within a memory controller 855 and memory device 852 that include I/O interfaces and circuitry to support the fast-wake operation described above. In the embodiment shown, the memory controller 855 is integrated onto the die of a host processor or ASIC 850 and is disposed at a periphery of the die to form a high-level interface to the attached memory device 852. The memory device, shown in this example to be a DRAM, includes eight storage banks 0-7 (each implemented by respective 'a' and 'b' sub-banks), and a physical interface (PHY), and core logic 857 to manage operations within the memory device in relation to incoming commands. More or fewer storage banks (and/or sub-banks) may be included within the memory device in alternative embodiments, and various storage cell technologies other than DRAM may be used.

In the embodiment shown, the physical interface of does not consume the entire signaling-edge of the memory device (i.e., the edge of the DRAM die adjacent the external signal links), thus enabling core logic 857 to be disposed alongside the signaling edge. Consequently, all or essentially all DRAM core logic (including for example and without limitation, command decode logic, access logic to manage row activation, column read/write, precharge and refresh operations, memory-state logic, and fast-wake command buffering logic) may be disposed, in effect, in a surplus die area not otherwise allocated or easily allocable to storage bank implementation. Note that, while shown as being split and disposed at opposite sides of the physical interface, the DRAM core logic 857 may alternatively be co-located on one side of the physical interface. In that case, the specific layout of data (DQ), command/address (CA0, CA1, CA2), data-mask (DM), sideband (SL) and clock links shown (the presence and specific numbers of which may be altered in other implementations) may be rearranged in accordance with the repositioned DRAM core logic. Similarly, though the memory controller core is depicted as being positioned at the side of physical interface opposite the signaling edge, the memory controller core may alternatively be disposed adjacent the signaling edge on both sides or either side of the physical signaling interface, with concomitant change in signal-link layout.

Figure 15:
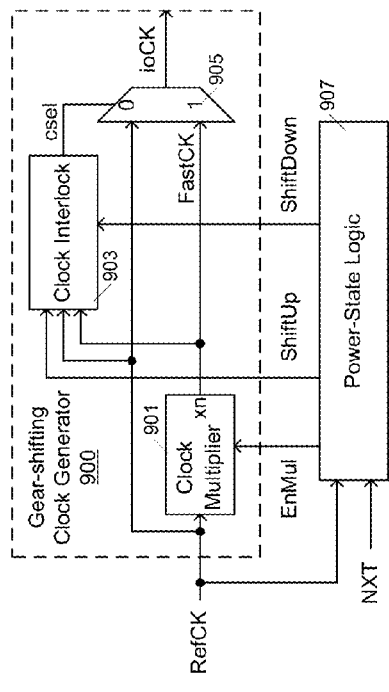
FIG. 15 illustrates an embodiment of a gear-shifting clock generator that may be used to implement a unified clocking architecture as generally described in reference to FIG. 2.

FIG. 15 illustrates an embodiment of a gear-shifting clock generator 900 that may be used to implement a unified clocking architecture as generally described in reference to clocking arrangement 180 of FIG. 2. As discussed above, such an architecture may be used to reduce the resources required for fast-wake operation (e.g., enabling omission of extra clocking paths and alternative serialization/deserialization paths), though the gear-shifting clock generator may more generally be applied in any system or device that may benefit from the ability to glitchlessly and/or gaplessly transition a clock output between two (or more) different clock frequencies. Accordingly, while specifically discussed in the context of a memory system capable of delivering memory access command to a memory device at reduced signaling rate while peak-rate signaling resources are being restored, the gear-shifting clock generator may be applied in various other system applications. For example, the gear-shifting clock generator may be used to shift an I/O clock frequency to match non-uniform peak-rate signaling capabilities of different memory ICs within the same memory system (e.g., two installed memory modules, each having a different maximum signaling frequency), or more generally in any system that may benefit from ability to rapidly and seamlessly shift between different clocking frequencies at different times.

Although FIG. 15 illustrates a clock generator capable of gapless gear-shifting between a reference clock frequency (F) and a multiple of the reference clock frequency (n*F), the technique and circuitry shown may be readily extended to enable gapless gear-shifting between arbitrary clock frequencies (e.g., n*F and m*F) that could be provided from two or more clock sources. Further, while gear-shifting between two clock frequencies is shown, the technique and circuitry shown may be extended to permit gapless gear-shifting between any number of different frequencies of relevance to the communications link, with such frequencies and corresponding data rates enabling the system to operate at various different power consumption rates (e.g., power consumption rates in proportion to the enabled data rate).

As shown, gear-shifting clock generator 900 is coupled to receive a number of control signals from power-state logic 907 (itself transitioning between power modes in response to a NXT signal from the memory controller core as described, for example, in reference to logic element 271 of FIG. 4) and includes a clock multiplier 901 (e.g., a phase-locked loop (PLL), injection-locked oscillator (ILO) or any other frequency-multiplying circuit), clock interlock logic 903 and clock selector 905. When power-state logic 907 asserts an enable-multiply signal (EnMul), clock multiplier 901 is enabled to frequency-multiply an incoming reference clock, RefCK, by a factor of 'n' and thereby generate a high-speed (or peak-rate) clock signal, FastCK. Clock interlock logic receives the reference clock and high-speed clock as well as a pair of gear-shift signals, ShiftUp and ShiftDown, from power-state logic 907 and responds to those inputs by asserting or deasserting a clock-select signal ("csel"). As shown, the clock-select signal is supplied to clock selector 905 (e.g., a multiplexer) to select either the slower-speed reference clock signal or the high-speed clock signal to be output as I/O clock signal, ioCK. In one embodiment, described in greater detail below, clock interlock logic 903 responds to the gear-shift signals by raising and lowering the clock-select signal at specific times with respect to edges of the reference clock and high-speed clock to glitchlessly and gaplessly transition an I/O clock signal, ioCK, between the reference clock and high-speed clock frequencies. That is, clock interlock logic 903 transitions the clock-select signal between high and low states (thus transitioning the I/O clock between reference clock and high-speed clock frequencies) in a manner that avoids time intervals between successive rising/falling or falling/rising clock edges shorter than corresponding time intervals of the high-speed clock signal (i.e., no runt pulses or "glitches" appear in the I/O clock waveform), and that avoids time intervals between successive rising/falling or falling/rising clock edges longer than corresponding time intervals of the reference clock signal (i.e., no "gaps" appear in the I/O clock waveform) and data bits can be sent continuously.

Still referring to FIG. 15, the power-state logic asserts the ShiftUp signal to initiate a I/O clock transition from the reference clock frequency to the high-speed clock frequency, and conversely asserts the ShiftDown signal to initiate an I/O clock transition from the high-speed clock frequency to the reference clock frequency. In an alternative embodiment, a single control signal having a high or low state may be used to select the raised or lowered I/O clock frequency.

Figure 16:
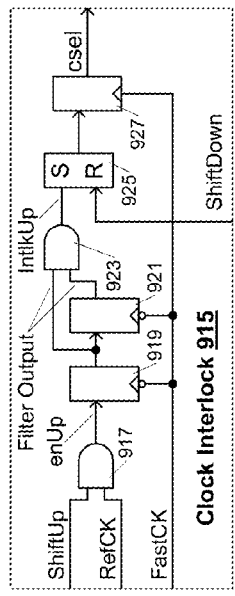
FIGS. 16 and 17 illustrate an embodiment of and exemplary timing diagram for a clock interlock circuit that may be used to implement clock interlock logic of FIG. 15.
Figure 17:
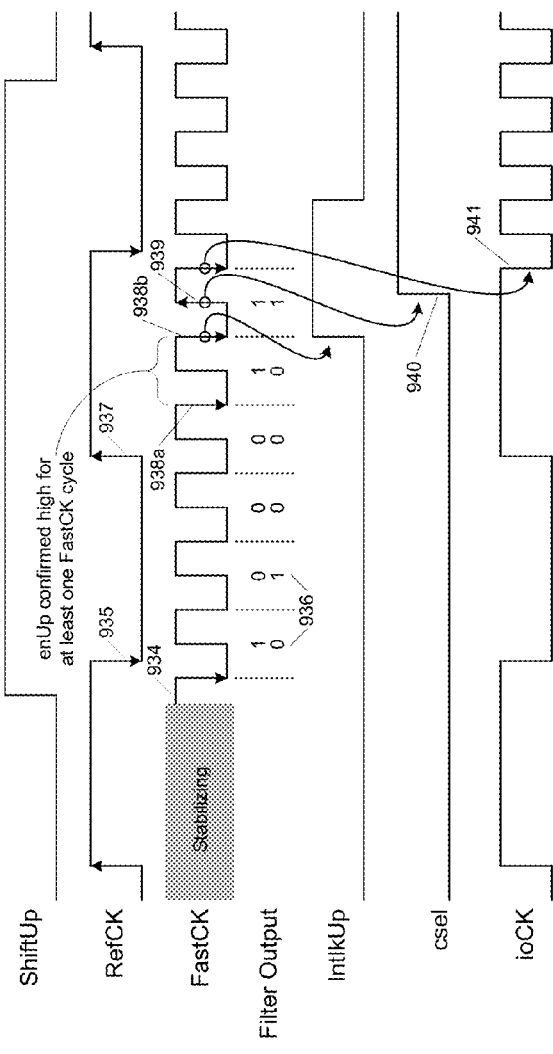

FIGS. 16 and 17 illustrate an embodiment of and exemplary timing diagram for a clock interlock circuit 915 that may be used to implement clock interlock logic 903 of FIG. 15. In the exemplary implementation shown, clock interlock circuit 915 includes a pair of logic AND gates 917 and 923, edge-triggered registers (or flip-flops) 919, 921 and 927, and SR (set/reset) flip-flop 925. A ShiftUp signal (e.g., from the power-state logic as shown in FIG. 907) and reference clock signal are supplied to AND gate 917 which responsively raises an enable-up signal (enUp) whenever the ShiftUp signal and reference clock are both high. In one embodiment, the ShiftUp signal is raised to indicate that the high-speed clock, FastCK, has (or is expected to have) stabilized at its final frequency and phase and thus that the I/O clock may be gear-shifted from the reference clock frequency to the high-speed clock frequency. To avoid any runt pulse generation (i.e., clock pulse width shorter than the high-speed clock pulse width) that may result from lowering the clock-select signal (csel) just after a reference clock transition, the clock interlock circuit waits for both the reference clock signal and the ShiftUp signal to remain high for at least one whole bit clock cycle before raising an interlock-up signal (IntikUp). More specifically, the enable-up signal is supplied to successively-coupled flip-flops 919, 921 (i.e., output of flop 919 is coupled to input of flop 921), each triggered by a falling edge of the high-speed clock signal, so that the reference clock signal and shift-up signal must concurrently remain high (i.e., as signaled by enUP) for at least a whole high-speed clock cycle (i.e., high from at least one falling edge to the next) in order for both inputs to logic AND gate 923 to go high, and thus in order for AND gate 923 to assert the interlock-up signal. Accordingly, as shown in FIG. 17, even if the high-speed clock stabilizes at 934 (and the shift-up signal is raised) just prior to a falling edge of the reference clock (935), the failure of the reference clock to remain high for an entire high-speed clock cycle, prevents the outputs of both flip-flops 919 and 921 from being high simultaneously (i.e., effecting a digital filter as shown by the "filter output" at 936), so that no gear shift occurs until the next high-phase of the reference clock.

Still referring to FIGS. 16 and 17, at rising reference clock edge 937, AND gate 917 asserts the enable-up signal again and continues to assert the enable-up signal through successive falling edges (938a, 938b) of the high-speed clock. Consequently, AND gate 923, detecting the high outputs of both flip-flops 919-921 (i.e., indicating that both the reference clock and shift-up signal have remain high during the interval between successive falling edges of the high-speed clock and thus for at least one complete high-speed clock cycle), raises the interlock-up signal, "IntikUp." The high-going interlock-up signal is supplied to the "set" input of SR flip-flop 925, thus raising the input at "clock-select" flip-flop 927 shortly after the high-speed clock falling edge 938b that yields assertion of IntikUp. Consequently, at the next rising edge of the high-speed clock signal 939 (i.e., the high-speed clock edge used to synchronize the clock-select signal output to the high-speed clock), clock-select flip-flop 927 raises the clock-select output. This operation is shown in diagram 17 at 940, and results in switching the clock selection within a multiplexer or other clock selector (e.g., clock selector 905 of FIG. 15), thus effectively transitioning the I/O clock frequency from the reference clock frequency to the high-speed clock frequency as shown at 941. In one embodiment the shift-up signal is asserted by power-state logic 907 at a rising edge of the reference clock signal so that a falling-edge of the reference clock does not land between the FastCK falling and rising edges that, respectively, set the SR flip flop 925 and latch the clock-select output in flip-flop 927. Because the clock interlock circuit 915 raises the clock-select signal immediately after the high-speed clock signal goes high, and during an interval in which the reference clock signal is high and has been high for at least one bit clock cycle and not more than two bit clock cycles, the clock interlock circuit assures, by design, that the I/O clock frequency is transitioned from the reference clock frequency to the high-speed clock frequency without glitch or gap in the clock pulse stream.

In one embodiment, power-state logic 907 of FIG. 15 asserts the shift-down signal synchronously with respect to a rising edge of the reference clock signal (i.e., shortly after the reference clock rising edge). In the exemplary implementation of FIG. 16, the shift-down signal ("ShiftDown") resets the output of SR flip-flop 925 so that at the next rising edge of the high-speed clock signal (i.e., within approximately one high-speed clock cycle of the shift-down signal, at most), the high-going edge of the high-speed clock signal will capture the low (reset) output of SR flip flop 925 within clock-select register flip-flop 927, thus lowering the clock-select signal and transitioning the clock selection from the high-speed clock signal to the reference clock signal. Because the transition from the high-speed clock signal to the reference clock signal occurs at a rising edge of the high-speed clock signal and within one high-speed clock cycle of a low-to-high transition of the reference clock signal, the clock switching operation (i.e., with clock selector 905 of FIG. 15) is assured by design to occur while both clocks are high, and at a time when the reference clock signal will remain high for at least as long as the high-speed clock signal (i.e., assuming that the reference clock signal period is at least three times the high-speed clock period). Accordingly, glitchless, gapless transition of the I/O clock from the high-speed clock frequency to the reference clock frequency is effected.

One particular challenge that arises when employing the gear-shifting clock generator of FIG. 15 within a high-speed signaling system relates to receiver-side data sampling. More specifically, if edges of the gear-shifted clock are used to trigger data transmission, then the ideal sampling instant for the data eyes (data valid intervals) framed by successive clock edges occur at quadrature offsets, midway between the clock edges. Accordingly, while a quadrature clock signal (i.e., shifted by 90° relative to the I/O clock) may be generated, a number of I/O clock cycles may be required to establish the frequency-dependent timing offset between the quadrature clock and I/O clock each time the I/O clock frequency changes, particularly if closed-loop delay-control circuits are employed (e.g., delay-locked loop or phase-locked loop). Consequently, while a gear-shifting clock generator (e.g., as shown in FIG. 15) may be provided to instantly shift the I/O clock frequency up or down, a timing penalty of several clock cycles may be incurred waiting for the quadrature clock (or other timing signal having a frequency-dependent delay relative to the gear-shifted clock) to stabilize, thus presenting a substantial impediment to on-demand clock gear shifting (i.e., frequency transition) in a high-speed signaling system.

In one embodiment, the requirement for a quadrature clock or any other timing signal having a frequency-dependent delay relative to the gear-shifted I/O clock is avoided altogether through use of a wide-range integrating receiver. More specifically, instead of sampling an information-bearing signal at the midpoint between transmit-clock edges, the wide-range integrating receiver integrates or otherwise accumulates the input signal level into a value having one of at least two distinguishable states during the interval between clock edges, with the value thus integrated or accumulated (the "integrated value") being sampled at the close of the interval (and thus in response to an available clock edge or signal having a frequency-independent delay therefrom) to produce a received data value. By this operation, the frequency of the I/O clock used to control signal transmission and reception may be shifted on the fly, without incurring the timing penalty (and potential loss of data transmission and timing coordination) that may be required to stabilize a quadrature timing signal or other timing signal having a frequency-dependent delay relative to the gear-shifted clock.

Figure 18:
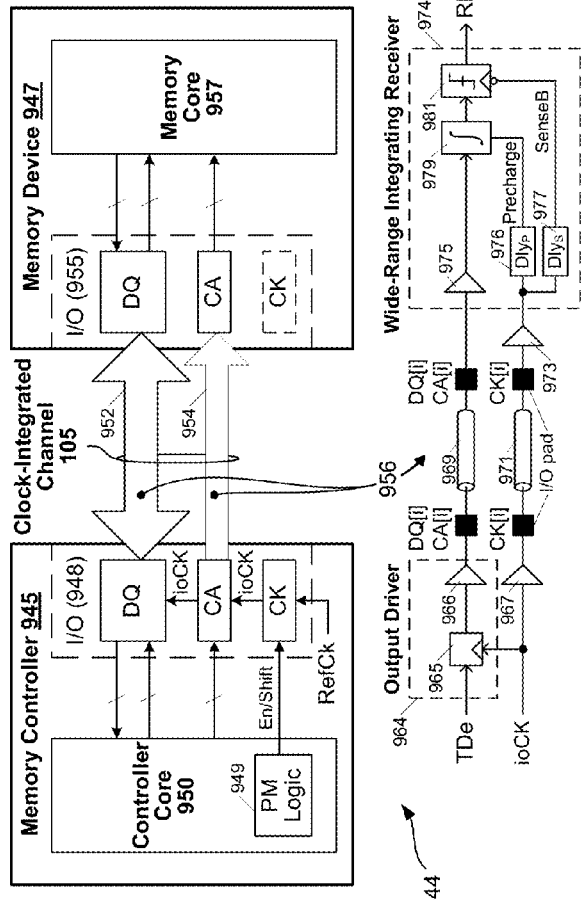
FIG. 18 illustrates an embodiment of a memory system that employs a gear-shifting clock generator in accordance with FIGS. 15-17 together with wide-range integrating receivers.

FIG. 18 illustrates an embodiment of a memory system 944 that employs a gear-shifting clock generator in accordance with FIGS. 15-17 together with wide-range integrating receivers. In the embodiment shown, a memory controller 945 and memory device 947 are implemented in respective IC dice (i.e., IC "chips") and coupled to one another via variable-rate data and command signaling channels, 952 and 954, respectively. As shown in detail view 956, each of the variable-rate signaling channels includes one or more signaling links 969 coupled between an edge-triggered output driver 964 and a wide-range integrating receiver 974 and clocked by a gear-shifting I/O clock (ioCK) conveyed on clock link 971. In one embodiment, one or more instances of the gear-shifting I/O clock are generated by clock generation circuitry (CK) within controller-side I/O circuitry 948 in response to a reference clock "RefCK," and transitioned between disabled, low-frequency and high-frequency states in accordance with one or more enable/shift signals ("En/Shift") from power-mode logic (e.g., in accordance with the power-mode established by the power-mode logic or power-state logic 949 within controller core 950. In particular, the power-mode logic 949 may transition the memory system (including counterpart power-mode logic within memory core 957, not specifically shown) between the powerdown, fast-wake and active operating modes discussed above, and correspondingly transition the I/O clock between disabled (i.e., non-oscillating), low-frequency and high-frequency states. In a particular embodiment, for example, a relatively small number of signaling links 969 are used to implement the gear-shifting data and command channels, with a respective complementary gear-shifting I/O clock link 971 being provided per signaling link 969 and routed alongside the signaling link to establish an extremely low-skew timing relationship between the forwarded I/O clock signal and the information-bearing signal (i.e., command/address information or data, as the case may be). Detail view 956 illustrates such a timing arrangement with respect to one of two complementary clock signals. That is, an I/O clock signal ("ioCK") for timing the transmission and reception of even phase data (TDe/RDe) is shown, and a counterpart complementary clock signal and related transmit/receive circuitry for timing transmission/reception of odd phase data is omitted. More specifically, the counterpart complementary clock signal may be used, for example, to trigger data transmission during an alternate phase of the I/O clock signal (i.e., within a counterpart instance of output driver 964 coupled to the same signaling link 969) and forwarded from the memory controller to the memory device via another clock link 971 (or via the counterpart leg of a single differential clock link) to enable capture of a data signal integrated during the alternate I/O clock phase within a counterpart instance of integrating receiver 974 coupled to the same data link 969. In other embodiments, a single clock link 971 may be used to convey a timing signal that controls synchronous signal transmission on multiple data and/or command signaling links as described in embodiments above. Moreover, while not specifically shown, the various controller-side and memory-side serializer/deserializer circuits and core logic (including the memory storage array) may be provided within the controller-side I/O circuitry 948 and memory-side I/O circuitry 955 (i.e., within the "DQ" and "CA" circuit blocks shown) as generally described above.

Figure 19:
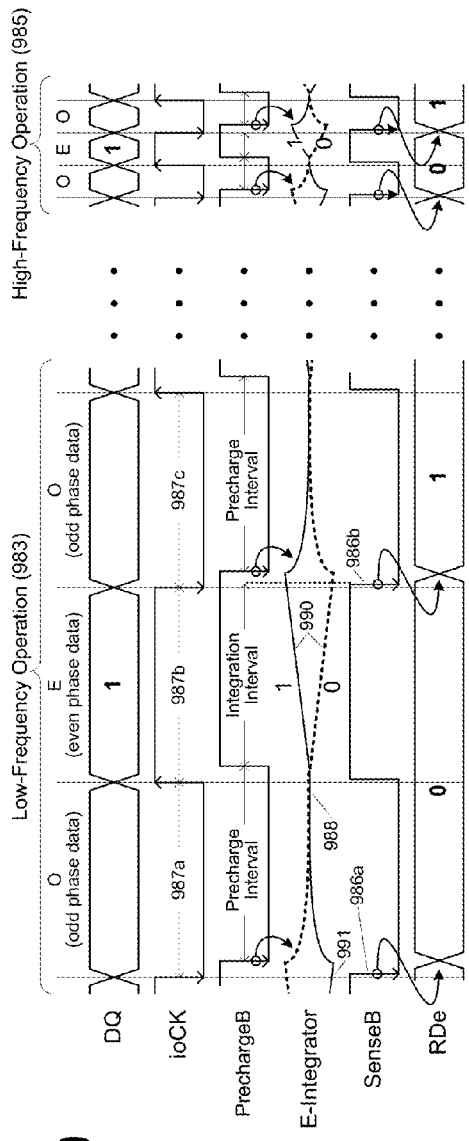
FIG. 19 is an exemplary timing diagram illustrating operation of the wide-range integrating receiver presented in FIG. 18.

FIG. 19 is a timing diagram that illustrates operation of an embodiment of a wide-range integrating receiver 974 (i.e., presented in detail view 956 of FIG. 18) as the I/O clock signal, ioCK, is gear-shifted from a relatively-low reference clock frequency to a substantially higher, peak frequency (or bit-rate frequency). Referring to FIGS. 18 and 19, during both low frequency operation (shown in interval 983) and peak frequency operation (shown in interval 985) of system 944, information is transmitted on a given signaling link 969 in response to both rising and falling edges of the I/O clock signal (ioCK) and thus at double data rate (i.e., two bits or symbols are conveyed sequentially in a given I/O clock cycle). More specifically, output driver 964 (depicted conceptually in FIG. 18 by storage element 965 and signal driver 966) outputs a sequence of even-phase transmit-data bits (TDe) on signaling link 969 in response to respective rising edges of the I/O clock signal, and wide-range integrating receiver 974 similarly recovers the sequence of transmitted data bits in response to respective edges of the I/O clock signal as even-phase receive-data bits (RDe). Clock driver 967 and receiver 973 similarly enable transmission (forwarding) of the I/O clock via clock link 971. Though not shown, a counterpart output driver 964 and wide-range integrating receiver 974 may be provided, or additional circuitry may be provided within the output driver 964 and wide-range integrating receiver 974 shown, to transmit and receive odd-phase data in response to edges of a complementary (inverted) instance of the I/O clock signal. In one embodiment, for example, output driver 964 may include an "odd-phase" instance of storage element 965 to store odd-phase data (i.e., in response to falling edges of the I/O clock signal, or rising edges of a complementary instance of the I/O clock signal) and a multiplexer to alternately pass odd-phase and even-phase data from respective storage elements 965 to signal driver 966 in separate halves of an I/O clock cycle (i.e., the I/O clock signal being supplied to the multiplexer control input). Within wide-range integrating receiver 974, an integrator 979 integrates the state of the incoming signal (amplified or otherwise conditioned by signal receiver 975) during an integration interval established by assertion and deassertion of a precharge signal, supplying the integrated output to a decision circuit 981 or "slicer." Slicer 981 resolves the state of the integrated output as a logic '1' or logic '0' received data bit in response to activation of a sense signal. In a single-ended signaling embodiment, for example, the slicer includes a comparator to compare the integrator output with a threshold (e.g., a predetermined, calibrated or adaptively generated threshold corresponding to an amplitude midway between the integrator outputs for logic '0' and logic '1' signals), and thus output a logic '1' or logic '0' according to whether the integrated signal is above or below the threshold. In a differential embodiment, the slicer may include circuitry to output a logic '1' or logic '0' according to which side of the differential signal integrates to a level higher than the other within integrator 979. Also, the double-data-rate (DDR) driver and receiver depicted in FIG. 19 may be modified to enable transmission/reception of more or fewer bits (or symbols) per cycle of the I/O clock signal and thus achieve single-data-rate (SDR) signaling, quad-data-rate (QDR) signaling, etc.

The integrating receiver may also include a pair of delay elements, $Dly_P$ (976) and $Dly_S$ (977), which output, as delayed instances of the I/O clock signal, the precharge signal and sense signal, respectively, in order to enable integration "windowing." In the embodiment shown, the precharge signal is supplied to an enable input of integrator 979 to alternate the integrator between integration and precharge states in respective halves of an I/O clock cycle. More specifically, while the active-low PrechargeB signal (i.e., delayed instance of the I/O clock) is low, integrator 979 is precharged to an equalized level with essentially zero (negligible) differential voltage and is thus poised (or armed) to integrate toward a final high or low integration output when the PrechargeB signal is released (i.e., raised in this example). The SenseB signal (i.e., another delayed instance of the I/O clock) is supplied to an inverting edge-triggered input of slicer 981, to trigger resolution of the received data bit as a logic '1' or logic '0' value (i.e., to trigger a "sense" operation within the slicer). In general, delay elements 976 and 977 delay incoming I/O clock signal by non-equal delay intervals to ensure that the PrechargeB signal transitions a controllable time after the SenseB signal. Under this timing arrangement, precharging of integrator 979 does not begin until after the sense operation has been triggered within slicer 981, thus ensuring that an integrated output is sensed by slicer 981 before the output is invalidated by the precharging operation. Further delay of the precharge signal can allow for narrowing of the integration 'window' between precharge release and activation of sense to less than one unit interval in order to best resolve incoming bits which have residual inter-symbol-interference (ISI) or clock or data jitter or uncertainty. Accordingly, the absolute value of the delays effected by delay elements 976 and 977 may be less important than the differential delay achieved. Further, the sense delay element 977 may be omitted (i.e., such that sense occurs on the falling clock edge that marks the end of the transmission interval for the bit being received), and/or both delay elements may be omitted if intrinsic delays within integrator 979 and/or slicer 981 are sufficient to ensure that sensing is effected at the close of an integration interval and prior to precharge and no windowing is desired. Further, to the extent that different delays may be applicable within different host systems and/or across different operating conditions, either or both of the delay elements may be programmably controlled, for example, by loading one or more delay values within a programmable register within the host IC device and thereby supply delay control signals to delay element 976 and/or 977 in programmably-selected states to effect desired propagation delays.

The waveforms depicted in FIG. 19 relate specifically to reception of even-phase data within wide-range integrating receiver 974, with counterpart odd-phase data reception being essentially identical, but shifted in phase by half an I/O clock cycle. As shown, the precharge and sense signals are delayed instances of the I/O clock signal, with the triggering edge (falling edge in this example) of the sense signal (986a, 986b) occurring shortly after the corresponding I/O clock edge and before the falling edge of the PrechargeB signal. Accordingly, a sense operation is completed to resolve a logic '0' received even data bit (i.e., the integration level of which is shown at 991) within "even-phase" slicer 981 during transmission of the odd-phase data bit in transmission interval 987a.

As shown, the falling edge of the PrechargeB signal marks the start of a precharge interval and causes the output of integrator 979 to be equalized/precharged to a differential zero 988 (i.e., nominally midway between the integration levels for logic '1' and logic '0' data). By this operation, the integrator output is poised to integrate the even phase bit arriving during clock phase 987b (shown as a logic '1' in this example) when the precharge signal is released (i.e., goes high) at the start of an integration interval. As shown at 990, the integrator output rises or falls linearly or near-linearly (i.e., charging or discharging the capacitive element) during the integration interval according to the state of the conveyed bit, with the logic '0' instance being shown in dashed outline. During the integration interval, the even-phase slicer is made ready (i.e., armed) to resolve the integrator output at the next falling edge of the sense signal, 986b. Accordingly, no information capture occurs within the even-phase slicer during the predominant portion of the even-phase integration interval, and instead, information capture occurs within the odd-phase slicer (not specifically shown) at that time. Just prior to the close of the even-phase integration interval, the sense signal falls to trigger the even-phase bit capture shown at 986b, and shortly thereafter, the precharge signal falls to trigger the precharge in preparation for the next even phase integration interval. Thus, the integration interval is effectively defined by the timing offset between the rising edge of PrechargeB and the falling edge of SenseB. As explained, the relative timing offset between the edges of the precharge and sense signals is established by the different propagation delays through delay elements 976 and 977.

Still referring to FIG. 19, peak-frequency operation of the integrating receiver (shown at 985) is substantially identical to the low-frequency operation, with the integration and precharge intervals reduced in accordance with the clock period reduction. In one embodiment, the shortened integration interval during peak-frequency operation yields a lower-magnitude integration output (i.e., less charge or discharge of a capacitive element within integrator 979 than in low-frequency operation) that nonetheless remains sufficient for reliable information recovery within slicer 981. Alternatively, the design of the wide-range integrating receiver 974 may account for the different operating frequencies by making an appropriate adjustment in integration current, thus scaling the signal integration rate accordingly.

Reflecting on the operation of the integrating receiver described in reference to FIGS. 18 and 19, it can be seen that all data reception operations are carried out with respect to signal edges that are either aligned with the edge of the incoming data signal or offset therefrom by a delay that is independent of the I/O clock frequency. Consequently, in contrast to mid-data-eye sampling approaches that may require generation of a quadrature timing signal aligned to the midpoint of each incoming data eye and thus having a frequency dependent timing offset from each I/O clock edge, no bit-time-dependent timing offsets need be generated. Accordingly, the I/O clock frequency may be shifted on the fly (i.e., at a given instant and/or upon demand) without incurring the timing penalty otherwise required to switch or stabilize a quadrature timing signal (or other timing signal having a frequency-dependent delay relative to the I/O clock), and thus without disrupting information transmission or reception within the host signaling system.

Still referring to FIGS. 18 and 19, during active-mode operation of memory system 944, the I/O clock is gear-shifted from low to high frequency (and all other high-speed command and data signaling resources are fully functional) to enable high-speed transmission of memory access commands from the memory controller to the memory device via command path 954 and high-speed transmission of read/write data between the devices (i.e., transmission of read data from the memory device to the memory controller and transmission of write data from the memory controller to the memory device) via data path 952. By contrast, during idle intervals, when no host requests are pending, power-mode logic 949 transitions the memory system to a reduced power mode in which one or more of the high-speed signaling resources (e.g., I/O clock) are switched off, in effect, disabling high-speed command/data transmission via command path 954. When a host memory-access request is eventually received (marking the end of an idle interval), power-mode-logic 949 begins an orderly transition (i.e., exit or ascension) from the reduced-power mode to active mode, including communicating the power-state transition to memory device 947 (e.g., via a sideband channel not shown). During this "wake-up" interval, generation of the high-speed clock is re-enabled within the clock generator (e.g., the enable-multiply signal is asserted to enable generation of a bit-rate clock as described in reference to FIG. 15), but generally takes substantial time to reach a stable operating frequency and/or the precise phase alignment needed for high-speed command signaling, potentially delaying command transfer. In the embodiment of FIG. 18, this incremental wake-up delay (or latency) is substantially reduced by selecting the lower-frequency, but readily available reference clock to be output from a gear-shifting clock generator as the I/O clock, thereby enabling transfer of one or more memory access commands from memory controller 945 to memory device 947 during the wake-up interval and thus before high-speed command signaling is available. Further, to compensate for the relatively low signaling rate afforded by the reference clock frequency, one or more signaling links dedicated to data, data-strobe and/or data-mask transmission during active-mode operation (i.e., signaling links that form data path 952) are temporarily reallocated to conveyance of command/address information, thereby establishing a temporarily widened fast-wake command path during the wake-up interval. In one embodiment, for example, the frequency ratio between the fast and slow clocks output by the gear-shifting clock generator matches the ratio of the fast-wake and active-mode command path widths so that the fast-wake and active-mode command bandwidths are the same.

Figure 20B:
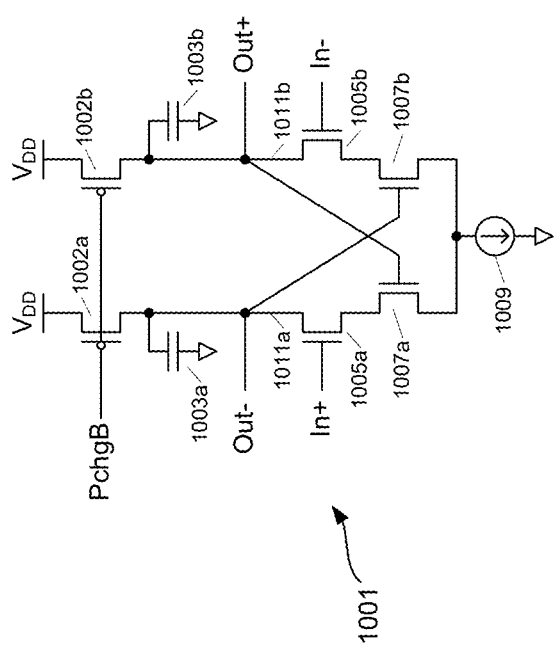
FIGS. 20A and 20B illustrate alternative embodiments of integrator circuits that may be used to implement the integrator shown within the wide-range integrating receiver of FIG. 18.
Figure 20A:
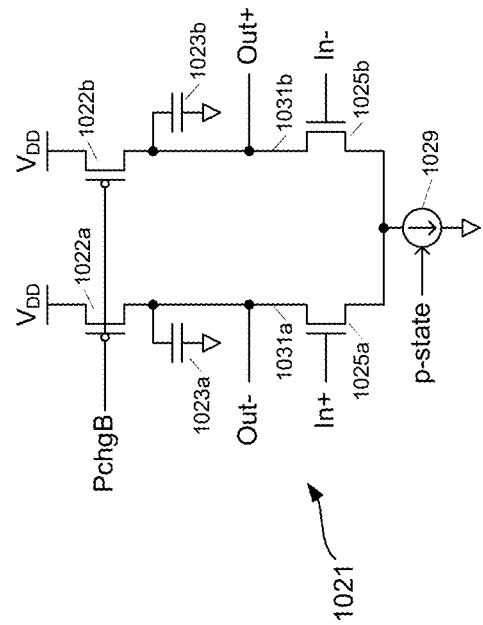

FIGS. 20A and 20B illustrate alternative embodiments of integrator circuits that may be used to implement integrator 979 within wide-range integrating receiver 974 of FIG. 18. In both embodiments, the integrator circuits are designed to accommodate a variable integration interval (i.e., a flexible integration time period), and thus are referred to herein as "wide-range" integrators. Referring first to wide-range integrator 1001 of FIG. 20A, when an active-low precharge signal ("PchgB") is deasserted, transistors 1002a and 1002b (implemented by PMOS transistors in the example shown) are switched off, thereby enabling the charge on capacitive elements 1003a and 1003b to drain (e.g., via current source 1009 or through capacitive-element leakage or both). When the precharge signal is thus deasserted (i.e., PchgB raised), triggering an integration event and marking the start of the integration interval, charge is unevenly accumulated on the capacitive elements in accordance with the differential signal level applied at integrator inputs, In+ and In−. That is, assuming that the In+ level exceeds the In− level, transistor 1005a will conduct more heavily than counterpart transistor 1005b so that capacitive element 1003a will be discharged more rapidly than capacitive element 1003b and thus the voltage at integrator output node 1011a (Out−) will drop more rapidly than the voltage on the voltage at integrator output node 1011b (Out+). In the circuit of 20A, cross-coupled feedback devices 1007a and 1007b ensure that one side of the integrator's current steering will be shut off completely when the other side's output falls below a threshold, Vtn. This allows for a flexible timing interval as the integrator output will be able to be held for a substantial amount of time, thus enabling the integrator to be used for much longer bit-times. In the exemplary integrator 1021 of FIG. 20B, precharge transistors 1022a/1022b, capacitive elements 1023a/1023b and input transistors 1025a/1025b are provided and controlled as in the embodiment of FIG. 20A, but devices 1007a/1007b are omitted in favor of a state-switched current source 1029. More specifically, a power-state signal ("p-state") is provided to the state-switched current source to switch (or scale) the bias current between current values 'i' and 'i/n' according to the signaling frequency. By this operation, the integrator 1021 generates substantially the same output integration voltages at nodes 1031a/1031b upon transitioning between high-frequency and low-frequency operation (i.e., selecting bias current 'i/n' for low-frequency operation and bias current 'i' for high-frequency operation). Steered current sources or other current-switching circuits may be may be employed to achieve this result.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a memory controller, the method comprising:
    transitioning to a low-power mode in which an active-mode resource required to transmit memory access commands to a memory device at a first command-signaling frequency of the memory controller is disabled; and
    transmitting a first memory access command to the memory device using an alternative signaling resource during a transitional interval in which the active-mode resource is re-enabled.

2. The method of claim 1 wherein the active-mode resource comprises a first clock signal to time transmission of memory access commands at the first command-signaling frequency and wherein the alternative signaling resource comprises a second clock signal to time transmission of the first memory access command during the transitional interval, the second clock signal having a lower frequency than the first clock signal.

3. The method of claim 2 wherein transitioning to a low-power mode comprises disabling oscillation of the first clock signal, the method further comprising re-enabling oscillation of the first clock signal during the transitional interval.

4. The method of claim 3 further comprising receiving data from the memory device a predetermined time interval after transmission of the first memory access command, and wherein re-enabling oscillation of the first clock signal comprises re-enabling oscillation of the first clock signal after transmission of the first memory access command and during the predetermined time interval.

5. The method of claim 2 wherein the second clock signal has a larger signal-swing than the first clock signal.

6. The method of claim 1 wherein transmitting a memory access command to the memory device using an alternative signaling resource comprises transmitting the first memory access command to the memory device at a signaling frequency lower than the first command-signaling frequency.

7. The method of claim 1 wherein transmitting a first memory access command to the memory device using an alternative signaling resource comprises transmitting the first memory access command to the memory device via a signaling link used, during an active operating mode of the memory controller, to transmit write data from the memory controller to the memory device.

8. The method of claim 1 wherein transmitting a first memory access command to the memory device comprises:
    transmitting address information that specifies a storage location within the memory device; and
    transmitting command information that specifies a memory access operation to be carried out with respect to the storage location.

9. The method of claim 1 wherein transmitting a first memory access command to the memory device using an alternative signaling resource comprises:
    transmitting the first memory access command to the memory device in response to transitions of a first clock signal having a lower frequency than a second clock signal used to transmit memory access commands at the first command-signaling frequency; and
    transmitting the first memory access command to the memory device via a temporary command-signaling path that includes more signaling links than an active-mode command-signaling path used to transmit memory access commands at the first command-signaling frequency.

10. The method of claim 9 wherein the ratio of the frequencies of the first and second clock signals matches the ratio of the numbers of signaling links included within the active-mode command-signaling path and the temporary command-signaling path such that the command-signaling bandwidth available to transmit the memory access command matches the command-signaling bandwidth available after the active-mode resource is re-enabled.

11. The method of claim 9 wherein transmitting the first memory access command to the memory device via the temporary command-signaling path comprises switchably coupling an internal command path of the memory controller to signaling links used, during an active operating mode of the memory controller, to convey write data from the memory controller to the memory device.

12. The method of claim 1 wherein transmitting a first memory access command to the memory device using an alternative signaling resource comprises transmitting a sequence of memory access commands to the memory device using the alternative signaling resource, at least one of the memory access commands within the sequence including information that indicates a delay to be imposed by the memory device between execution of first and second memory access commands within the sequence.

13. A memory controller comprising:
    first command signaling circuitry to transmit memory access commands to a memory device at a first command-signaling frequency of the memory controller;
    power-state logic to transition the memory controller to a first power mode in which at least part of the first command signaling circuitry is disabled; and
    second command signaling circuitry to transmit at least one memory access command to the memory device during a transitional interval in which the at least part of the first command signaling circuitry is re-enabled.

14. The memory controller of claim 13 wherein the first command signaling circuitry comprises first clock circuitry to output a first clock signal to time transmission of the memory access commands at the first command-signaling frequency, and wherein the second command signaling circuitry comprises second clock circuitry to output a second clock signal to time transmission of the at least one memory access command during the transitional interval, the second clock signal having a lower frequency than the first clock signal.

15. The memory controller of claim 14 wherein the power-state circuitry includes control circuitry to selectively assert an enable signal to the first clock circuitry, and wherein the control circuitry deasserts the enable signal to the first clock circuitry to disable oscillation of the first clock signal in the first power mode.

16. The memory controller of claim 13 wherein the first command signaling circuitry includes a first number of signal transmitting circuits to output information-bearing signals on respective external signaling links, and wherein the second command signaling circuitry includes a second number of signal transmitting circuits to output information-bearing signals on respective external signaling links, the second number of signal transmitting circuits being greater than the first number of signal transmitting circuits.

17. The memory controller of claim 13 further comprising:
a plurality of signal drivers to drive external signal links; and
switching circuitry to switchably couple either the first command signaling circuitry or the second command signaling circuitry to the plurality of drivers.

18. The memory controller of claim 17 further comprising data signaling circuitry switchably coupled to a first subset of the plurality of signal drivers to enable data signals to be transmitted on a corresponding first subset of the external signal links.

19. The memory controller of claim 18 wherein the switching circuitry to switchably couple either the first command signaling circuitry or the second command signaling circuitry to the plurality of drivers comprises multiplexing circuitry to either (i) couple the first command signaling circuitry to a second subset of the plurality of signal drivers and couple the data signaling circuitry to the first subset of the plurality of signal drivers, or (ii) couple the second command signaling circuitry to the first and second subsets of the plurality of signal drivers.

20. A non-transitory computer readable medium that stores data representative of an integrated-circuit memory controller comprising:
first command signaling circuitry to transmit memory access commands to a memory device at a first command-signaling frequency of the memory controller;
power-state logic to transition the memory controller to a first power mode in which at least part of the first command signaling circuitry is disabled; and
second command signaling circuitry to transmit at least one memory access command to the memory device during a transitional interval in which the at least part of the first command signaling circuitry is re-enabled.

* * * * *